(12) United States Patent
Mitsuhashi et al.

(10) Patent No.: US 12,354,976 B2
(45) Date of Patent: *Jul. 8, 2025

(54) SEMICONDUCTOR DEVICE AND ELECTRONIC DEVICE

(71) Applicant: SONY SEMICONDUCTOR SOLUTIONS CORPORATION, Kanagawa (JP)

(72) Inventors: Ikue Mitsuhashi, Kanagawa (JP); Toshiaki Iwafuchi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/368,882

(22) Filed: Sep. 15, 2023

(65) Prior Publication Data

US 2024/0006349 A1     Jan. 4, 2024

Related U.S. Application Data

(63) Continuation of application No. 17/297,247, filed as application No. PCT/JP2019/047234 on Dec. 3, 2019, now Pat. No. 11,869,853.

(30) Foreign Application Priority Data

Dec. 4, 2018    (JP) ................................. 2018-227498

(51) Int. Cl.
    *H01L 31/00*       (2006.01)
    *H01L 23/00*       (2006.01)
               (Continued)

(52) U.S. Cl.
    CPC .......... *H01L 23/585* (2013.01); *H01L 23/562* (2013.01); *H01L 24/05* (2013.01);
               (Continued)

(58) Field of Classification Search
    CPC ..... H01L 23/585; H01L 23/562; H01L 24/05; H01L 24/06; H01L 24/08;
               (Continued)

(56) References Cited

U.S. PATENT DOCUMENTS

| | | |
|---|---|---|
| 11,869,853 B2 * | 1/2024 | Mitsuhashi ............. H01L 24/06 |
| 2007/0013072 A1 | 1/2007 | Ellis-Monaghan et al. |

(Continued)

FOREIGN PATENT DOCUMENTS

| | | |
|---|---|---|
| CN | 101419948 A | 4/2009 |
| CN | 102110696 A | 6/2011 |

(Continued)

OTHER PUBLICATIONS

International Search Report and Written Opinion for International (PCT) Patent Application No. PCT/JP2019/047234, dated Mar. 10, 2020, 9 pages.

(Continued)

*Primary Examiner* — Niki H Nguyen
(74) *Attorney, Agent, or Firm* — Sheridan Ross PC

(57) ABSTRACT

A semiconductor device includes a first semiconductor substrate, a second semiconductor substrate, and at least one guard structure including a first guard element, a second guard element, and a third guard element. The first semiconductor substrate and the second semiconductor substrate are bonded to one another at a bonding interface between a surface of the first semiconductor substrate and a surface of the second semiconductor substrate. The first guard element is in the first semiconductor substrate and spaced apart from the third guard element by a portion of the first semiconductor substrate. The second guard element is in the second semiconductor substrate and spaced apart from the third guard element by a portion of the second semiconductor substrate, and the third guard element includes portions in (Continued)

the first surface and the second surface to bond the first semiconductor substrate to the second semiconductor substrate.

20 Claims, 65 Drawing Sheets

(51) Int. Cl.
  *H01L 23/58* (2006.01)
  *H10F 39/00* (2025.01)
(52) U.S. Cl.
  CPC .............. *H01L 24/06* (2013.01); *H01L 24/08* (2013.01); *H10F 39/809* (2025.01); *H01L 2224/05647* (2013.01); *H01L 2224/06051* (2013.01); *H01L 2224/0616* (2013.01); *H01L 2224/06517* (2013.01); *H01L 2224/08145* (2013.01)
(58) Field of Classification Search
  CPC ..... H01L 27/14634; H01L 2224/05647; H01L 2224/06051; H01L 2224/06517; H01L 2224/08145; H01L 25/0655; H01L 27/14636; H01L 2224/0603; H01L 2225/06541; H01L 23/3135; H01L 25/0657; H01L 25/50; H01L 27/1469; H01L 21/565; H01L 2224/05552; H01L 2224/09517; H01L 2224/45015; H01L 2224/45124; H01L 2224/45147; H01L 2224/48105; H01L 2224/48137; H01L 2224/48227; H01L 2224/484; H01L 2224/49111; H01L 2224/80895; H01L 2224/8592; H01L 23/049; H01L 23/24; H01L 23/3178; H01L 23/564; H01L 24/48; H01L 24/49; H01L 24/85; H01L 27/0629; H01L 29/1608; H01L 29/66143; H01L 29/66333; H01L 29/7395; H01L 29/872; H01L 2924/00014; H01L 2924/0002; H01L 2924/13055; H01L 2924/13091; H01L 21/76898
  See application file for complete search history.

(56) References Cited

U.S. PATENT DOCUMENTS

| | | | |
|---|---|---|---|
| 2008/0265422 | A1 | 10/2008 | Ellis-Monaghan et al. |
| 2009/0096061 | A1 | 4/2009 | Uchida |
| 2011/0068435 | A1 | 3/2011 | Hudson |
| 2013/0105667 | A1 | 5/2013 | Kobayashi |
| 2015/0035103 | A1 | 2/2015 | Inoue |
| 2017/0256504 | A1 | 9/2017 | Minami et al. |
| 2018/0138223 | A1 | 5/2018 | Kotoo et al. |
| 2018/0233523 | A1 | 8/2018 | Kobayashi |
| 2019/0273108 | A1* | 9/2019 | Sato ................... H01L 24/27 |
| 2019/0296073 | A1 | 9/2019 | Kotoo et al. |
| 2019/0363079 | A1* | 11/2019 | Thei .................. H01L 23/481 |
| 2022/0028804 | A1 | 1/2022 | Mitsuhashi et al. |

FOREIGN PATENT DOCUMENTS

| | | |
|---|---|---|
| CN | 102651377 A | 8/2012 |
| CN | 104282704 A | 1/2015 |
| CN | 107026151 A | 8/2017 |
| CN | 107615481 A | 1/2018 |
| CN | 110534507 A | 12/2019 |
| JP | 2006332344 A | 12/2006 |
| JP | 2009021528 A | 1/2009 |
| JP | 2009-094359 | 4/2009 |
| JP | 2010161367 A | 7/2010 |
| JP | 2011-114261 | 6/2011 |
| JP | 2012033894 A | 2/2012 |
| JP | 2012-256736 | 12/2012 |
| JP | 2015-029047 | 2/2015 |
| JP | 2017-157719 | 9/2017 |
| JP | 2020-092146 | 6/2020 |
| WO | WO 2016/185883 | 11/2016 |

OTHER PUBLICATIONS

Official Action for U.S. Appl. No. 17/297,247, dated Mar. 8, 2023, 12 pages.
Notice of Allowance for U.S. Appl. No. 17/297,247, dated Jun. 15, 2023, 12 pages.

* cited by examiner

SEMICONDUCTOR DEVICE AND ELECTRONIC DEVICE

CROSS REFERENCE TO RELATED APPLICATIONS

This application is a continuation of U.S. patent application Ser. No. 17/297,247, filed May 26, 2021, which is a national stage application under 35 U.S.C. 371 and claims the benefit of PCT Application No. PCT/JP2019/047234, having an international filing date of 3 Dec. 2019, which designated the United States, which PCT application claimed the benefit of Japanese Patent Application No. 2018-227498, filed 4 Dec. 2018, the entire disclosures of each of which are incorporated herein by reference.

TECHNICAL FIELD

The present technology relates to a semiconductor device and an electronic device, and in particular, relates to a technology for joining two semiconductor substrates together.

BACKGROUND ART

A copper (Cu)-copper (Cu) junction for directly and electrically connecting copper (Cu) electrodes provided on a front surface of a semiconductor substrate, is known as one method of joining semiconductor substrates together. The copper (Cu)-copper (Cu) junction, for example, is expected as a junction method effective in space saving of a semiconductor device, compared to a method of electrically connecting electrodes by using an Si through electrode (through silicon via: TSV) penetrating through a plurality of semiconductor substrates.

As described in PTL 1, in the copper (Cu)-copper (Cu) junction, flatness at the time of chemical mechanical polishing (CMP) is ensured, and a junction strength is improved by increasing an area in which a metal junction is performed according to a junction between copper (Cu) and copper (Cu) (hereinafter, also simply referred to as a Cu—Cu junction) by providing a copper (Cu) dummy separately from a connection pad (refer to PTL 1).

In addition, a technology of improving a junction strength by forming a guard ring including a linear metal layer on a junction surface of a semiconductor substrate, is also proposed as a method of improving a connection strength (refer to PTL 2).

CITATION LIST

Patent Literature

[PTL 1]
    JP 2012-256736 A
[PTL 2]
    WO 2016/185883 A1

SUMMARY

Technical Problem

In a case where the guard ring is formed on a Cu—Cu junction surface, and the guard ring is consecutively designed, dishing occurs in order to surround a chip, concavities and convexities are easily formed on the junction surface, and a void is easily generated. Here, in a case where the void is generated, the junction strength of the Cu—Cu junction surface decreases, and thus, it is difficult to stop an inner crack or chipping. In addition, in a case where the moisture infiltrates into the Cu—Cu junction surface from an end portion of the chip after opening or dicing a power source pad, it is assumed that wiring is corroded, and reliability is affected.

Therefore, the present technology has been made in consideration of such circumstances, and it is mainly desirable to provide a semiconductor device and an electronic device, capable of improving the reliability of the quality of a semiconductor device, on a junction surface of a Cu—Cu junction.

Solution to Problem

As a result of intensive studies of the present inventors, the present technology has been completed by succeeding in improving the reliability of the quality of the semiconductor device, on the junction surface of the Cu—Cu junction.

That is, in the present technology, first, a semiconductor device, including: a first semiconductor substrate; a second semiconductor substrate; and at least one guard ring unit including a first guard ring, a second guard ring, and a third guard ring, in which the first semiconductor substrate and the second semiconductor substrate are joined together by a first junction surface of the first semiconductor substrate and a second junction surface of the second semiconductor substrate, the first guard ring is formed on the first semiconductor substrate, the second guard ring is formed on the second semiconductor substrate, and the third guard ring is formed on the first junction surface and the second junction surface, is provided.

In the semiconductor device according to an embodiment of the present technology, the guard ring unit may be provided inside a scribe line that is formed to surround at least a part of a circumference of the semiconductor device, and the third guard ring may be consecutively formed.

In the semiconductor device according to an embodiment of the present technology, at least two guard ring units may be provided to surround an opening portion of at least one power source pad, formed on at least a part of a circumference of the semiconductor device. In addition, in the semiconductor device according to an embodiment of the present technology, at least three guard ring units may be formed to surround at least a part of a circumference of the semiconductor device.

In the semiconductor device according to an embodiment of the present technology, the guard ring unit may contain a metal. In addition, in the semiconductor device according to an embodiment of the present technology, the guard ring unit may cover a wiring layer. In addition, in the semiconductor device according to an embodiment of the present technology, the first guard ring may include a groove, the groove may be formed into the shape of a groove, and a barrier metal material may be applied into the groove.

In the semiconductor device according to an embodiment of the present technology, the semiconductor device may further include at least one Cu dummy, and the Cu dummy may be formed on an outer circumference of the guard ring unit, and may be formed on the first junction surface and the second junction surface.

In the semiconductor device according to an embodiment of the present technology, the semiconductor device may further include a slit, and the slit may be provided between a scribe line formed to surround at least a part of a circumference of the semiconductor device and the guard ring unit formed inside the scribe line, and may penetrate through the first junction surface and the second junction surface, along a dicing direction.

In the semiconductor device according to an embodiment of the present technology, the semiconductor device may further include a slit; and at least one Cu dummy, the Cu dummy may be formed along an outer circumference of the guard ring unit, and may be formed on the first junction surface and the second junction surface, and the slit may be provided between a scribe line formed to surround at least a part of a circumference of the semiconductor device and the guard ring unit formed inside the scribe line, and may penetrate through the first junction surface and the second junction surface, along a dicing direction.

In the semiconductor device according to an embodiment of the present technology, the guard ring unit may be provided along the inside of a scribe line formed to surround at least a part of a circumference of the semiconductor device, and the third guard ring may be inconsecutively formed.

In the semiconductor device according to an embodiment of the present technology, the guard ring unit may be provided inside a scribe line formed to surround at least a part of a circumference of the semiconductor device, and the first guard ring may be inconsecutively formed.

In the semiconductor device according to an embodiment of the present technology, the semiconductor device may further include at least two guard ring units adjacent to each other on the right and left, the at least two guard ring units may be juxtaposed inside a scribe line formed to surround at least a part of a circumference of the semiconductor device, along a direction of the scribe line, the third guard rings of the adjacent guard ring units may be inconsecutively formed along the scribe line, and the third guard rings adjacent to each other on the right and left, may be asymmetric.

In addition, in the semiconductor device according to an embodiment of the present technology, the semiconductor device may further include a fourth guard ring and a fifth guard ring between the guard ring unit and the scribe line, the fourth guard ring may be formed on the first junction surface and the second junction surface, the fifth guard ring may be formed on the second semiconductor substrate, the first guard ring, the fourth guard ring, and the fifth guard ring may be formed into the shape of a step, in this order, and the fifth guard ring may be formed in a position closer to the scribe line than the first guard ring.

In addition, in the semiconductor device according to an embodiment of the present technology, on the first semiconductor substrate and the second semiconductor substrate, a first region formed inside the scribe line, and a second region formed inside the scribe line and outside the first region, may be provided, and in at least one of the first region or the second region, the adjacent guard ring units may be formed.

In addition, in the present technology, an electronic device mounted with a semiconductor device, in which the semiconductor device includes a first semiconductor substrate, a second semiconductor substrate, and at least one guard ring unit including a first guard ring, a second guard ring, and a third guard ring, the first semiconductor substrate and the second semiconductor substrate are joined together by a first junction surface of the first semiconductor substrate and a second junction surface of the second semiconductor substrate, the first guard ring is formed on the first semiconductor substrate, and the second guard ring is formed on the second semiconductor substrate, and the third guard ring is formed on the first junction surface and the second junction surface, is provided.

According to an aspect of the present technology, a semiconductor device includes a first semiconductor substrate; a second semiconductor substrate; and at least one guard structure including a first guard element, a second guard element, and a third guard element. The first semiconductor substrate and the second semiconductor substrate are bonded to one another at a bonding interface between a surface of the first semiconductor substrate and a surface of the second semiconductor substrate. The first guard element is in the first semiconductor substrate and spaced apart from the third guard element by a portion of the first semiconductor substrate. The second guard element is in the second semiconductor substrate and spaced apart from the third guard element by a portion of the second semiconductor substrate, and the third guard element includes portions in the first surface and the second surface to bond the first semiconductor substrate to the second semiconductor substrate. The at least one guard structure is inside a scribe line that surrounds at least a part of a circumference of the semiconductor device. The at least one guard structure includes at least two guard structures that surround an opening portion that includes at least one power source pad. The at least one guard structure is located along at least one side of the semiconductor device in a plan view. The at least one guard structure includes metal. The at least one guard structure covers a wiring layer. The first guard element includes a groove, and the groove includes metal. The semiconductor device further includes at least one dummy structure, where the at least one dummy structure is at an outer circumference of the at least one guard structure, and is in the first surface and the second surface. The semiconductor device further includes a slit between a scribe line and the at least one guard structure, where the slit penetrates through the first surface and the second surface. The semiconductor device further includes a slit between a scribe line the at least one guard structure, where the slit penetrates through the first surface and the second surface. The semiconductor device includes at least one dummy structure located along at least one side of the at least one guard structure, and in the first surface and the second surface. The at least one guard structure is provided along the inside of a scribe line that surrounds at least a part of a circumference of the semiconductor device. The semiconductor device further includes a fourth guard element disposed in a surface of the first substrate at a first distance from a scribe line, where the surface of the first substrate is opposite the bonding surface. The semiconductor device includes a fifth guard element disposed in the first substrate at the bonding surface and at a second distance from the scribe line; and a sixth guard element disposed in a surface of the second substrate at a third distance from the scribe line, where the surface of the second substrate is opposite the bonding surface. The second distance is between the first distance and the third distance. The at least one guard structure includes at least two guard structures adjacent to each other, and the at least two guard structures are around at least a part of a circumference of the semiconductor device. The portions of the third guard elements have a same structure. The semiconductor device further includes a fourth guard element and a fifth guard element between the at least one guard structure and a scribe line. The fourth guard element is in the first surface and the second surface. The fifth guard element is in the second semiconductor substrate. The first guard element, the fourth guard element, and the fifth guard element form a step shape in a cross sectional view, and the fifth guard element is closer to the scribe line than the first guard element. The semiconductor device further includes a pixel region on the first semiconductor substrate and including a plurality of pixels; and an opening disposed in a surface of the first semiconductor substrate that is opposite the first surface and that penetrates the second semiconductor substrate. The opening is between the pixel region and the at least one guard structure. The semiconductor device includes a conductive structure disposed in a bottom of the opening. The semiconductor device further includes a plurality of dummy structures disposed in the first and second semiconductor substrates and bonded to one another within the pixel region. According to an aspect of the present technology, a semiconductor device includes a first substrate including a pixel region having a plurality of pixels; a second substrate bonded to the first substrate at a bonding interface; and at least one guard structure disposed in the first and second substrates and outside of the pixel region. The at least one guard structure includes a first guard element disposed in a first surface of the first substrate that is opposite the bonding interface; a second guard element disposed in a first surface of the second substrate that is opposite the bonding interface; and a third guard element including a first bonding portion disposed in the first substrate at the bonding interface and spaced apart from the first guard element by a portion of the first substrate, and a second bonding portion disposed in the second substrate at the bonding interface and spaced apart from the second guard element by a portion of the second substrate. The first ponding portion and the second bonding portion are bonded to one another, and the first guard element, the second guard element, and the third guard element overlap one another in a plan view. The at least one guard structure includes a plurality of guard structures that surround the pixel region in the plan view. The semiconductor device includes an opening disposed in the first surface of the first substrate and that penetrates the bonding interface to a location in second semiconductor substrate, the opening being between the pixel region and the at least one guard structure. The semiconductor device includes a conductive structure disposed in a bottom of the opening; and a plurality of dummy structures disposed in the first and second substrates bonded to one another at the bonding interface and that surround the opening. According to an aspect of the present technology, a semiconductor device includes a first substrate including a first chip area having a first pixel region; a second substrate bonded to the first substrate at a bonding interface and including circuitry that processes signals from the first pixel region; and a plurality of guard structures disposed in the first and second substrates that protect the first chip area from at least one of chipping and cracking when the first chip area is separated from a second chip area. Each of the plurality of guard structures includes a first guard element disposed in a first surface of the first substrate that is opposite the bonding interface; a second guard element disposed in a first surface of the second substrate that is opposite the bonding interface; and a third guard element including a first bonding portion disposed in the first substrate at the bonding interface and spaced apart from the first guard element by a portion of the first substrate, and a second bonding portion disposed in the second substrate at the bonding interface and spaced apart from the second guard element by a portion of the second substrate.

According to the present technology, it is possible to improve the reliability of the quality of a semiconductor device, on a junction surface of a Cu—Cu junction. Furthermore, the effect of the present technology is not necessarily limited to the effects described above, but may be any effect described in the present technology.

DESCRIPTION OF EMBODIMENTS

Hereinafter, preferred modes for carrying out the present technology will be described with reference to the drawings. Furthermore, the following embodiments are merely an example of a representative embodiment of the present technology, and the scope of the present technology is not narrowly interpreted by the embodiments.

Furthermore, the description will be made according to the following items.

1. Outline of Present Technology
2. First Embodiment (First Example of Semiconductor Device)
3. Second Embodiment (First Example of Manufacturing Method of Semiconductor Device)
4. Third Embodiment (Second Example of Semiconductor Device)
5. Fourth Embodiment (Third Example of Semiconductor Device)
6. Fifth Embodiment (Fourth Example of Semiconductor Device)
7. Sixth Embodiment (Fifth Example of Semiconductor Device)
8. Seventh Embodiment (Second Example of Manufacturing Method of Semiconductor Device)
9. Eighth Embodiment (Sixth Example of Semiconductor Device)
10. Ninth Embodiment (Seventh Example of Semiconductor Device)
11. Tenth Embodiment (Eighth Example of Semiconductor Device)
12. Eleventh Embodiment relevant to Electronic Device
13. Usage Example of Semiconductor Device to which Present Technology is Applied
14. Application Example with respect to Endoscopic Surgery System Application Example with respect to Mobile Object 1. Outline of Present Technology The present technology relates to dicing of a semiconductor device or examination of a semiconductor device, in a semiconductor device in which two semiconductor substrates are laminated. According to the present technology, it is possible to improve the quality of the semiconductor device.

For example, at the time of dicing a semiconductor device in which two semiconductor substrates are pasted to each other, there is a case where an inner crack or chipping occurs in the semiconductor device. In addition, at the time of opening a power source pad or after dicing a power source pad, it is assumed that the moisture infiltrates into a chip from an end portion of the chip. In this case, in a case where the moisture infiltrates into the chip, the moisture reaches a connection pad, and thus, there is a case where wiring is corroded.

The inner crack and the chipping occur at the time of the dicing, or the moisture infiltrates into the chip from the end portion of the chip after opening, and thus, there is a concern that the reliability of the semiconductor device decreases.

Figure 62A:
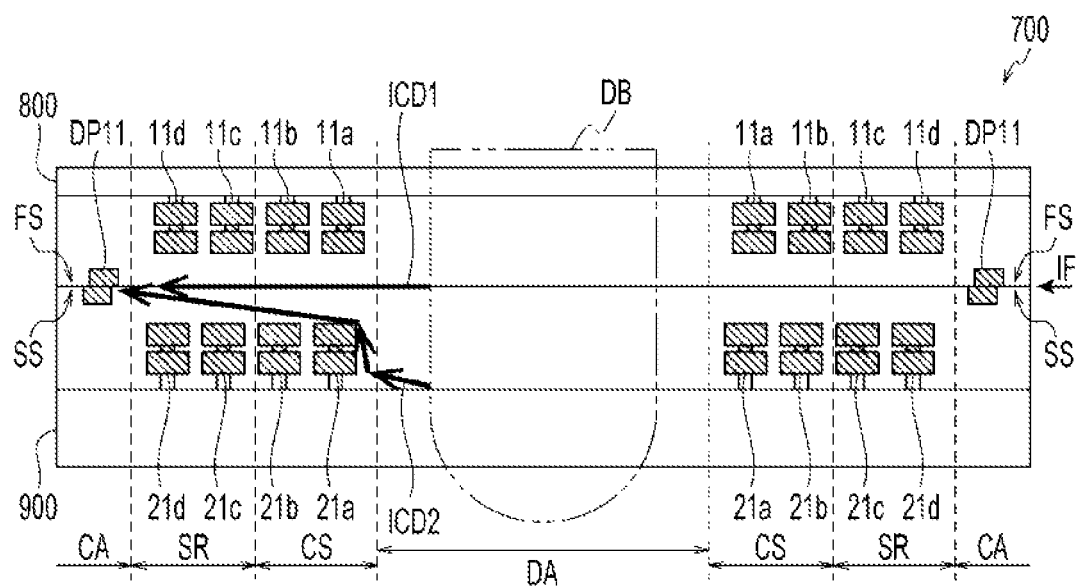
FIGS. 62A and 62B are explanatory diagrams illustrating a state in which an inner crack occurs at the time of dicing a semiconductor device by a dicing blade.
Figure 62B:
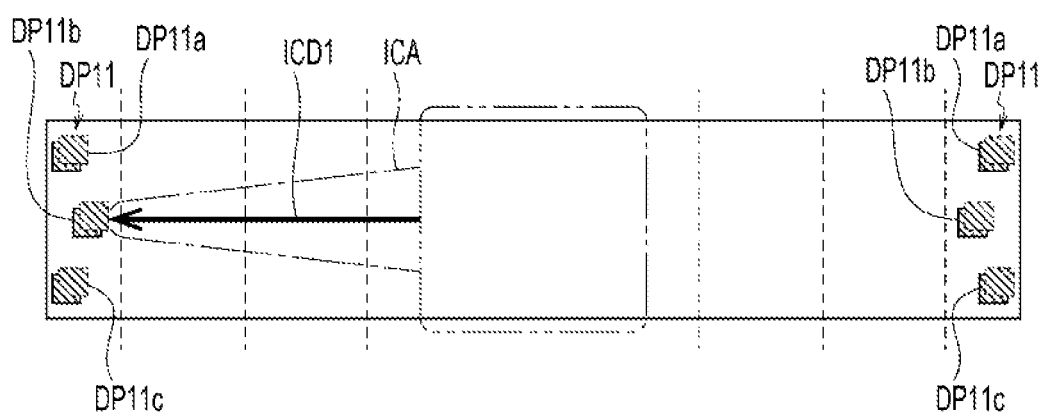

In FIGS. 62A and 62B, a state is illustrated in which the inner crack occurs at the time of dicing the semiconductor device by a dicing blade. FIG. 62A illustrates a sectional view of a semiconductor device 700, and FIG. 62B illustrates a plan view of a junction interface IF of the semiconductor device. Furthermore, unless otherwise particularly noted, "up" indicates an upper direction in FIGS. 62A and 62B, and "right" indicates a right direction in FIGS. 62A and 62B.

As illustrated in FIG. 62A, the semiconductor device 700 includes a first semiconductor substrate 800 and a second semiconductor substrate 900. The first semiconductor substrate 800 includes a sealing region SR and a crack stopper region CS outside a chip region CA (that is, a dicing blade DB side). The first semiconductor substrate 800 includes a first guard ring 11a and a first guard ring 11b in the crack stopper region CS, and includes a first guard ring 11c and a first guard ring 11d in the sealing region SR. Hereinafter, a guard ring may also be referred to as a guard element.

The second semiconductor substrate 900 includes the sealing region SR and the crack stopper region CS outside the chip region CA (that is, the dicing blade DB side). The second semiconductor substrate 900 includes a second guard ring 21a and a second guard ring 21b in the crack stopper region CS, and includes a second guard ring 21c and a second guard ring 21d in the sealing region SR.

A first copper (Cu) dummy (hereinafter, referred to as a Cu dummy) DP11 is formed inside the chip region CA, and is formed on a first junction surface FS of the first semiconductor substrate 800 and a second junction surface SS of the second semiconductor substrate 900. The first Cu dummy DP11 is provided to increase a junction strength between the first semiconductor substrate 800 and the second semiconductor substrate 900.

Then, the semiconductor device 700 is machined by the dicing blade DB in a dicing area DA, and is divided into two parts.

An inner crack ICD1 and an inner crack ICD2 represent that a chap or a cleavage occurs on the first semiconductor substrate 800 and the second semiconductor substrate 900 at the time of the dicing. Furthermore, the inner crack ICD1 represents a chap formed on the first junction surface FS of the first semiconductor substrate 800 and the second junction surface SS of the second semiconductor substrate 900.

In addition, as illustrated in FIG. 62B, when the inner crack ICD1 occurs on the junction interface IF between the first junction surface FS of the first semiconductor substrate 800 and the second junction surface SS of the second semiconductor substrate 900, there is a case where the inner crack ICD1 reaches the first Cu dummy DP11 in the chip region CA (a Cu dummy DP11a, a Cu dummy DP11b, and a Cu dummy DP11c). In this case, the inner crack ICD1 reaches the inside of the first semiconductor substrate 800 and the second semiconductor substrate 900, and thus, disconnection occurs in the wiring of a copper (Cu)-copper (Cu) junction (hereinafter, referred to as a Cu—Cu junction), or the moisture infiltrates from the Cu—Cu junction surface, and therefore, the wiring can be corroded in the chip region CA.

Figure 63:
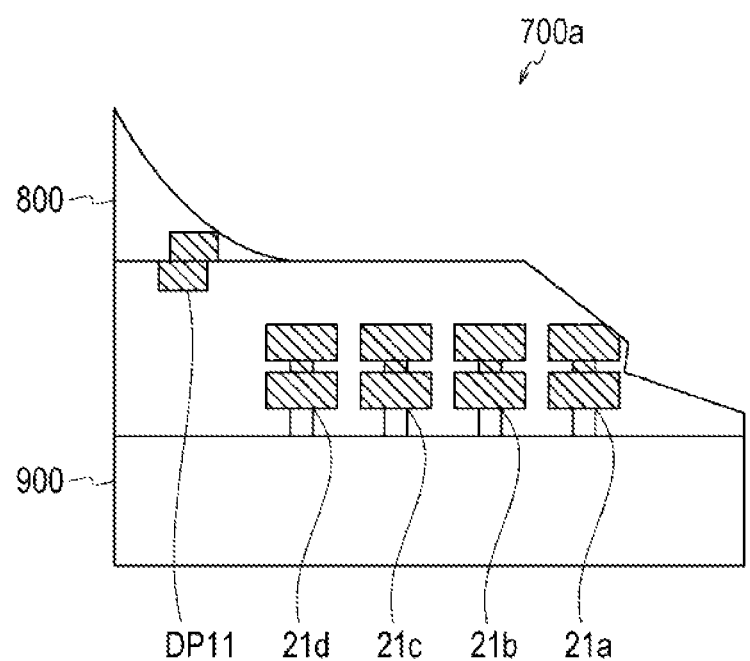
FIG. 63 is an explanatory diagram illustrating a state in which chipping occurs by machining a semiconductor device with a dicing blade.

In addition, there is a case where chipping occurs on a front surface of the semiconductor device, on the first semiconductor substrate 800 and the second semiconductor substrate 900 due to the inner crack ICD1. FIG. 63 illustrates a state after dicing in which chipping occurs in the semiconductor device 700. FIG. 63 is an explanatory diagram illustrating a state where chipping occurs by machining the semiconductor device 700 with the dicing blade DB.

As illustrated in FIG. 63, in a semiconductor device 700a, the impact of the inner crack ICD1 is propagated into the chip through the first Cu dummy DP11, and chipping occurs. In addition, the second guard ring 21a, the second guard ring 21b, the second guard ring 21c, and the second guard ring 21d are a guard ring formed on the second semiconductor substrate 900.

In this case, in the semiconductor device 700a, the impact reaches the chip region of the semiconductor device 700a due to the chipping, and thus, the semiconductor device 700a is determined as a product defect. In a case where the semiconductor device 700a is determined as the product defect, there is a possibility that a yield ratio decreases, and the reliability is impaired.

The present technology has been made in consideration of the circumstances described above, and is capable of improving the reliability of the quality of the semiconductor device, on the junction surface of the Cu—Cu junction. With this arrangement, the present technology is capable of improving the yield ratio of the semiconductor device, and of improving the reliability.

Hereinafter, an overall configuration example of a solid-state imaging device will be described as an example semiconductor device according to an embodiment of the present technology, by using FIG. 64 and FIG. 65.

Figure 64:
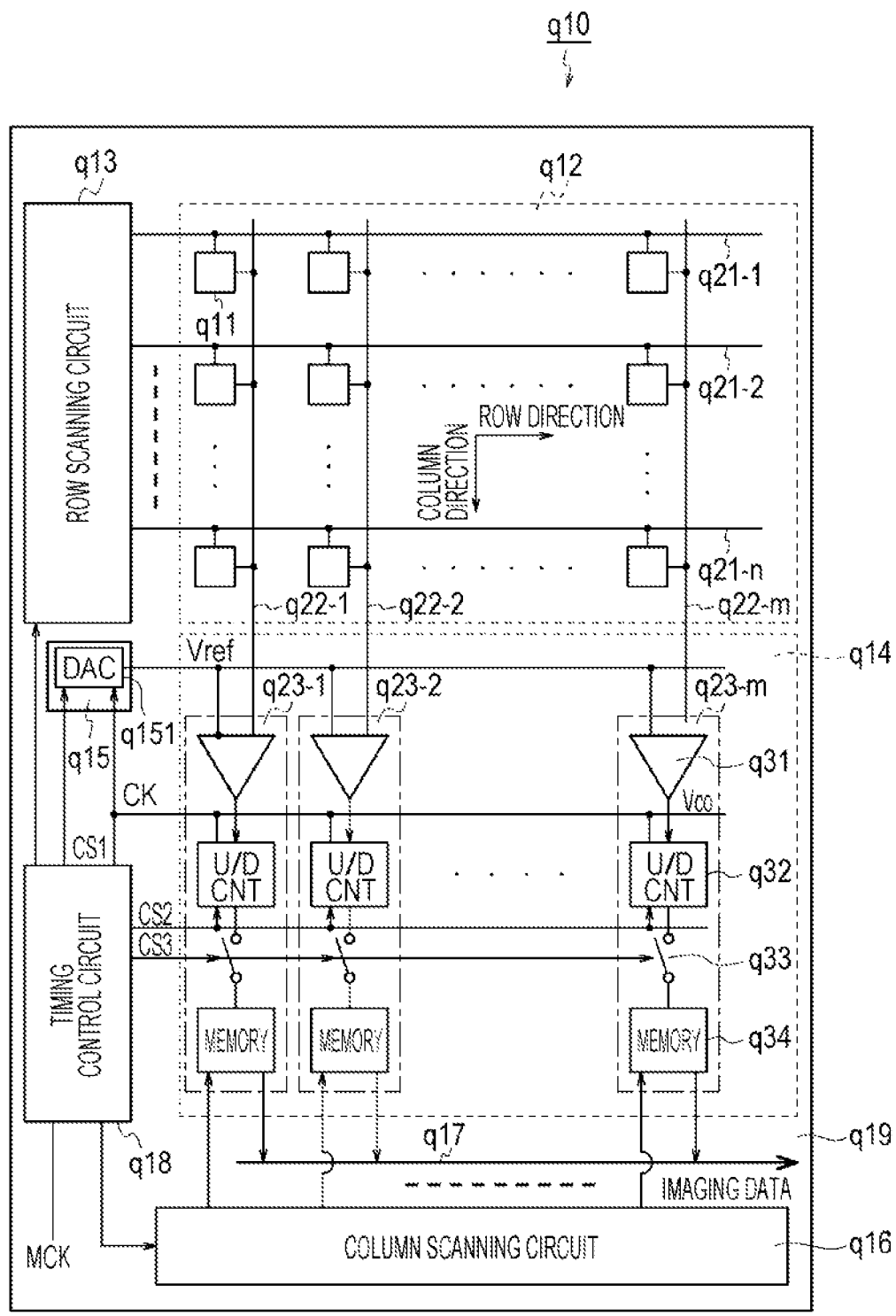
FIG. 64 is a block diagram illustrating a configuration of a CMOS image sensor on which a column parallel ADC according to the present technology is mounted.

FIG. 64 is a block diagram illustrating the overall configuration of a solid-state imaging device according to an embodiment of the present technology, for example, a CMOS image sensor on which a column parallel ADC is mounted. As illustrated in FIG. 64, a CMOS image sensor q10 according to this embodiment, includes a row scanning circuit q13, a column processing unit q14, a reference voltage supply unit q15, a column scanning circuit q16, a horizontal output line q17, and a timing control circuit q18, in addition to a pixel array portion q12 in which a plurality of unit pixels q11 including a photoelectric conversion element are two-dimensionally arranged into the shape of a matrix.

In this system configuration, the timing control circuit q18 generates a clock signal, a control signal, or the like that is a reference for the operation of the row scanning circuit q13, the column processing unit q14, the reference voltage supply unit q15, the column scanning circuit q16, and the like, on the basis of a master clock MCK, and applies the clock signal, the control signal, or the like to the row scanning circuit q13, the column processing unit q14, the reference voltage supply unit q15, the column scanning circuit q16, and the like.

In addition, a peripheral driving system or signal processing system for driving and controlling each of the unit pixels q11 of the pixel array portion q12, that is, the row scanning circuit q13, the column processing unit q14, the reference voltage supply unit q15, the column scanning circuit q16, the horizontal output line q17, the timing control circuit q18, and the like are integrated on a chip (a semiconductor substrate) q19 that is the same as the pixel array portion q12.

Here, even though it is not illustrated, for example, a unit pixel having a three-transistor configuration including a transfer transistor transferring charge obtained by performing photoelectric conversion with the photoelectric conversion element to a floating diffusion (FD) unit, a reset transistor controlling the potential of the FD unit, and an amplification transistor outputting a signal according to the potential of the FD unit, a unit pixel having a four-transistor configuration further including a selection transistor for performing pixel selection in addition to the three-transistor configuration, or the like can be used as the unit pixel q11, in addition to the photoelectric conversion element (for example, a photodiode).

In the pixel array portion q12, the unit pixels q11 of m-column n-row are two-dimensionally arranged, and in pixel arrangement of m-row n-column, a row control line q21 (q21-1 to q21-n) is wired for each row, and a column signal line q22 (q22-1 to q22-m) is wired for each column. Each one end of the row control lines q21-1 to q21-n, is connected to each output end corresponding to each row of the row scanning circuit q13. The row scanning circuit q13 includes a shift register or the like, and controls a row address or row scanning of the pixel array portion q12 through the row control lines q21-1 to q21-n.

The column processing unit q14, for example, includes analog-digital conversion circuits (ADCs) q23-1 to q23-m provided for each pixel column of the pixel array portion q12, that is, for each of the column signal lines q22-1 to q22-m, converts an analog signal that is output for each column from each of the unit pixels q11 of the pixel array portion q12, into a digital signal, and outputs the digital signal. Furthermore, the details of the configuration of the ADCs q23-1 to q23-m will be described later.

The reference voltage supply unit q15, for example, includes a digital-analog conversion circuit (DAC) q151 as a unit generating a reference voltage Vref of a so-called ramp (RAMP) waveform, of which the level is obliquely changed as time elapses. Furthermore, the unit generating the reference voltage Vref of the ramp waveform is not limited to the DAC q151.

The DAC q151 generates the reference voltage Vref of the ramp waveform on the basis of a clock CK applied from the timing control circuit q18, and supplies the reference voltage Vref to the ADCs q23-1 to q23-m of the column processing unit q15, under the control of a control signal CS1 applied from the timing control circuit q18.

Here, the details of the configuration of the ADCs q23-1 to q23-m will be specifically described.

Each of the ADCs q23-1 to q23-m is capable of selectively performing an AD conversion operation corresponding to each operation mode of a normal frame rate mode, and a high frame rate mode in which an exposure time of the unit pixel q11 is set to 1/N, and thus, a frame rate is set to N times, for example, 2 times, compared to the normal frame rate mode in a progressive scanning method of reading out information of all of the unit pixels q11. The operation mode is switched according to the control of control signals CS2 and CS3 applied from the timing control circuit q18. In addition, instruction information for switching each of the operation modes of the normal frame rate mode and the high frame rate mode is applied to the timing control circuit q18 from an external system controller (not illustrated).

All of the ADCs q23-1 to q23-m have the same configuration, and thus, here, the ADC q23-m will be described as an example. The ADC 23-m includes a comparator q31, for example, an up/down counter (in the drawing, represented as U/DCNT) q32 that is a counter, a transfer switch q33, and a memory device q34.

The comparator q31 compares a signal voltage Vx of the column signal line 22-m according to the signal output from each of the unit pixels q11 of the n-th column of the pixel array portion q12, with the reference voltage Vref of the ramp waveform supplied from the reference voltage supply unit q15, and for example, when the reference voltage Vref is greater than the signal voltage Vx, an output Vco becomes an "H" level, and when the reference voltage Vref is less than or equal to the signal voltage Vx, the output Vco becomes an "L" level.

The up/down counter q32 is an asynchronous counter, and under the control of the control signal CS2 applied from the timing control circuit q18, the clock CK is applied from the timing control circuit q18, along with the DAC q151, and down (DOWN) count or up (UP) count is performed in synchronization with the clock CK, and thus, a comparison period from the start of a comparison operation to the end of the comparison operation in the comparator q31 is measured.

Specifically, in the normal frame rate mode, in a read-out operation of the signal from one unit pixel q11, the down count is performed at the time of the first read-out operation, and thus, a comparison time at the time of the first read-out is measured, and the up count is performed at the time of the second read-out operation, and thus, a comparison time at the time of the second read-out is measured.

On the other hand, in the high frame rate mode, a count result with respect to the unit pixel q11 of a certain row is retained as it is, and subsequently, from the previous count result, the down count is performed with respect to the unit pixel q11 of the next row at the time of the first read-out operation and thus, the comparison time at the time of first read-out is measured, and the up count is performed with respect to the unit pixel q11 of the next row at the time of the second read-out operation, and thus, the comparison time at the time of the second read-out is measured.

In the normal frame rate mode, the transfer switch q33 is in an on (closed) state at a time point when a count operation of the up/down counter q32 with respect to the unit pixel q11 of a certain row is completed, and transfers the count result of the up/down counter q32 to the memory device q34, under the control of the control signal CS3 applied from the timing control circuit q18.

On the other hand, for example, in the high frame rate of N=2, the transfer switch q33 is in an off (opened) state at a time point when the count operation of the up/down counter q32 with respect to the unit pixel q11 of a certain row is completed, and subsequently, is in the on state at a time point when the count operation of the up/down counter q32 with respect to the unit pixel q11 of the next row is completed, and transfers the count result of two vertical pixels of the up/down counter q32 to the memory device q34.

Thus, the analog signal that is supplied to each column from each of the unit pixels q11 of the pixel array portion q12 through the column signal lines q22-1 to q22-m, is converted to the digital signal of N bits according to each operation of the comparator q31 and the up/down counter q32 of the ADC q23 (q23-1 to q23-m), and is stored in the memory device q34 (q34-1 to q34-m).

The column scanning circuit q16 includes the shift register or the like, and controls the column address or the column scanning of the ADCs q23-1 to q23-m of the column processing unit q14. The digital signals of N bits subjected to the AD conversion in each of the ADCs q23-1 to q23-m, are sequentially read out to the horizontal output line q17, and are output as imaging data through the horizontal output line q17, under the control of the column scanning circuit q16.

Furthermore, even though it is not particularly illustrated, a circuit or the like performing various signal processings with respect to the imaging data output through the horizontal output line q17, can also be provided in addition to the constituents described above.

In the CMOS image sensor q10 on which the column parallel ADC is mounted, having the configuration described above, the count result of the up/down counter q32 can be selectively transferred to the memory device q34 through the transfer switch q33, and thus, the count operation of the up/down counter q32, and the read-out operation of the count result of the up/down counter q32 with respect to the horizontal output line q17, can be independently controlled.

Furthermore, the configuration of the CMOS image sensor q10 on which the column parallel ADC is mounted, illustrated in FIG. 64, is merely an example, and each circuit may be provided in either of the first semiconductor substrate 800 and the second semiconductor substrate 900 illustrated in FIGS. 62A and 62B. In addition, a part of a circuit illustrated in FIG. 64, may not be provided in the semiconductor device 700.

Figure 65:
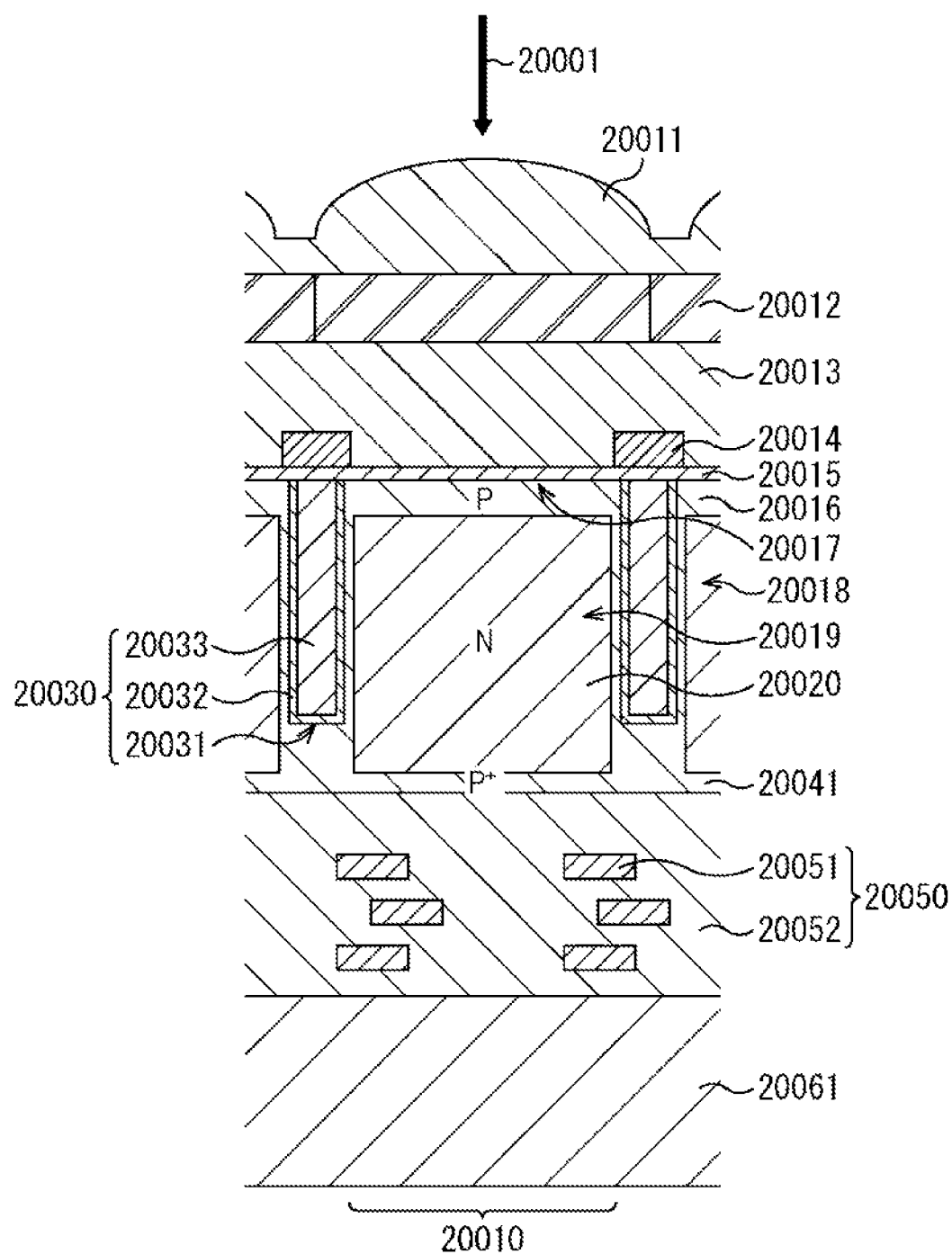
FIG. 65 is a sectional view illustrating a configuration example of a solid-state imaging device to which a technology according to the present disclosure can be applied.

FIG. 65 is a sectional view illustrating the overall configuration example of the solid-state imaging device to which the present technology can be applied.

In the solid-state imaging device, a photodiode (PD) 20019 receives incident light 20001 that is incident from a rear surface (in FIG. 65, an upper surface) side of a semiconductor substrate 20018. A flattening film 20013, a color filter (CF) 20012, and a microlens 20011 are provided above the PD 20019, and the incident light 20001 that is sequentially incident through each unit, is received on a receiving surface 20017, and is subjected to photoelectric conversion. The semiconductor substrate 20018, for example, corresponds to a first semiconductor substrate 10 illustrated in FIG. 1, as described later.

For example, the PD 20019 is formed as a charge accumulation region for an n type semiconductor region 20020 to accumulate charges (electrons). In the PD 20019, the n type semiconductor region 20020 is provided in p type semiconductor regions 20016 and 20041 of the semiconductor substrate 20018. The p type semiconductor region 20041 having an impurity concentration higher than that of the rear surface (the upper surface) side, is provided in the n type semiconductor region 20020 on a front surface (a lower surface) side of the semiconductor substrate 20018. That is, the PD 20019 has a hole-accumulation diode (HAD) structure, and the p type semiconductor regions 20016 and 20041 are formed on each interface between the upper surface side and the lower surface side of the n type semiconductor region 20020, in order to prevent a dark current from being generated or to reduce the dark current.

In the semiconductor substrate 20018, a pixel separation portion 20030 electrically separating a plurality of pixels 20010 is provided, and the PD 20019 is provided in a region partitioned by the pixel separation portion 20030. In FIG. 65, in a case where the solid-state imaging device is seen from the upper surface side, the pixel separation portion 20030, for example, is formed into the shape of a grid through the plurality of pixels 20010, and the PD 20019 is formed in the region partitioned by the pixel separation portion 20030.

In each PD 20019, an anode is grounded, and in the solid-state imaging device, signal charges (for example, electrons) accumulated by the PD 20019, are read out through a transfer Tr (MOS FET) (not illustrated) or the like, and are output to a vertical signal line (VSL) (not illustrated) as an electric signal.

A wiring layer 20050 is provided on the front surface (the lower surface) of the semiconductor substrate 20018, on a side opposite to the rear surface (the upper surface) on which each unit such as a light shielding film 20014, the CF 20012, and the microlens 20011 is provided.

The wiring layer 20050 includes wiring 20051 and an insulating layer 20052, and in the insulating layer 20052, the wiring 20051 is formed to be electrically connected to each element. The wiring layer 20050 is a so-called multilayer wiring layer, and is formed by alternately laminating an interlayer insulating film configuring the insulating layer 20052 and the wiring 20051 a plurality of times. Here, wiring with respect to a Tr for reading out the charges from the PD 20019, such as the transfer Tr, and wiring for reading out the charges, such as the VSL, are laminated through the insulating layer 20052, as the wiring 20051.

A support substrate 20061 is provided on the wiring layer 20050 on a side opposite to a side where the PD 20019 is provided. For example, a substrate including a silicon semiconductor, of which the thickness is several hundred μm, is provided as the support substrate 20061.

The light shielding film 20014 is provided on the rear surface (in FIG. 65, the upper surface) side of the semiconductor substrate 20018.

The light shielding film 20014 shields a part of the incident light 20001 that is directed towards the rear surface of the semiconductor substrate 20018 from the upper portion of the semiconductor substrate 20018.

The light shielding film 20014 is provided in the upper portion of the pixel separation portion 20030 that is provided in the semiconductor substrate 20018. Here, the light shielding film 20014 is provided on the rear surface (the upper surface) of the semiconductor substrate 20018 to protrude into a convex shape through the insulating film 20015 such as a silicon oxide film. In contrast, the light shielding film 20014 is not provided in the upper portion of the PD 20019 provided in the semiconductor substrate 20018, but the upper portion of the PD 20019 is opened such that the incident light 20001 is incident on the PD 20019.

That is, in FIG. 65, in a case where the solid-state imaging device is seen from the upper surface side, the planar shape of the light shielding film 20014 is in the shape of a grid, and an opening through which the incident light 20001 passes to the receiving surface 20017, is formed.

The light shielding film 20014 contains a light shield material that shields light. For example, a titanium (Ti) film and a tungsten (W) film are sequentially laminated, and thus, the light shielding film 20014 is formed. In addition, the light shielding film 20014, for example, can be formed by sequentially laminating a titanium nitride (TiN) film and a tungsten (W) film.

The light shielding film 20014 is covered with the flattening film 20013. The flattening film 20013 is formed by using an insulating material that transmits light.

The pixel separation portion 20030 includes a groove 20031, a fixed charge film 20032, and an insulating film 20033.

The fixed charge film 20032 is formed to cover the groove 20031 that partitions the plurality of pixels 20010, on the rear surface (the upper surface) side of the semiconductor substrate 20018.

Specifically, the fixed charge film 20032 is provided to cover an inner surface of the groove 20031 formed on the rear surface (the upper surface) side in the semiconductor substrate 20018, with a constant thickness. Then, the insulating film 20033 is provided to bury (fill) the inside of the groove 20031 covered with the fixed charge film 20032.

Here, the fixed charge film 20032 is formed by using a high dielectric body having a negative fixed charge such that a positive charge (hole) accumulation region is formed in an interface portion with respect to the semiconductor substrate 20018, and a dark current is prevented from being generated or reduced. The fixed charge film 20032 is formed to have the negative fixed charge, and thus, an electric field is added to the interface with respect to the semiconductor substrate 20018 according to the negative fixed charge, and the positive charge (hole) accumulation region is formed.

The fixed charge film 20032, for example, is capable of including a hafnium oxide film (a $HfO_2$ film). In addition, the fixed charge film 20032, for example, is capable of containing at least one of oxides of hafnium, zirconium, aluminum, tantalum, titanium, magnesium, yttrium, a lanthanoid element, and the like.

The technology according to the present disclosure can also be applied to the solid-state imaging device as described above.

2. First Embodiment (First Example of Semiconductor Device)

[Configuration of Semiconductor Device of First Embodiment]

A semiconductor device of a first embodiment according to the present technology, is a semiconductor device, including: a first semiconductor substrate; a second semiconductor substrate; and at least one guard ring unit including a first guard ring, a second guard ring, and a third guard ring, in which the first semiconductor substrate and the second semiconductor substrate are joined together by a first junction surface of the first semiconductor substrate and a second junction surface of the second semiconductor substrate, the first guard ring is formed on the first semiconductor substrate, the second guard ring is formed on the second semiconductor substrate, and the third guard ring is formed on the first junction surface and the second junction surface.

According to a solid-state imaging device of the first embodiment of the present technology, it is possible to improve the reliability of the quality of the semiconductor device, on the junction surface of the Cu—Cu junction.

Figure 1:
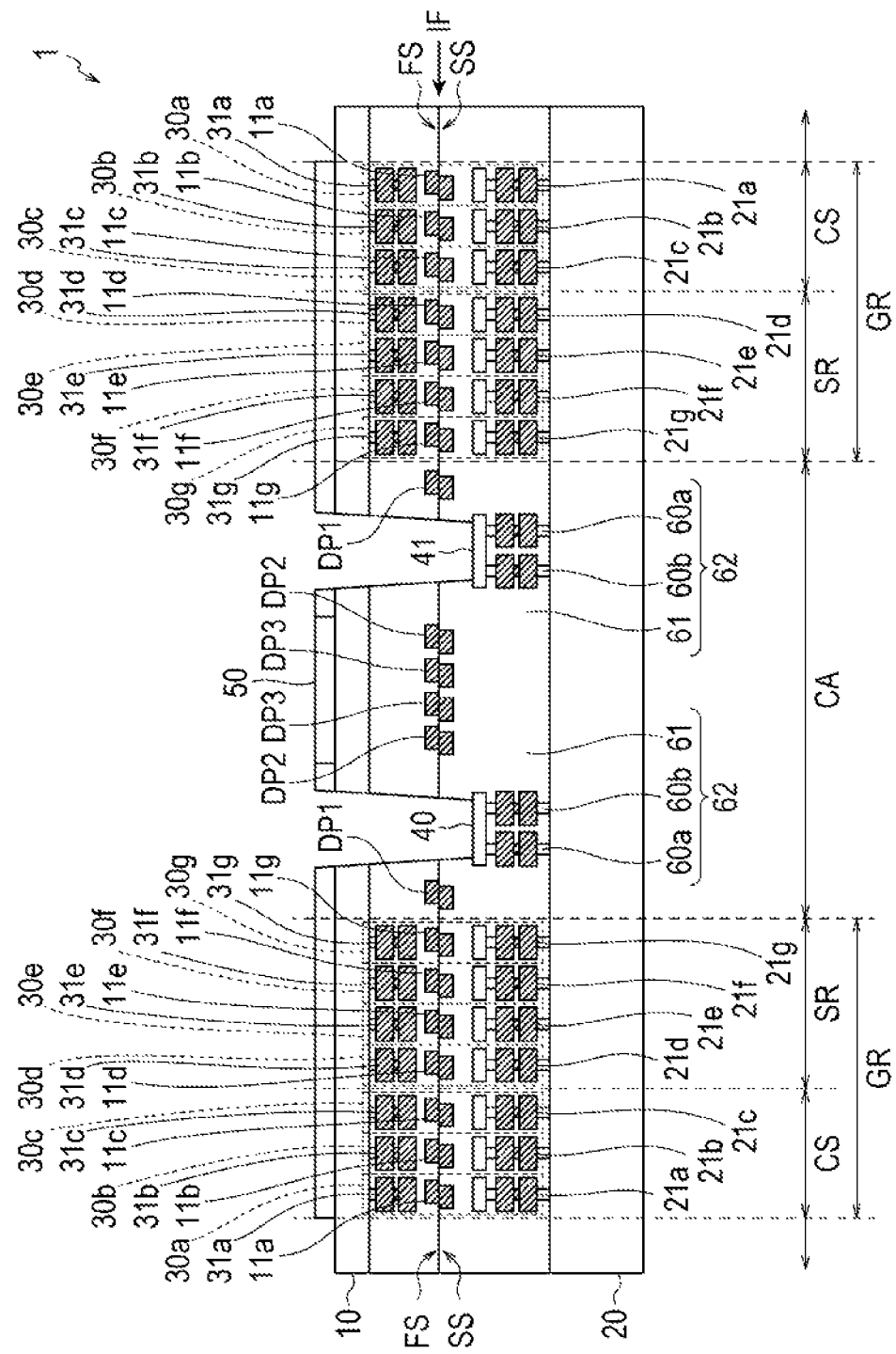
FIG. 1 is a sectional view of a semiconductor device that is an example of a semiconductor device of a first embodiment to which the present technology is applied.
Figure 2:
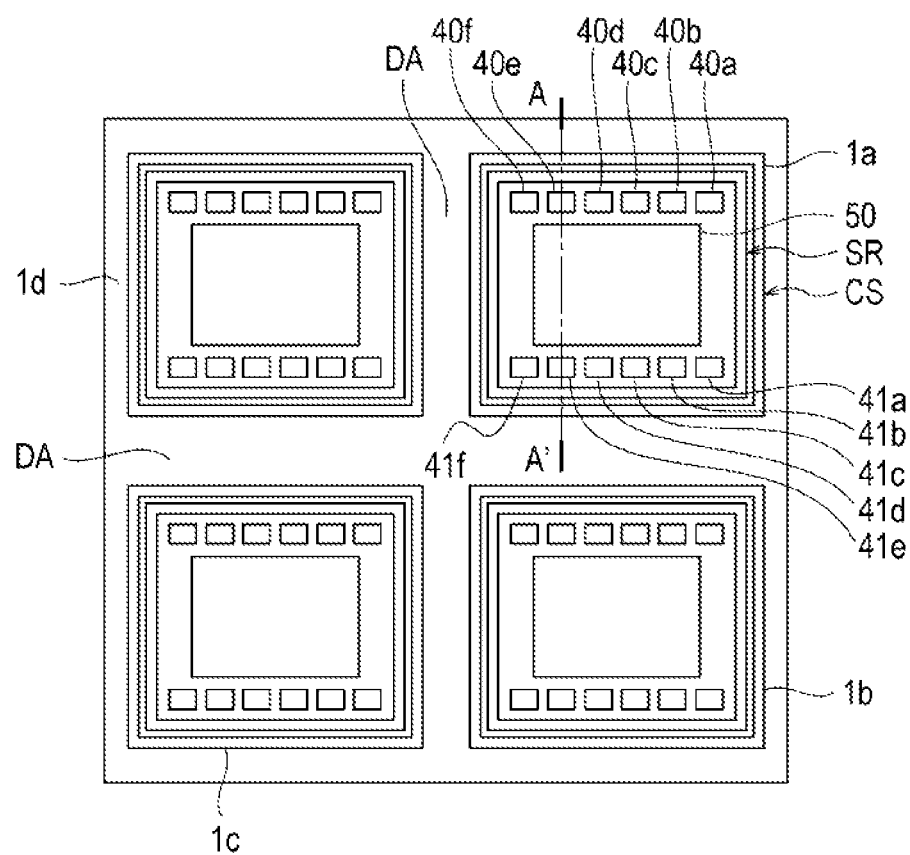
FIG. 2 is a top view of the semiconductor device before machining the semiconductor device that is an example of the semiconductor device of the first embodiment to which the present technology is applied.
Figure 3A:
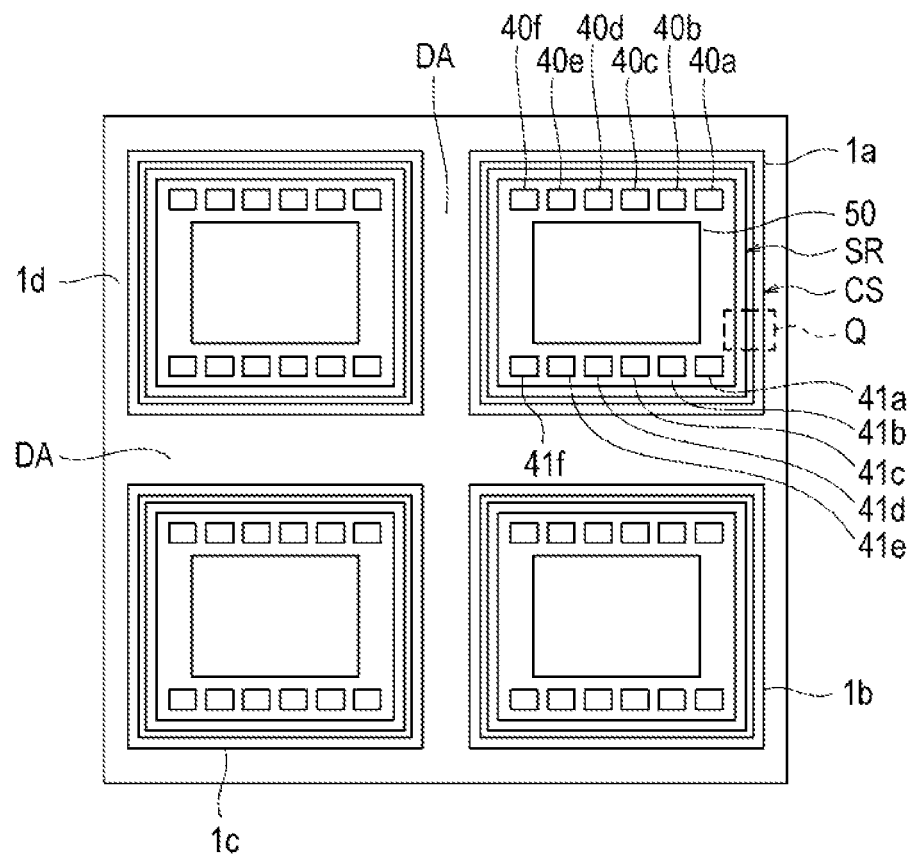
FIGS. 3A and 3B are plan views illustrating a guard ring of the semiconductor device that is an example of the semiconductor device of the first embodiment to which the present technology is applied.
Figure 3B:
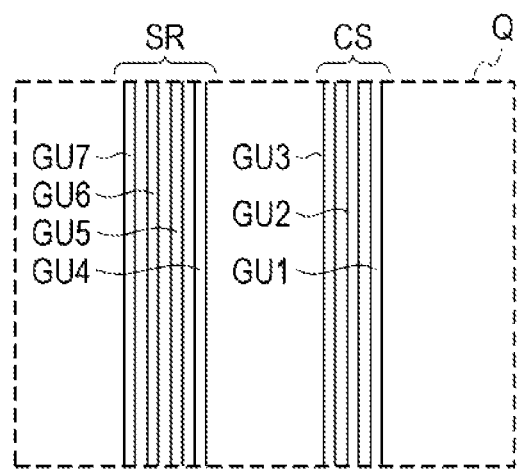

FIG. 1 to FIG. 3B illustrate a semiconductor device 1 that is an example of the semiconductor device of the first embodiment according to the present technology. FIG. 1 illustrates the sectional view of the semiconductor device 1. FIG. 2 illustrates the top view of the semiconductor device before machining the semiconductor device 1. FIGS. 3A and 3B illustrate partially enlarged views in which the semiconductor device and a region Q of the semiconductor device before machining the semiconductor device 1, are partially enlarged.

Furthermore, unless otherwise particularly noted, "up" indicates an upper direction in FIG. 1 to FIG. 3B, and "down" indicates a lower direction in FIG. 1 to FIG. 3B.

FIG. 1 illustrates a sectional surface cut along A-A' of FIG. 2. FIG. 2 illustrates a semiconductor device including four semiconductor devices of a semiconductor device 1a, a semiconductor device 1b, a semiconductor device 1c, and a semiconductor device 1d, in a state before dicing the semiconductor device 1. The semiconductor device 1 illustrated in FIG. 1, is formed by dicing the dicing area DA illustrated in FIG. 2 with the dicing blade DB. In addition, as illustrated in FIG. 2, the sealing region SR and the crack stopper region CS of the semiconductor device 1a, are formed to surround at least a part of the circumference of the semiconductor device 1a.

FIG. 3A illustrates a state before dicing the semiconductor device 1, and FIG. 3B illustrates a partially enlarged view in which the plan view of the crack stopper region CS and the sealing region SR in the region Q of the semiconductor device 1a is partially enlarged.

As illustrated in FIG. 2 and FIG. 3A, the semiconductor device 1a includes a pixel region 50, a power source pad 40a, a power source pad 40b, a power source pad 40c, a power source pad a power source pad 40e, a power source pad 40f, a power source pad 41a, a power source pad 41b, a power source pad 41c, a power source pad 41d, a power source pad 41e, a power source pad 41f, the sealing region SR, and the crack stopper region CS.

As illustrated in FIG. 3B, three guard ring units (a guard ring unit GU1, a guard ring unit GU2, and a guard ring unit GU3) are formed in the crack stopper region CS. Four guard ring units (a guard ring unit GU4, a guard ring unit GU5, a guard ring unit GU6, and a guard ring unit GU7) are formed in the sealing region SR. Hereinafter, a guard ring unit may also be referred to as a guard ring structure, guard structure, or the like.

The semiconductor device 1 illustrated in FIG. 1, includes the first semiconductor substrate 10, the second semiconductor substrate 20, and at least one guard ring unit 30a including the first guard ring 11a, the second guard ring 21a, and a third guard ring 31a. The first semiconductor substrate 10 and the second semiconductor substrate 20 are joined together by the first junction surface FS of the first semiconductor substrate 10 and the second junction surface SS of the second semiconductor substrate 20, the first guard ring 11a is formed on the first semiconductor substrate 10, the second guard ring 21a is formed on the second semiconductor substrate 20, and the third guard ring 31a is formed on the first junction surface FS and the second junction surface SS.

The first semiconductor substrate 10 and the second semiconductor substrate 20 include the sealing region SR and the crack stopper region CS outside the chip region CA (that is, outside the pixel region 50). The first guard ring 11a, the first guard ring 11b, and the first guard ring 11c are formed in the crack stopper region CS on the first semiconductor substrate 10. The first guard ring 11d, a first guard ring 11e, a first guard ring 11f, and a first guard ring 11g are formed in the sealing region SR on the first semiconductor substrate 10.

Furthermore, in a case where it is not necessary to specify any one of the first guard ring 11a, the first guard ring 11b, the first guard ring 11c, the first guard ring 11d, the first guard ring 11e, the first guard ring 11f, and the first guard ring 11g, the first guard rings will be collectively referred to as a first guard ring 11.

The second guard ring 21a, the second guard ring 21b, and the second guard ring 21c are formed in the crack stopper region CS on the second semiconductor substrate 20. The second guard ring 21d, a second guard ring 21e, a second guard ring 21f, and a second guard ring 21g are formed in the sealing region SR on the second semiconductor substrate 20.

Furthermore, in a case where it is not necessary to specify any one of the second guard ring 21a, the second guard ring 21b, the second guard ring 21c, the second guard ring 21d, the second guard ring 21e, the second guard ring 21f, and the second guard ring 21g, the second guard rings will be collectively referred to as a second guard ring 21.

The third guard ring 31a, a third guard ring 31b, a third guard ring 31c, a third guard ring 31d, a third guard ring 31e, a third guard ring 31f, and a third guard ring 31g are formed on the first junction surface FS and the second junction surface SS. Furthermore, in a case where it is not necessary to specify any one of the third guard rings 31, the third guard rings 31 will be collectively referred to as a third guard ring 31.

The guard ring unit 30a includes the first guard ring 11a, the second guard ring 21a, and the third guard ring 31a. A guard ring unit 30b includes the first guard ring 11b, the second guard ring 21b, and the third guard ring 31b. A guard ring unit 30c includes the first guard ring 11c, the second guard ring 21c, and the third guard ring 31c. A guard ring unit 30d includes the first guard ring 11d, the second guard ring 21d, and the third guard ring 31d. A guard ring unit 30e includes the first guard ring 11e, the second guard ring 21e, and the third guard ring 31e. A guard ring unit 30f includes the first guard ring 11f, the second guard ring 21f, and the third guard ring 31f. A guard ring unit 30g includes the first guard ring 11g, the second guard ring 21g, and the third guard ring 31g.

Furthermore, in a case where it is not necessary to specify any one of the guard ring unit 30a, the guard ring unit 30b, the guard ring unit 30c, the guard ring unit 30d, the guard ring unit the guard ring unit 30f, and the guard ring unit 30g, the guard ring units will be collectively referred to as a guard ring unit 30.

Furthermore, the guard ring unit 30 is formed in a guard ring region GR. In addition, the guard ring region GR includes the sealing region SR and the crack stopper region CS.

A first Cu dummy DP1, a first Cu dummy DP2, and a first Cu dummy DP3 are formed on the first junction surface FS of the first semiconductor substrate 10 and the second junction surface SS of the second semiconductor substrate 20. The first Cu dummy DP1, the first Cu dummy DP2, and the first Cu dummy DP3 are a connection pad dummy provided for increasing a junction strength between the first semiconductor substrate 10 and the second semiconductor substrate 20. Here, it should be understood that the terms "Cu dummy," "dummy structure," and the like may refer to conductive pad and/or wiring that does not carry an electrical signal (e.g., such as a pixel signal or a power supply signal).

The semiconductor device 1 is formed by pasting the first semiconductor substrate 10 and the second semiconductor substrate 20 to each other. In the semiconductor device 1, for example, the first junction surface FS of the first semiconductor substrate 10 and the second junction surface SS of the second semiconductor substrate 20 are joined together according to a plasma junction.

The first semiconductor substrate 10 includes the pixel region 50 including a plurality of pixels. The pixel region 50, for example, is formed by including a plurality of photodiodes forming unit pixels. The second semiconductor substrate 20, for example, includes a power source pad 40, a power source pad 41, and a wiring layer 62, and a part of a logic circuit is formed. Furthermore, the wiring layer 62 includes wiring 60a, wiring 60b, and an insulating film 61. In addition, a plurality of wiring layers 62 and the interlayer insulating film therebetween form a multilayer wiring layer.

Therefore, the semiconductor device 1 illustrated in FIG. 1, represents a configuration example of a laminated solid-state imaging device formed by pasting two semiconductor substrates (the first semiconductor substrate 10 and the second semiconductor substrate 20) to each other. In addition, the upper side of FIG. 1 is a receiving surface side on which light is incident, and is a rear surface side of the first semiconductor substrate 10, and the semiconductor device 1 is a rear surface irradiation type solid-state imaging device. Furthermore, the rear surface irradiation type solid-state imaging device is an example of the semiconductor device 1, but is not limited thereto.

[Effect of Semiconductor Device of First Embodiment]

As described above, the semiconductor device 1 of the first embodiment according to the present technology, includes the at least one guard ring unit 30 including the first guard ring 11, the second guard ring 21, and the third guard ring 31. The first semiconductor substrate 10 and the second semiconductor substrate 20 are joined together by the first junction surface FS of the first semiconductor substrate 10 and the second junction surface SS of the second semiconductor substrate 20, and the third guard ring 31 is formed on the first junction surface FS and the second junction surface SS.

According to the semiconductor device 1 of the first embodiment of the present technology, even in a case where an inner crack or chipping occurs at the time of the dicing, it is possible to prevent or reduce the progress of the inner crack or the chipping, according to the guard ring unit 30 including the third guard ring 31. In addition, the guard ring unit 30 includes the third guard ring 31 on the junction interface IF formed by joining the first semiconductor substrate 10 and the second semiconductor substrate 20 together, and thus, it is possible to prevent or reduce the infiltration of the moisture from the outside.

With this arrangement, the semiconductor device 1 of the first embodiment according to the present technology, is capable of improving the reliability of the quality of the semiconductor device, on the junction surface of the Cu—Cu junction.

3. Second Embodiment (First Example of Manufacturing Method of Semiconductor Device)

A manufacturing method of a semiconductor device of a second embodiment according to the present technology, is a manufacturing method of a semiconductor device, including: joining the first semiconductor substrate and the second semiconductor substrate together to face each other; forming the third guard ring on the first junction surface of the first semiconductor substrate and the second junction surface of the second semiconductor substrate; and forming the guard ring unit 30 by the first guard ring 11, the second guard ring 21, and the third guard ring 31.

FIG. 4A to FIG. 13B illustrate an example of a manufacturing method of the semiconductor device 1 of the second embodiment according to the present technology. Furthermore, unless otherwise particularly noted, "up" indicates an upper direction in FIG. 4A to FIG. 13B, and "down" indicates a lower direction in FIG. 4A to FIG. 13B. In addition, appropriately, A in each of the drawings, illustrates a sectional view, and B in each of the drawings, illustrates a plan view.

Figure 4A:
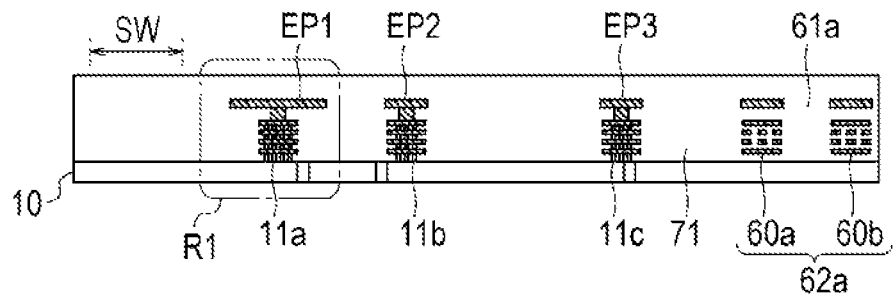
FIGS. 4A to 4C are (first) explanatory diagrams illustrating an example of a manufacturing method of a semiconductor device of a second embodiment to which the present technology is applied.
Figure 4B:
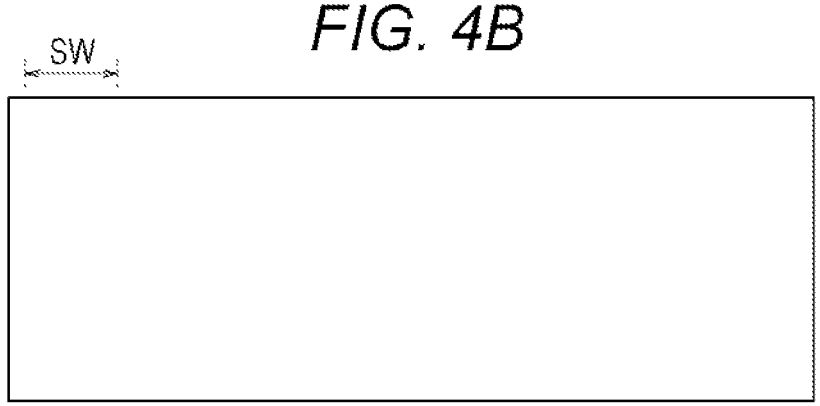
Figure 4C:
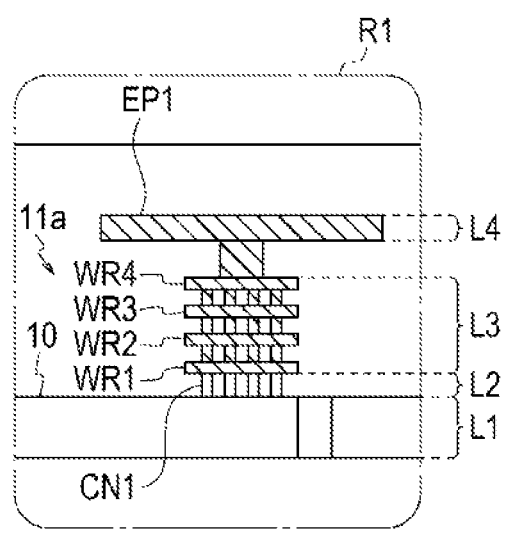
Figure 5A:
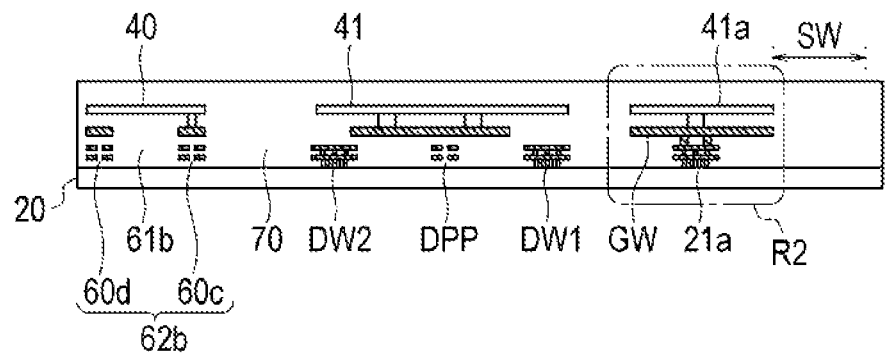
FIGS. 5A to 5C are (second) explanatory diagrams illustrating an example of the manufacturing method of the semiconductor device of the second embodiment to which the present technology is applied.
Figure 5B:
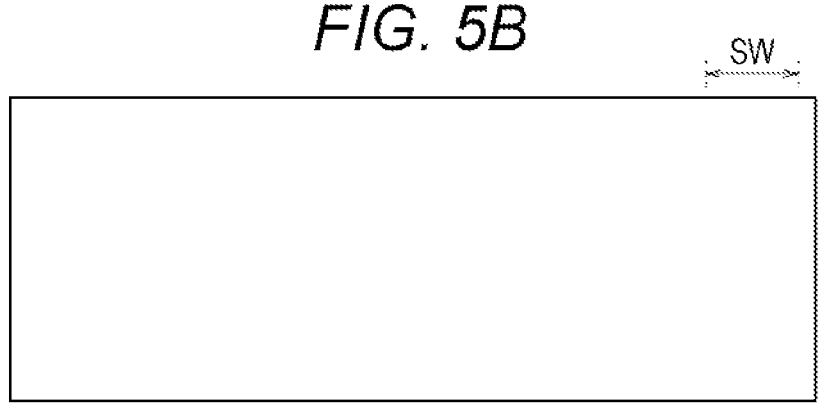
Figure 5C:
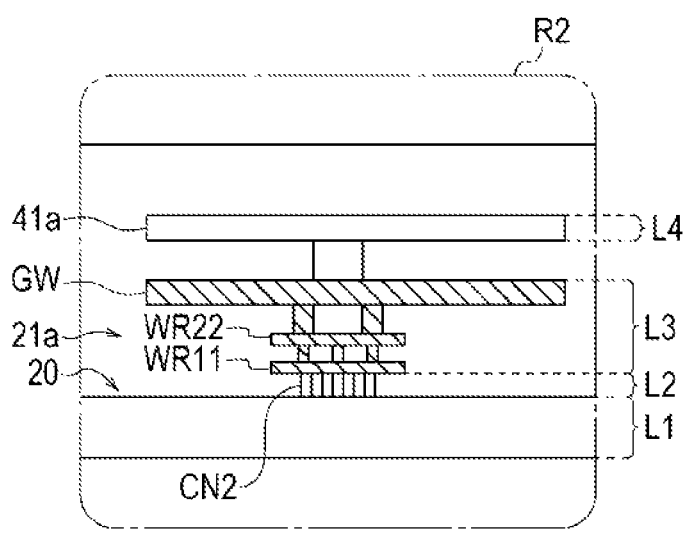

FIGS. 4A to 4C illustrate the first semiconductor substrate 10, and FIGS. 5A to 5C illustrate the second semiconductor substrate 20. The first semiconductor substrate 10 and the second semiconductor substrate 20, for example, contain single crystalline silicon. An oxide film is formed on the front surface of each of the first semiconductor substrate 10 and the second semiconductor substrate 20, and a plurality of wiring layers are provided on the underlayer.

The first semiconductor substrate 10 illustrated in FIGS. 4A to 4C, includes the first guard ring 11a, the first guard ring 11b, the first guard ring 11c, the wiring 60a, the wiring 60b, an insulating film 61a, a wiring layer 62a, and an interlayer insulating film 71. An electrode pad EP1 is provided in the first guard ring 11a. An electrode pad EP2 is provided in the first guard ring 11b. An electrode pad EP3 is provided in the first guard ring 11c.

Furthermore, the first guard ring 11a, the first guard ring 11b, and the first guard ring 11c are not used as wiring, but are dummy wiring for preventing or reducing the infiltration of the moisture. In the first guard ring 11a, the first guard ring 11b, and the first guard ring 11c, for example, four layers of dummy wirings are superimposed. In addition, the first guard ring 11a, the first guard ring 11b, and the first guard ring 11c are connected to each other by wiring in which a via layer is formed between the dummy wirings of each of the layers, or the like, and the dummy wiring of the uppermost layer to the dummy wiring of the lowermost layer are continuous.

FIG. 4C illustrates the enlarged diagram of a region R1 of FIG. 4A. In this example, the first semiconductor substrate 10 is broadly divided into layers L1 to L4. The layer L1, for example, includes a substrate containing silicon or the like, and a semiconductor element (not illustrated) or the like, such as a transistor or a photodiode, is formed in the substrate.

A contact CN1 is mainly formed on the layer L2. The contact CN1 electrically connects the semiconductor element formed on the layer L1 and wiring formed on the layer L3, together.

A plurality of wiring layers, and a via layer (including a via) for electrically connecting the wirings together, are formed on the layer L3. In this example, four dummy wiring layers (a wiring layer WR1, a wiring layer WR2, a wiring layer WR3, and a wiring layer WR4) are formed on the layer L3. Furthermore, the number of wiring layers can be set to an arbitrary number of greater than or equal to 1. The dummy wiring and the via, for example, contain copper (Cu), and for example, a barrier metal such as tantalum (Ta) or tantalum nitride (Tan), is formed on the circumference of Cu.

The electrode pad EP1 is formed on the layer L4. The electrode pad EP1, for example, contains aluminum (Al), and for example, a barrier metal such as titanium (Ti) or tungsten (W), is formed on the circumference of aluminum.

The first guard ring 11a includes the contact of the layer L2, and the dummy wiring layer of the layer L3. In addition, the interlayer insulating film 71 for insulating each of the layers, is formed on the layers L2 to L4. The interlayer insulating film 71, for example, contains silicon dioxide (SiO$_2$), silicon nitride (SiN), or the like.

The second semiconductor substrate 20 illustrated in FIGS. 5A to 5C, includes the second guard ring 21a, dummy wiring DW1, a dummy pad DPP, dummy wiring DW2, the power source pad 40, the power source pad 41, the power source pad 41a, wiring 60c, wiring 60d, an insulating film 61b, a wiring layer 62b, and the interlayer insulating film 70. The second guard ring 21a is formed by dummy wiring instead of connection wiring. With this arrangement, the second guard ring 21a is capable of preventing or reducing an inner crack or chipping.

FIG. 5C illustrates the enlarged diagram of the region R2 of FIG. 5A. In this example, as with the first semiconductor substrate 10, the second semiconductor substrate 20 is broadly divided into the layers L1 to L4. The layer L1, for example, includes the substrate containing silicon or the like, and the semiconductor element (not illustrated) or the like, such as a transistor or a photodiode, is formed in the substrate.

A contact CN2 is mainly formed on the layer L2. The contact CN2 electrically connects the semiconductor element formed on the layer L1 and the wiring formed on the layer L3, together.

The plurality of wiring layers, and the via layer (including the via) for electrically connecting the wirings together, are formed on the layer L3. In this example, two dummy wiring layers (a wiring layer WR11 and a wiring layer WR22), and global wiring GW are formed on the layer L3. The global wiring GW is wiring for connection with respect to the other circuit (not illustrated). Furthermore, the number of wiring layers can be set to an arbitrary number of greater than or equal to 1. The dummy wiring and the via, for example, contain copper (Cu), and for example, the barrier metal such as tantalum (Ta) or tantalum nitride (Tan), is formed on the circumference of Cu.

The power source pad 41a is formed on the layer L4. The power source pad 41a, for example, contains aluminum (Al), and for example, the barrier metal such as titanium (Ti) or tungsten (W), is formed on the circumference of aluminum.

The second guard ring 21a includes the contact of the layer L2, two layers of dummy wirings (WR11, WR22) of the layer L3, and the global wiring GW. In addition, the interlayer insulating film 70 for insulating each of the layers is formed on the layers L2 to L4. The interlayer insulating film 70, for example, contains silicon dioxide (SiO$_2$), silicon nitride (SiN), or the like.

Furthermore, hereinafter, appropriately, reference numerals will not be applied to the dummy wiring DW1, the dummy wiring DW2, and the dummy pad DPP, and the description thereof will be omitted.

In the first semiconductor substrate 10 and the second semiconductor substrate 20, for example, a metal film such as aluminum (Al), copper (Cu), and tungsten (W), can be applied as the material of the wiring layer 62 (the wiring layer 62a and the wiring layer 62b), but the material is not particularly limited thereto. In addition, in the first semiconductor substrate and the second semiconductor substrate 20, all of the wiring layers 62 (the wiring layer 62a and the wiring layer 62b) are formed such that the circumference of the semiconductor device is covered with the first guard ring 11 and the second guard ring 21 into the shape of a ring, in order to prevent or reduce the degradation of the wiring 60 (the wiring 60a, the wiring the wiring 60c, and the wiring 60d) due to the infiltration of the moisture from the power source pad 41 positioned on the wiring layer 62b or the end portion of the semiconductor device. Furthermore, the first guard ring 11 and the second guard ring 21 are not limited to the shape of a ring, but may be partially discontinuous.

In addition, for example, the first semiconductor substrate 10 may include a receiving element, and the second semiconductor substrate 20 may include an MOS transistor, a diffusion layer, or the like, performing signal processing as an integrated circuit.

Figure 6A:
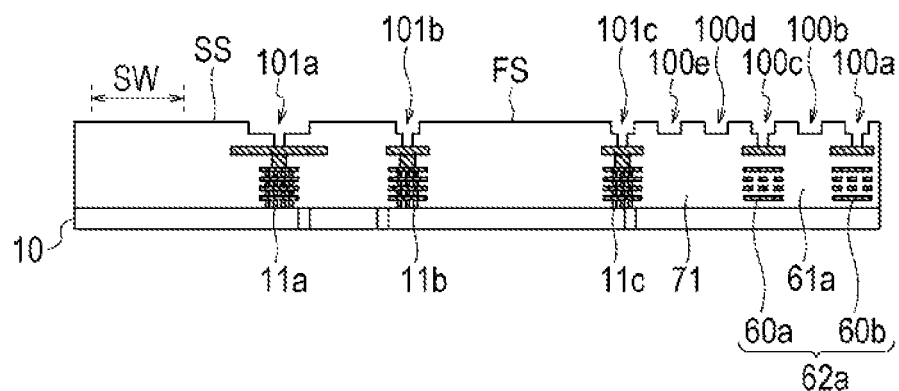
FIGS. 6A and 6B are (third) explanatory diagrams illustrating an example of the manufacturing method of the semiconductor device of the second embodiment to which the present technology is applied.
Figure 6B:
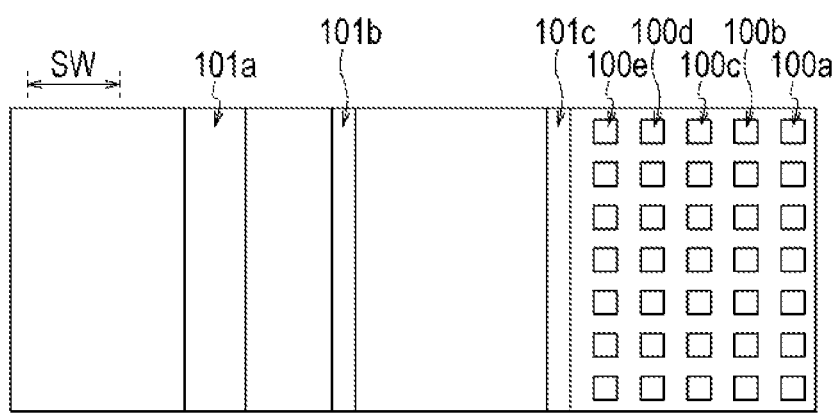

Next, as illustrated in FIGS. 6A and 6B, a connection pad 100a, a connection pad 100b, a connection pad 100c, a connection pad 100d, and a connection pad 100e, of copper (Cu), are formed, and a first guard ring portion 101a, a first guard ring portion 101b, and a first guard ring portion 101c are formed, on the first semiconductor substrate 10.

Furthermore, the connection pad 100a, the connection pad 100b, the connection pad 100c, the connection pad 100d, and the connection pad 100e may form a via in the interlayer portion of the interlayer insulating film 71.

In addition, the first guard ring portion 101a, the first guard ring portion 101b, and the first guard ring portion 101c are respectively formed into the shape of a groove, but for example, may have a structure in which a plurality of vias are arranged. In addition, the first guard ring portion 101b and the first guard ring portion 101c are configured as a separate member, but are not limited thereto, and for example, may form an approximately square shape in the plan view of FIG. 6B, as one member.

Figure 7A:
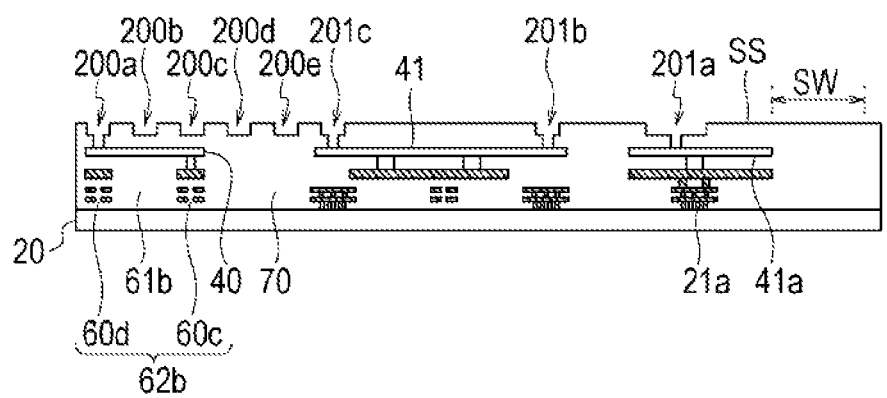
FIGS. 7A and 7B are (fourth) explanatory diagrams illustrating an example of the manufacturing method of the semiconductor device of the second embodiment to which the present technology is applied.
Figure 7B:
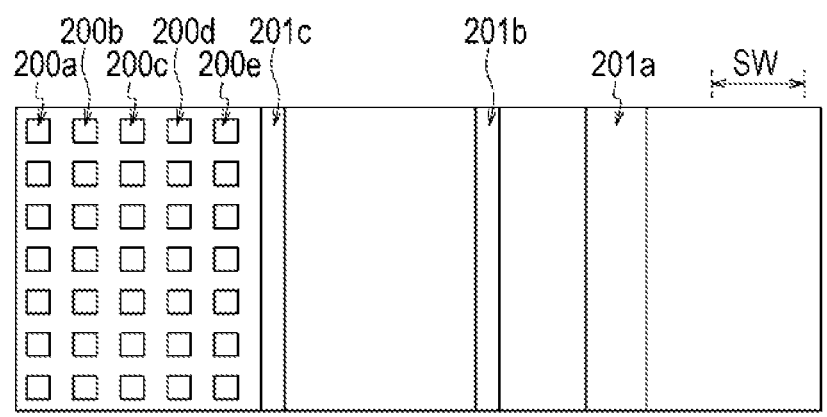

In addition, as illustrated in FIGS. 7A and 7B, a connection pad 200a, a connection pad 200b, a connection pad 200c, a connection pad 200d, and a connection pad 200e, of copper (Cu), are formed, and a second guard ring portion 201a, a second guard ring portion 201b, and a second guard ring portion 201c are formed, on the second semiconductor substrate 20.

Furthermore, the connection pad 200a, the connection pad 200b, the connection pad 200c, the connection pad 200d, and the connection pad 200e may form a via in the interlayer portion of the interlayer insulating film 70.

In addition, the second guard ring portion 201a, the second guard ring portion 201b, and the second guard ring portion 201c are respectively formed into the shape of a groove, but for example, may have a structure in which a plurality of vias are arranged. In addition, the second guard ring portion 201b and the second guard ring portion 201c are configured as a separate member, but are not limited thereto, and for example, may form an approximately square shape in the plan view of FIG. 7B, as one member.

Figure 8A:
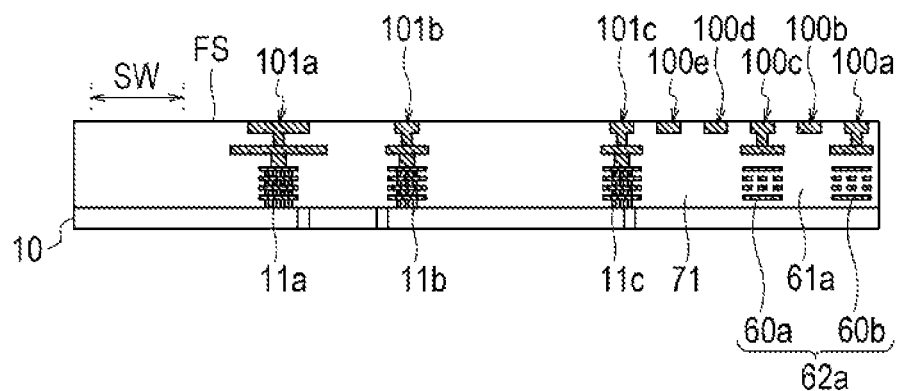
FIGS. 8A and 8B are (fifth) explanatory diagrams illustrating an example of the manufacturing method of the semiconductor device of the second embodiment to which the present technology is applied.
Figure 8B:
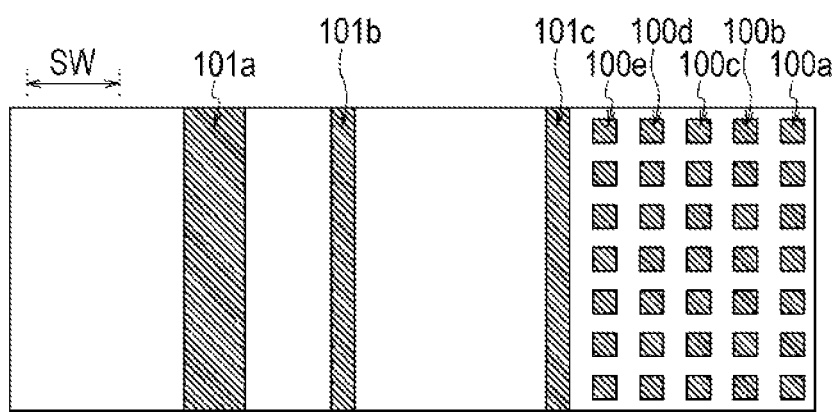

Next, as illustrated in FIGS. 8A and 8B, the connection pad 100a, the connection pad 100b, the connection pad 100c, the connection pad 100d, the connection pad 100e, the first guard ring portion 101a, the first guard ring portion 101b, and the first guard ring portion 101c of the first semiconductor substrate 10, are covered with a barrier metal material and a metal film.

Then, flattening is performed according to flattening chemical mechanical polishing (CMP), and the excess portion is removed. It is preferable that the barrier metal material, for example, is tantalum (Ta), tantalum nitride (TaN), titanium (Ti), titanium nitride (TiN), or the like, and two or more types of materials can be used by being mixed. Here, copper (Cu) is used as the metal film, but the metal film is not limited to copper (Cu), and for example, an alloy material (manganese bronze (CuMn), magnesium bronze (CuMg), and aluminum bronze (CuAl), or the like can be used.

Figure 9A:
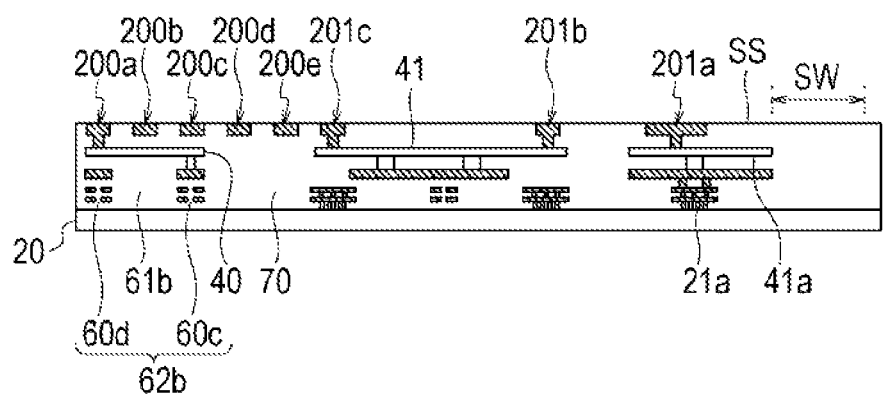
FIGS. 9A and 9B are (sixth) explanatory diagrams illustrating an example of the manufacturing method of the semiconductor device of the second embodiment to which the present technology is applied.
Figure 9B:
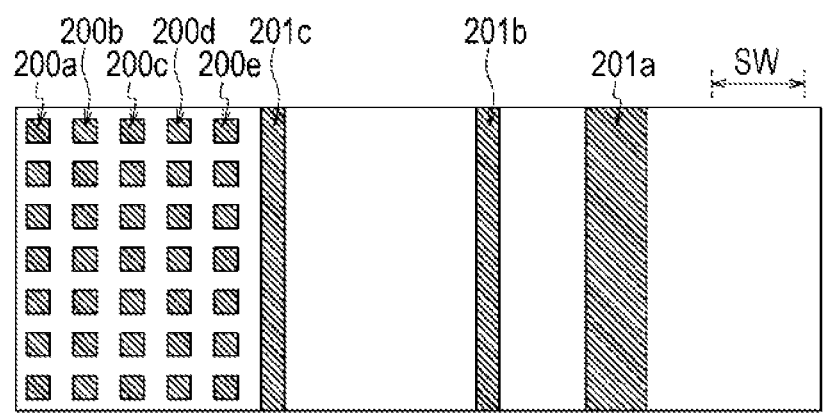

Similarly, as illustrated in FIGS. 9A and 9B, the connection pad 200a, the connection pad 200b, the connection pad 200c, the connection pad 200d, the connection pad 200e, the second guard ring portion 201a, the second guard ring portion 201b, and the second guard ring portion 201c of the second semiconductor substrate 20, are covered with a barrier metal material and a metal film.

Then, flattening is performed according to the flattening chemical mechanical polishing (CMP), and the excess portion is removed. It is preferable that the barrier metal material, for example, is tantalum (Ta), tantalum nitride (TaN), titanium (Ti), titanium nitride (TiN), or the like, and two or more types of materials can be used by being mixed. Here, copper (Cu) is used as the metal film, but the metal film is not limited to copper (Cu), and for example, an alloy material (manganese bronze (CuMn), magnesium bronze (CuMg), and aluminum bronze (CuAl), or the like can be used.

Figure 10A:
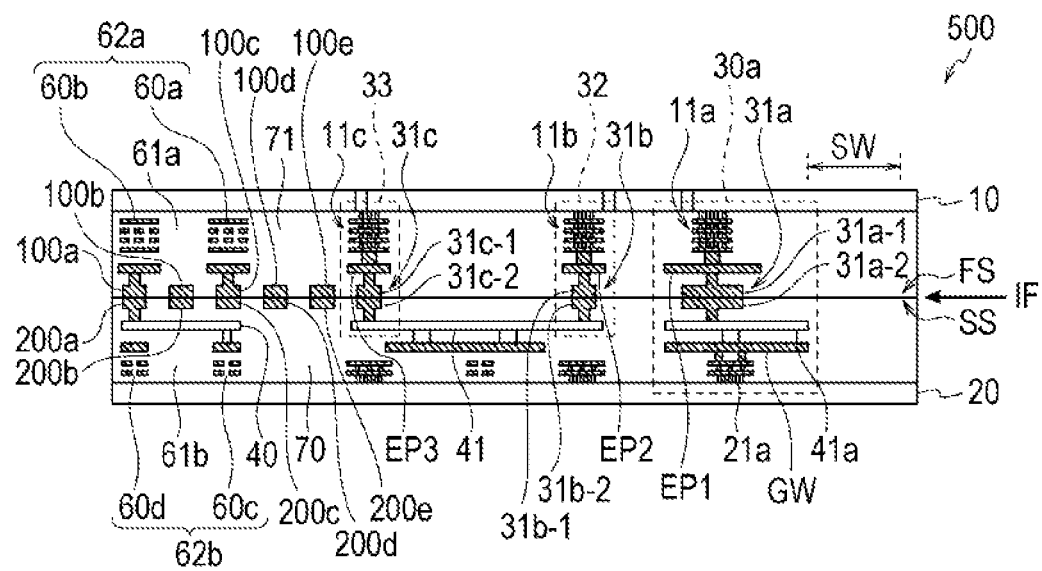
FIGS. 10A and 10B are (seventh) explanatory diagrams illustrating an example of the manufacturing method of the semiconductor device of the second embodiment to which the present technology is applied.
Figure 10B:
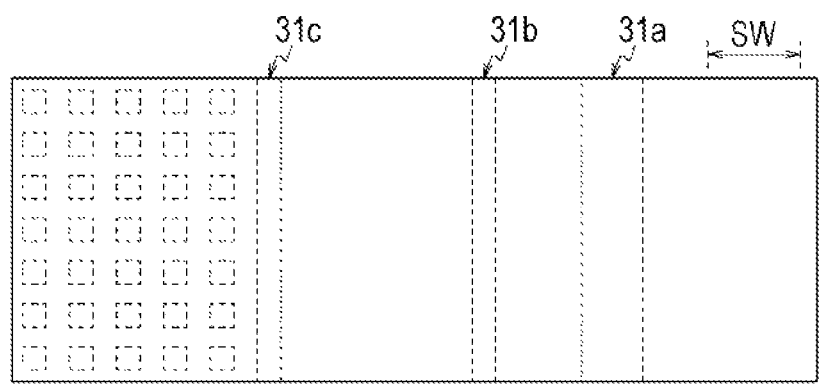

Next, as illustrated in FIGS. 10A and 10B, the first semiconductor substrate 10 illustrated in FIGS. 8A and 8B is reversed on the second semiconductor substrate 20 illustrated in FIGS. 9A and 9B, and the first semiconductor substrate 10 and the second semiconductor substrate 20 are joined together. With this arrangement, a semiconductor device 500 is generated. In the first semiconductor substrate 10 and the second semiconductor substrate 20, as necessary, the substrate may be thinned, or may be peeled off.

Here, the first semiconductor substrate 10 and the second semiconductor substrate 20 are joined together, and thus, the first guard ring portion 101a, the first guard ring portion 101b, and the first guard ring portion 101c, formed on the first semiconductor substrate 10, and the second guard ring portion 201a, the second guard ring portion 201b, and the second guard ring portion 201c, formed on the second semiconductor substrate 20, are joined together. With this arrangement, the third guard ring 31a, the third guard ring 31b, and the third guard ring 31c are formed.

Specifically, the third guard ring 31a includes the first guard ring portion 101a (31a-1) and the second guard ring portion 201a (31a-2). The third guard ring 31b includes the first guard ring portion 101b (31b-1) and the second guard ring portion 201b (31b-2). The third guard ring 31c includes the first guard ring portion 101c (31c-1) and the second guard ring portion 201c (31c-2).

With this arrangement, the third guard ring 31a is connected to the power source pad 41a, and thus, electrical connection (conductive connection) can be performed. The third guard ring 31b is connected to the power source pad 41, and thus, electrical connection (conductive connection) can be performed. The third guard ring 31c is connected to the power source pad 41, and thus, electrical connection (conductive connection) can be performed.

In addition, the connection pad 100a, the connection pad 100b, the connection pad 100c, the connection pad 100d, and the connection pad 100e of the first semiconductor substrate 10, and the connection pad 200a, the connection pad 200b, the connection pad 200c, the connection pad 200d, and the connection pad 200e of the second semiconductor substrate 20, are connected to each other.

With this arrangement, the first guard ring unit 30a includes the first guard ring 11a, the electrode pad EP1, the third guard ring 31a (31a-1 and 31a-2), the power source pad 41a, the global wiring GW, and the second guard ring 21a. The second guard ring unit 32 includes the first guard ring 11b, the electrode pad EP2, the third guard ring 31b (31b-1 and 31b-2), and the power source pad 41. The third guard ring unit 33 includes the first guard ring 11c, the electrode pad EP3, the third guard ring 31c (31c-1 and 31c-2), and the power source pad 41.

Figure 11A:
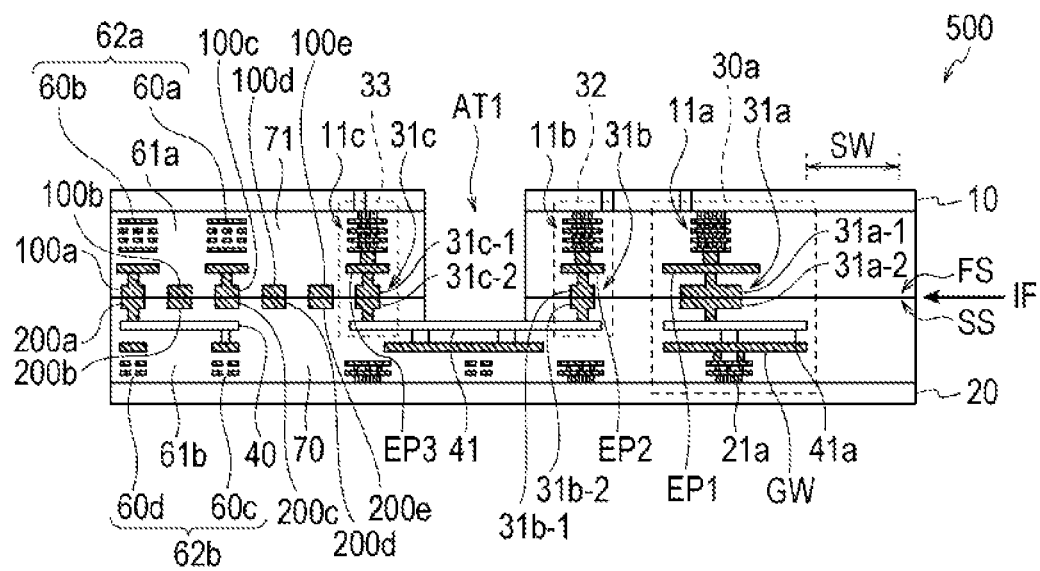
FIGS. 11A and 11B are (eighth) explanatory diagrams illustrating an example of the manufacturing method of the semiconductor device of the second embodiment to which the present technology is applied.
Figure 11B:
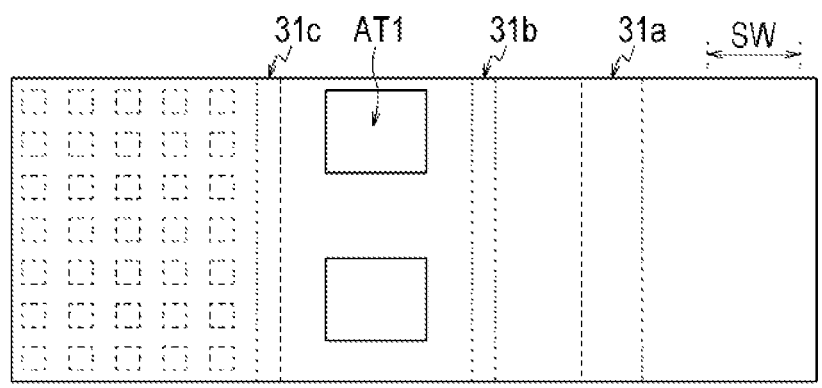

Next, as illustrated in FIGS. 11A and 11B, in the generated semiconductor device 500, the first semiconductor substrate 10 is penetrated by using a general lithography technology, a dry etching technology, or the like, and thus, an opening portion AT1 opening to the power source pad 41, is formed.

Here, the opening portion AT1 is formed, and thus, the moisture easily infiltrates from the outside, but the second guard ring unit 32 and the third guard ring unit 33 include a metal film (a metal). Further, the second guard ring unit 32 and the third guard ring unit 33 cover the wiring layer 62 (the wiring layer 62a and the wiring layer 62b) of the semiconductor device 500.

With this arrangement, the semiconductor device 500 is capable of preventing or reducing the infiltration of the moisture by the second guard ring unit 32 and the third guard ring unit 33. Therefore, it is possible to prevent or reduce the corrosion of the connection pad 100a, the connection pad 100b, the connection pad 100c, the connection pad 100d, the connection pad 100e, the connection pad 200a, the connection pad 200b, the connection pad 200c, the connection pad 200d, the connection pad 200e, the wiring layer 62a, and the wiring layer 62b, on the junction interface IF.

In addition, the first guard ring unit 30a, the second guard ring unit 32, and the third guard ring unit 33 are formed to surround at least a part of the circumference of the semiconductor device 500. Specifically, the first guard ring unit 30a, the second guard ring unit 32, and the third guard ring unit 33 are provided inside a scribe line. In this case, in the semiconductor device 500, the first guard ring unit 30a, the second guard ring unit 32, and the third guard ring unit 33 can be formed in three portions, and thus, it is possible to increase the reliability of the quality of the semiconductor device 500.

Furthermore, in FIGS. 11A and 11B, the second guard ring unit 32 and the third guard ring unit 33 are (consecutively) formed into the shape of a ring, but are not necessarily formed into the shape of a ring, and for example, the second guard ring unit 32 and the third guard ring unit 33 may be partially formed.

Figure 12A:
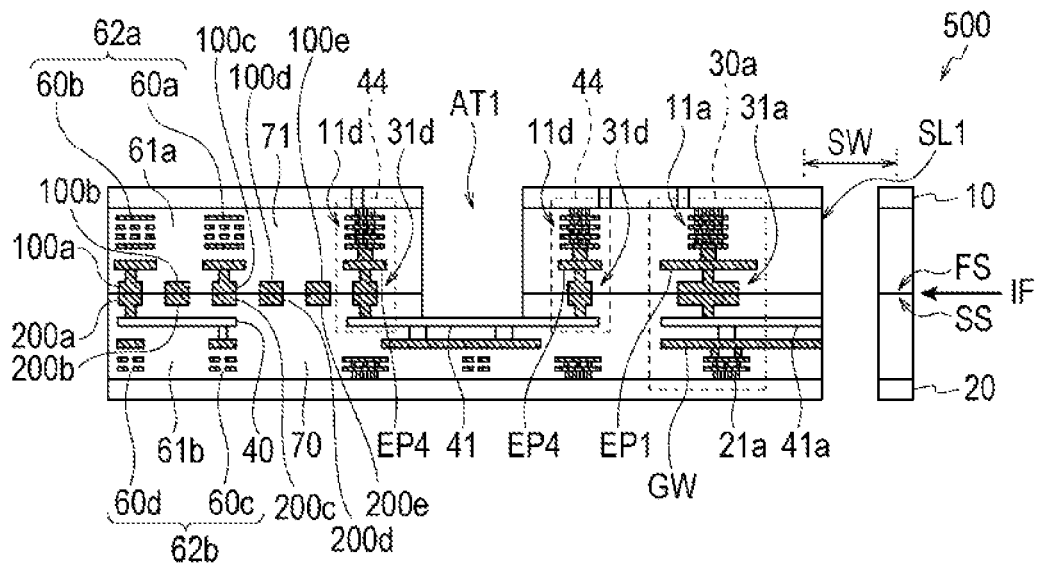
FIGS. 12A and 12B are (ninth) explanatory diagrams illustrating an example of the manufacturing method of the semiconductor device of the second embodiment to which the present technology is applied.
Figure 12B:
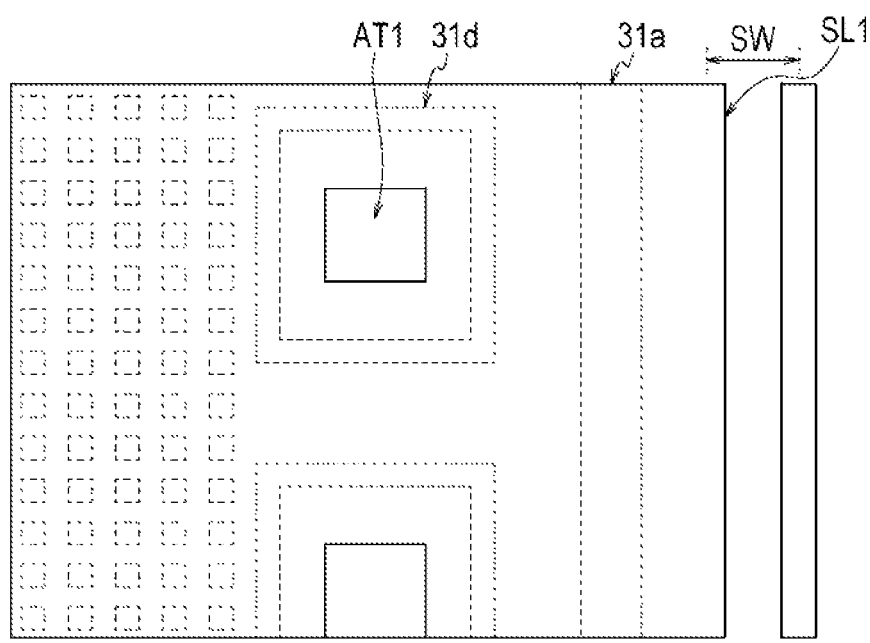

Next, as illustrated in FIGS. 12A and 12B, in the semiconductor device 500, a scribe line width SW (a dicing area) is diced with the dicing blade DB, and thus, is diced for each semiconductor device. In this case, in the semiconductor device 500, the moisture easily infiltrates from the end surface of a scribe line SL1. However, the first guard ring unit 30a is formed to surround at least a part of the circumference of the semiconductor device 500, and is provided inside the scribe line SL1, and the third guard ring 31a is consecutively formed. With this arrangement, the semiconductor device 500 is capable of preventing or reducing the infiltration of the moisture from the end surfaces of the first semiconductor substrate 10 and the second semiconductor substrate 20 or the junction interface IF between the first semiconductor substrate 10 and the second semiconductor substrate 20.

In addition, the fourth guard ring unit 44 is provided to surround the opening portion AT1 of the power source pad 41 formed at least a part of the circumference of the semiconductor device 500. The fourth guard ring unit 44 includes the first guard ring 11d, an electrode pad EP4, the third guard ring 31d, and the power source pad 41. In this case, the first guard ring 11d is provided to surround the opening portion AT1 of the power source pad 41. The third guard ring 31d is also provided to surround the opening portion AT1 of the power source pad 41. In addition, the electrode pad EP4 is also provided to surround the opening portion AT1 of the power source pad 41. For this reason, the semiconductor device 500 is capable of preventing or reducing the infiltration of the moisture from the opening portion AT1, and thus, it is possible to prevent or reduce the corrosion in the semiconductor device 500. Furthermore, the opening portion AT1 of the power source pad 41 surrounded by the fourth guard ring unit 44 is not limited to one.

Figure 13A:
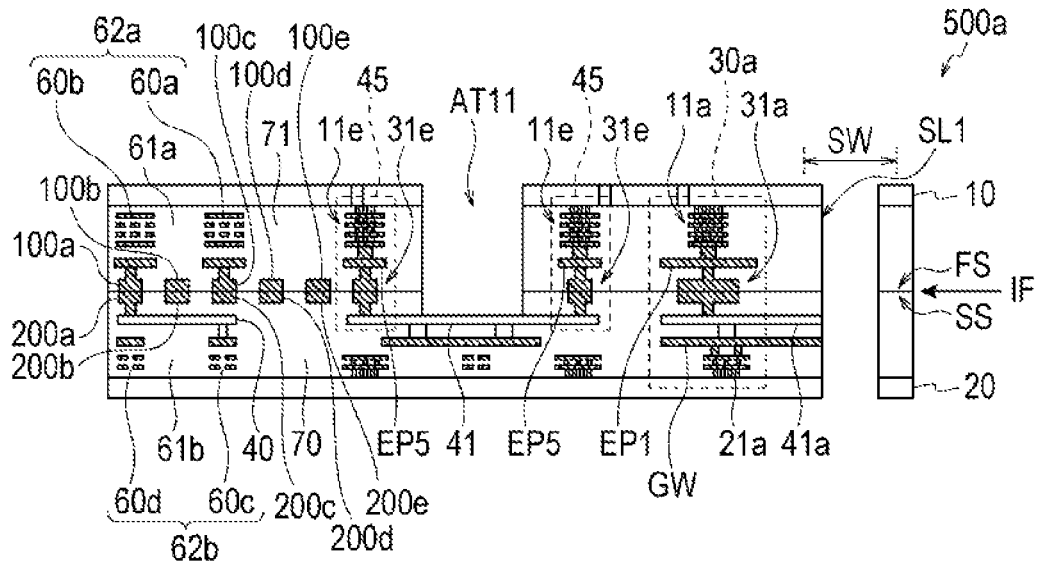
FIGS. 13A and 13B are (tenth) explanatory diagrams illustrating an example of the manufacturing method of the semiconductor device of the second embodiment to which the present technology is applied.
Figure 13B:
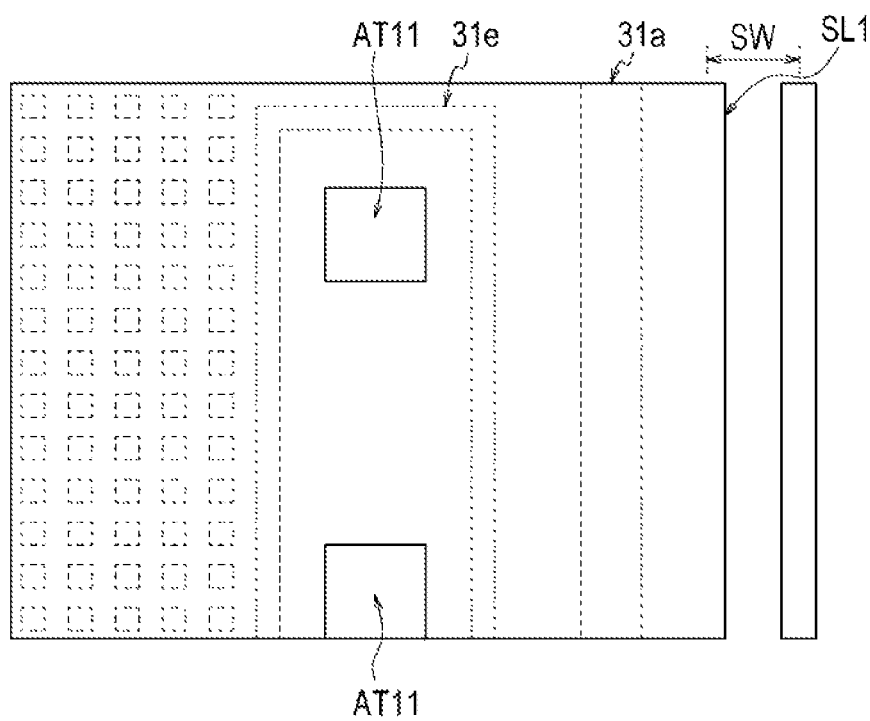

As illustrated in FIGS. 13A and 13B, the fifth guard ring unit 45 is provided to surround the opening portion AT11 of a plurality of power source pads formed at least a part of the circumference of a semiconductor device 500a. The fifth guard ring unit 45 includes the first guard ring 11e, an electrode pad EP5, the third guard ring 31e, and the power source pad 41. In this case, the first guard ring 11e is provided to surround a plurality of opening portions AT11. The third guard ring 31e is also provided to surround the plurality of opening portions AT11. In addition, the electrode pad EP5 is also provided to surround the plurality of opening portions AT11.

For this reason, the semiconductor device 500a is capable of preventing or reducing the infiltration of the moisture from the plurality of opening portions AT11, and thus, it is possible to prevent or reduce the corrosion in the semiconductor device 500a. Furthermore, the opening portion AT11 is formed in each power source pad, but is not limited thereto.

Thus, the semiconductor device 1 of the first embodiment according to the present technology can be manufactured according to the first example of the manufacturing method of the semiconductor device 1 of the second embodiment.

In addition, in the manufacturing method of the semiconductor device 1 of the second embodiment according to the present technology, the third guard ring 31a, the third guard ring 31b, the third guard ring 31c, the third guard ring 31d, and the third guard ring 31e are electrically connected (conductively connected) to the power source pad 41 and the power source pad 41a, but are not limited thereto.

Figure 14A:
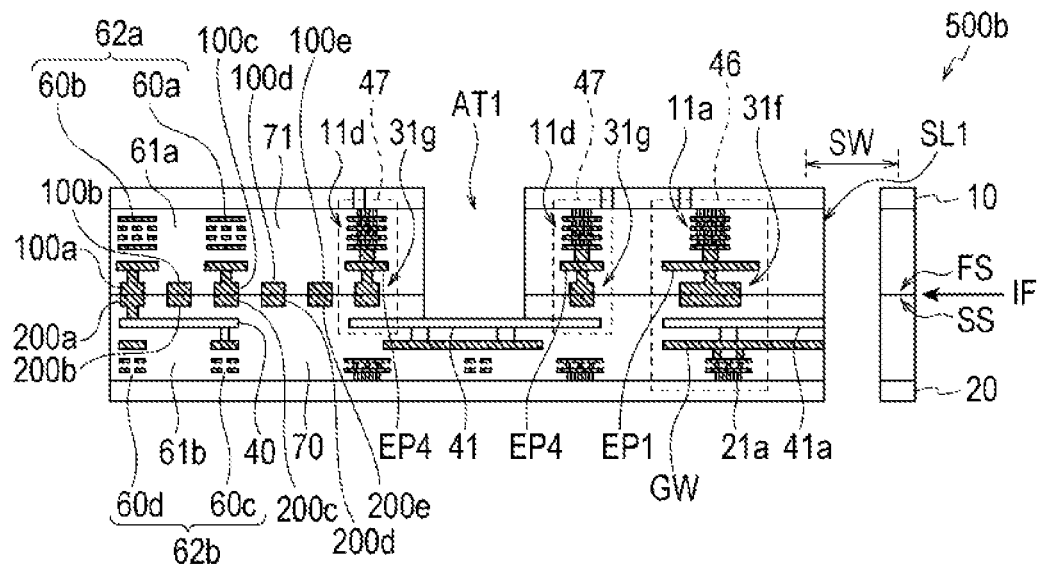
FIGS. 14A and 14B are (first) explanatory diagrams illustrating a case where a third guard ring is not conductively connected to a power source pad, in a semiconductor device manufactured by the manufacturing method of the semiconductor device of the second embodiment.
Figure 14B:
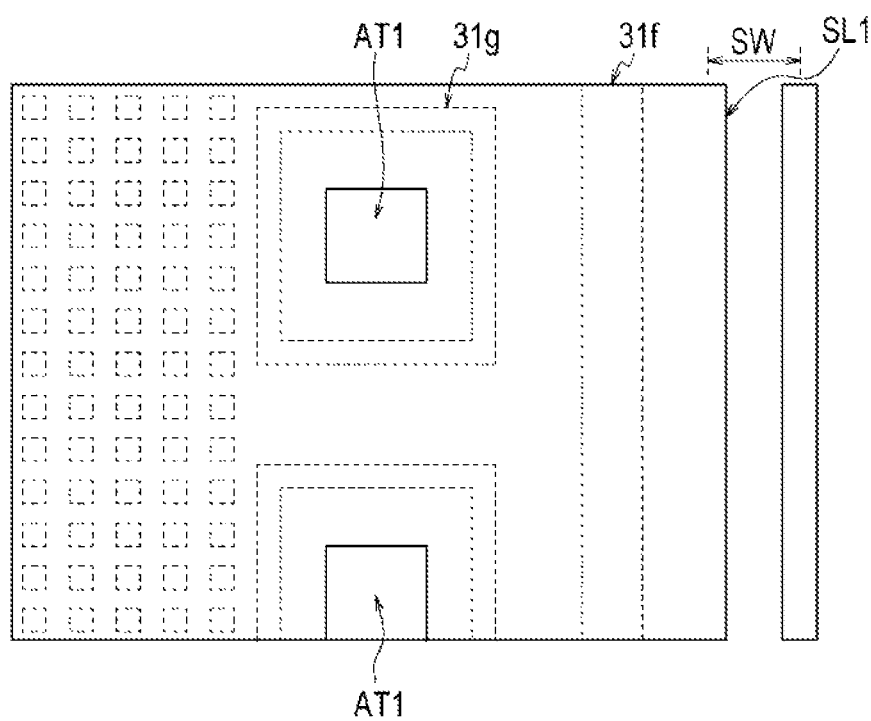

FIGS. 14A and 14B are explanatory diagrams illustrating a case where the third guard ring 31f and the third guard ring 31g are not conductively connected to the power source pad 41 and the power source pad 41a, in the semiconductor device 500b manufactured by the manufacturing method of the semiconductor device of the second embodiment according to the present technology.

As illustrated in FIGS. 14A and 14B, the third guard ring 31f and the third guard ring 31g are not connected to the power source pad 41 and the power source pad 41a. In this case, the third guard ring 31f is not conductively connected to the power source pad 41a, and the third guard ring 31g is not conductively connected to the power source pad 41.

In this case, the sixth guard ring unit 46 includes the first guard ring 11a, the electrode pad EP1, the third guard ring 31f, the power source pad 41a, the global wiring GW, and the second guard ring 21a. A seventh guard ring unit 47 includes the first guard ring 11d, the electrode pad EP4, the third guard ring 31g, and the power source pad 41. Next, an example in which the third guard ring 31 is formed in a position separated from the power source pad 41, is illustrated in FIGS. 15A and 15B.

Figure 15A:
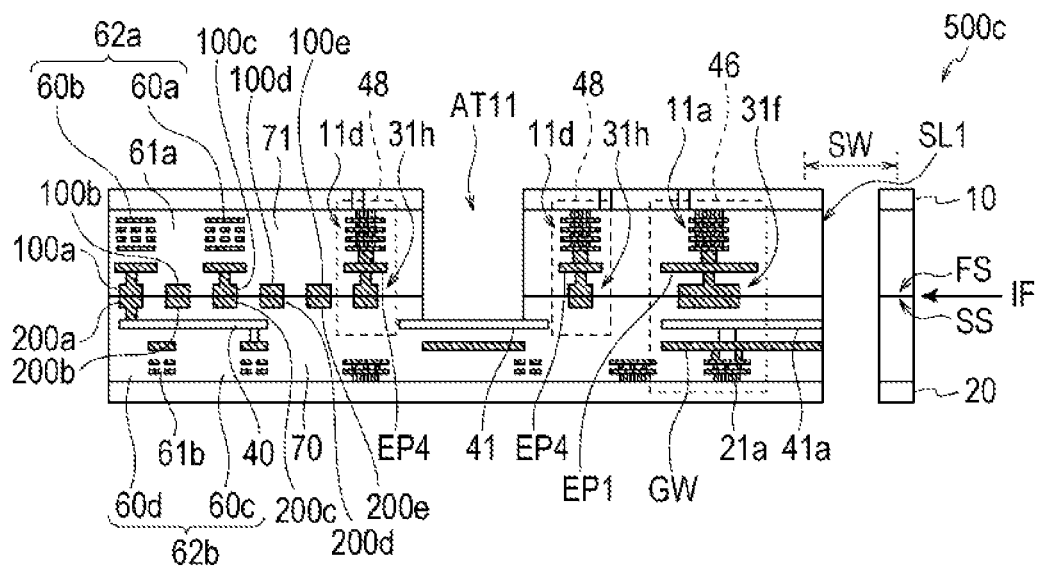
FIGS. 15A and 15B are (second) explanatory diagrams illustrating a case where the third guard ring is not conductively connected to the power source pad, in the semiconductor device manufactured by the manufacturing method of the semiconductor device of the second embodiment.
Figure 15B:
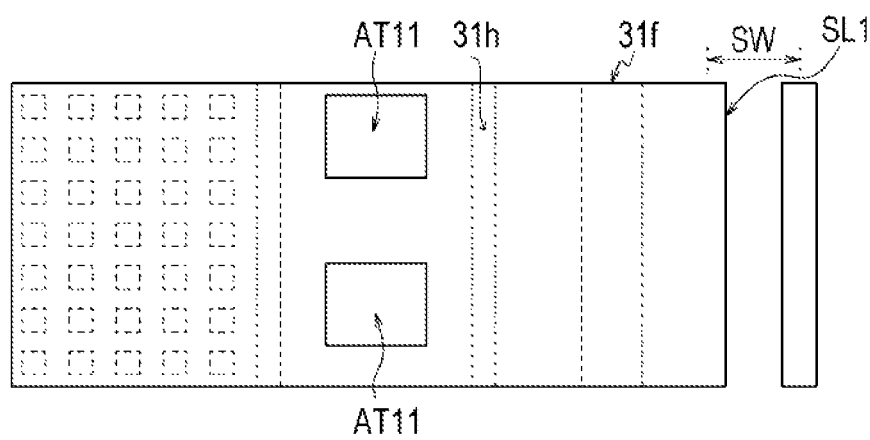

FIGS. 15A and 15B are explanatory diagrams illustrating a case where a third guard ring 31h is not conductively connected to the power source pad 41, in the semiconductor device manufactured by the manufacturing method of the semiconductor device of the second embodiment according to the present technology.

As illustrated in FIGS. 15A and 15B, the third guard ring 31h is formed in the position separated from the power source pad 41, and is not conductively connected to the power source pad 41. Thus, in a case where the third guard ring 31h is not conductively connected in advance to the power source pad 41, it is not necessary that the third guard ring 31h is formed close to the power source pad 41, and it is possible to form the third guard ring 31h in the position separated from the power source pad 41.

Furthermore, in this case, an eighth guard ring unit 48 includes the first guard ring 11d, the electrode pad EP4, and the third guard ring 31h. In addition, in FIGS. 15A and 15B, the plurality of opening portions AT11 are formed in the power source pad 41, and the plurality of opening portions AT11 are surrounded by the eighth guard ring unit 48. In this case, the eighth guard ring unit 48 is capable of applying a desired surrounding method to the plurality of opening portions AT11. For example, the first guard ring 11d is provided to surround the plurality of opening portions AT11, and the electrode pad EP4 or the third guard ring 31h is also provided to surround the plurality of opening portions AT11.

Thus, the third guard ring 31f, the third guard ring 31g, and the third guard ring 31h, for example, are not connected to the power source pad 41 and the power source pad 41a, and thus, it is possible to avoid the conductive connection of the sixth guard ring unit 46, the seventh guard ring unit 47, and the eighth guard ring unit 48.

4. Third Embodiment (Second Example of Semiconductor Device)

A semiconductor device of a third embodiment according to the present technology, is a semiconductor device in which the guard ring unit is provided inside the scribe line that is formed to surround at least a part of the circumference of the semiconductor device, and the third guard ring is inconsecutively formed, in the semiconductor device of the first embodiment. In this case, the third guard ring, for example, can be formed in the direction of the scribe line at a predetermined interval, along the scribe line.

According to the semiconductor device of the third embodiment of the present technology, it is possible to improve the reliability of the quality of the semiconductor device, on the junction surface of the Cu—Cu junction.

FIG. 16A to FIG. 19B illustrate a semiconductor device that is an example of the semiconductor device of the third embodiment according to the present technology. A in each of the drawings, illustrates the sectional view of the semiconductor device, and B in each of the drawings, illustrates the plan view of the semiconductor device.

Figure 16A:
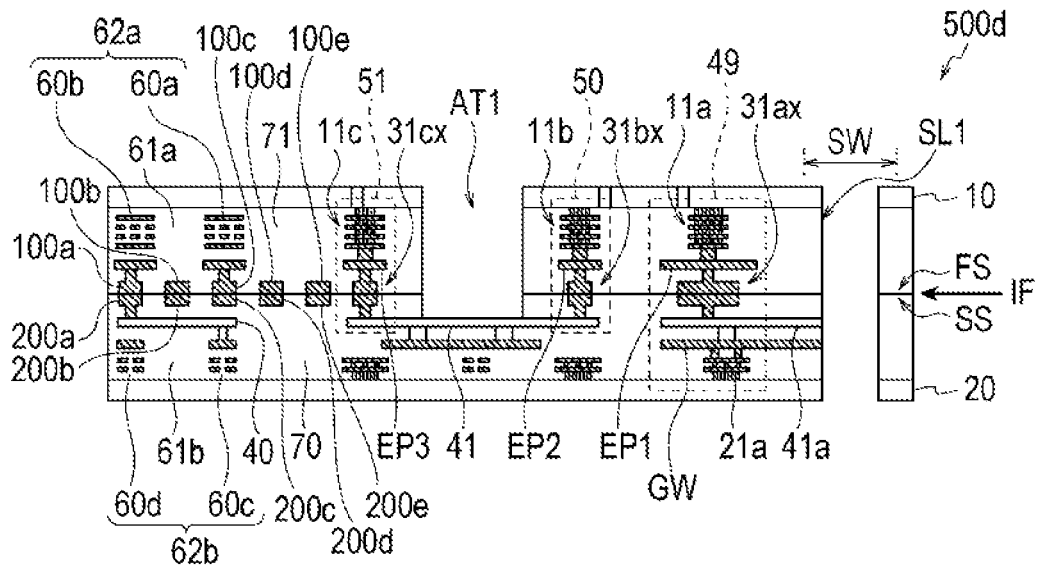
FIGS. 16A and 16B are (first) explanatory diagrams illustrating a semiconductor device that is an example of a semiconductor device of a third embodiment according to the present technology.
Figure 16B:
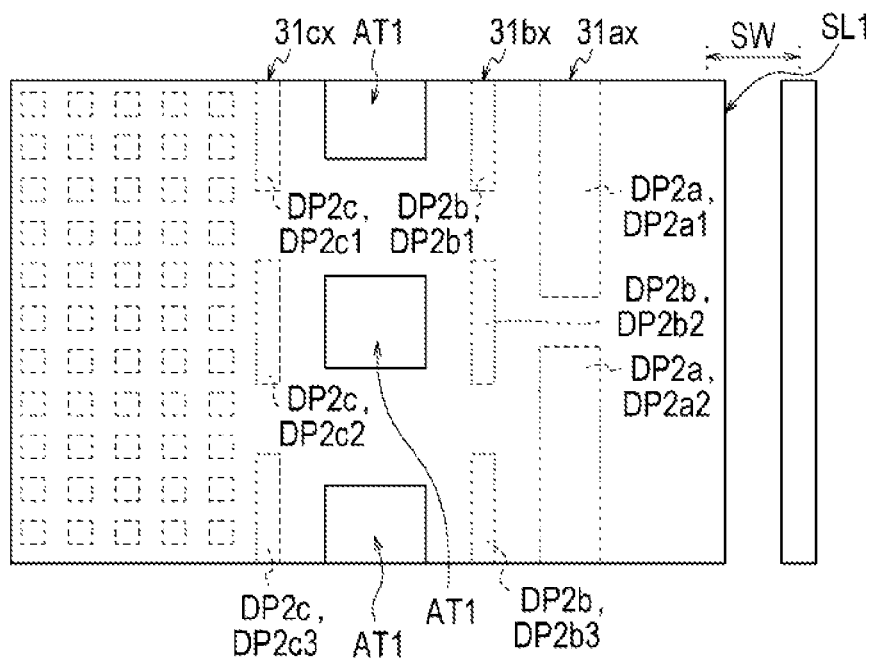

As illustrated in FIGS. 16A and 16B, a semiconductor device 500d of the third embodiment according to the present technology is different from the semiconductor device of the first embodiment, in that a third guard ring 31ax, a third guard ring 31bx, and a third guard ring 31cx are provided inside the scribe line SL1 that is formed to surround at least a part of the circumference of the semiconductor device 500d, and are inconsecutively formed. Furthermore, discontinuity indicates that the third guard ring 31 includes a plurality of second Cu dummies, and for example, each of the Cu dummies is formed into the shape of an island. Furthermore, in this case, the second Cu dummy is formed to prevent or reduce an inner crack or chipping.

As illustrated in FIGS. 16A and 16B, the third guard ring 31ax, the third guard ring 31bx, and the third guard ring 31cx are inconsecutively formed on the junction interface IF. Specifically, the third guard ring 31ax includes a plurality of second Cu dummies DP2a (a second Cu dummy DP2a1 and a second Cu dummy DP2a2). The third guard ring 31bx includes a plurality of second Cu dummies DP2b (a second Cu dummy DP2b1, a second Cu dummy DP2b2, and a second Cu dummy DP2b3). The third guard ring 31cx includes a plurality of second Cu dummies DP2c (a second Cu dummy DP2c1, a second Cu dummy DP2c2, and a second Cu dummy DP2c3).

In this case, a ninth guard ring unit 49 includes the first guard ring 11a, the electrode pad EP1, the third guard ring 31ax, the power source pad 41a, the global wiring GW, and the second guard ring 21a. A tenth guard ring unit 50 includes the first guard ring 11b, the electrode pad EP2, the third guard ring 31bx, and the power source pad 41. An eleventh guard ring unit 51 includes the first guard ring 11c, the electrode pad EP3, the third guard ring 31cx, and the power source pad 41.

The third guard ring 31ax, the third guard ring 31bx, and the third guard ring 31cx are formed in the direction of the scribe line at a predetermined interval (that is, discontinuously), on the junction interface IF, along the scribe line SL1. Further, the third guard ring 31ax is arranged on the junction interface IF such that the position of the end portion is close to the third guard ring 31bx. Thus, the third guard ring 31ax, the third guard ring 31bx, and the third guard ring 31cx can be formed in a desired position in order to suppress the infiltration of the moisture with respect to the opening portion AT1 of the power source pad 41.

Figure 17A:
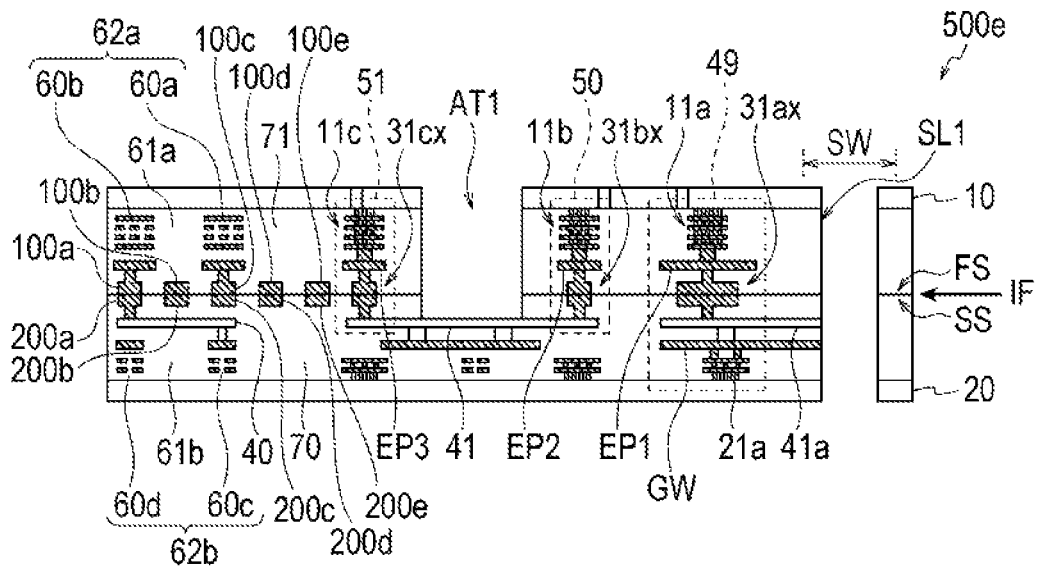
FIGS. 17A and 17B are (second) explanatory diagrams illustrating the semiconductor device that is an example of the semiconductor device of the third embodiment according to the present technology.
Figure 17B:
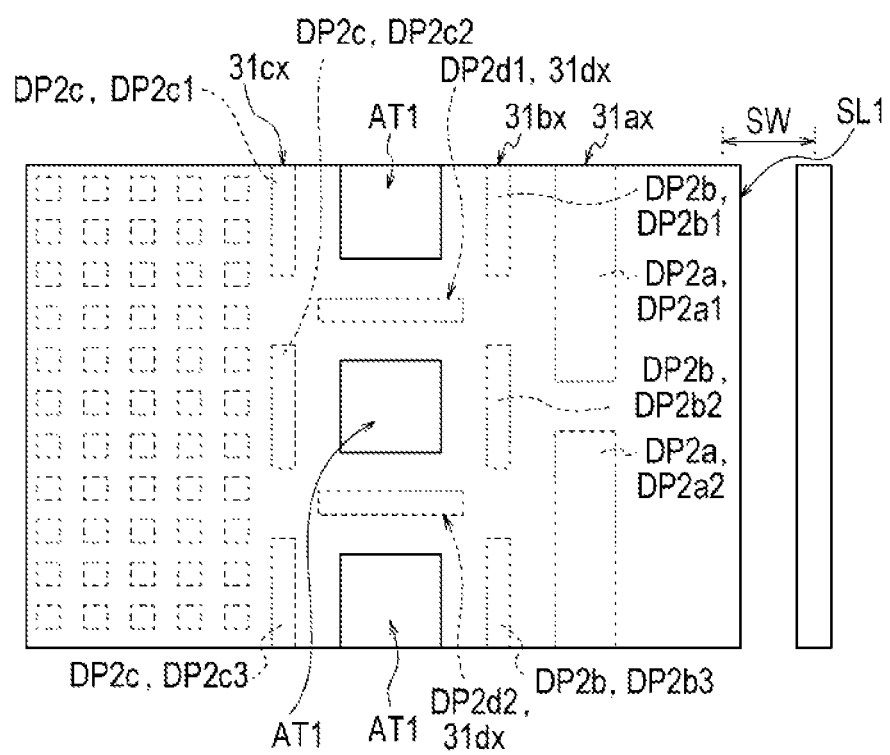

FIGS. 17A and 17B illustrate a semiconductor device 500e that is an example of the semiconductor device of the third embodiment according to the present technology. FIG. 17A illustrates the sectional view of the semiconductor device 500e, and FIG. 17B illustrates the plan view of the semiconductor device 500e.

As illustrated in FIGS. 17A and 17B, in the semiconductor device 500e of the third embodiment according to the present technology, a third guard ring 31dx is further inconsecutively formed on the junction interface IF, in addition to the semiconductor device 500d. In this case, the third guard ring 31dx includes a plurality of second Cu dummies (a second Cu dummy DP2d1 and a second Cu dummy DP2d2). Thus, the semiconductor device 500e of the third embodiment according to the present technology, further includes at least one third guard ring 31dx, and the third guard ring 31dx may be formed in a desired position where the infiltration of the moisture is suppressed with respect to the opening portion AT1 of the power source pad 41.

Figure 18A:
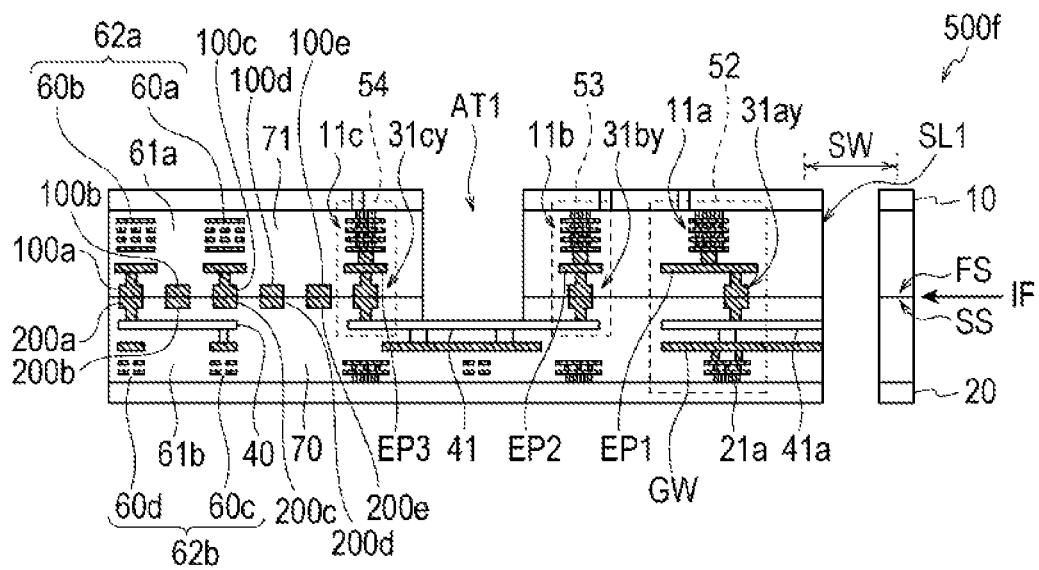
FIGS. 18A and 18B are (third) explanatory diagrams illustrating the semiconductor device that is an example of the semiconductor device of the third embodiment according to the present technology.
Figure 18B:
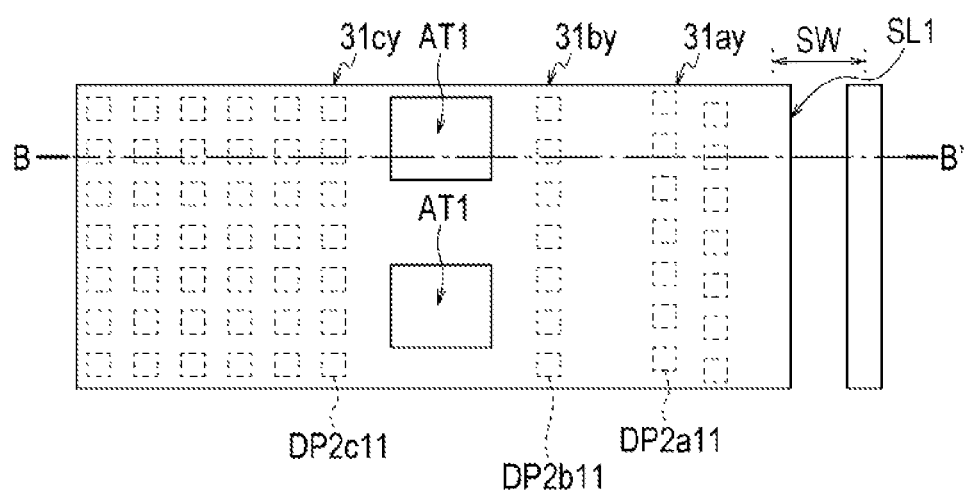

FIGS. 18A and 18B illustrate a semiconductor device 500f that is an example of the semiconductor device of the third embodiment according to the present technology. FIG. 18A illustrates the sectional view of the semiconductor device 500f, and FIG. 18B illustrates the plan view of the semiconductor device 500f. Furthermore, FIG. 18A illustrates a sectional surface cut long B-B' of FIG. 18B.

As illustrated in FIGS. 18A and 18B, in the semiconductor device 500f of the third embodiment according to the present technology, a third guard ring 3 lay, a third guard ring 31by, and a third guard ring 31cy are formed in the direction of the scribe line at a predetermined interval (discontinuously), along the scribe line SL1. In this case, the third guard ring 31ay includes a plurality of second Cu dummies (DP2a11) having an approximately square shape, along the scribe line SL1. The third guard ring 31by includes a plurality of second Cu dummies (DP2b11) having an approximately square shape, along the scribe line SL1. The third guard ring 31cy includes a plurality of second Cu dummies (DP2c11) having an approximately square shape, along the scribe line SL1.

Furthermore, the approximately square shape includes a square shape, and can be a quadrangular shape in which a difference between a long side and a short side of a quadrangular shape, for example, is within 10%.

In this case, a twelfth guard ring unit 52 includes the first guard ring 11a, the electrode pad EP1, the third guard ring 31ay, the power source pad 41a, the global wiring GW, and the second guard ring 21a. A thirteenth guard ring unit 53 includes the first guard ring 11b, the electrode pad EP2, the third guard ring 31by, and the power source pad 41. A fourteenth guard ring unit 54 includes the first guard ring 11c, the electrode pad EP3, the third guard ring 31cy, and the power source pad 41.

Figure 19A:
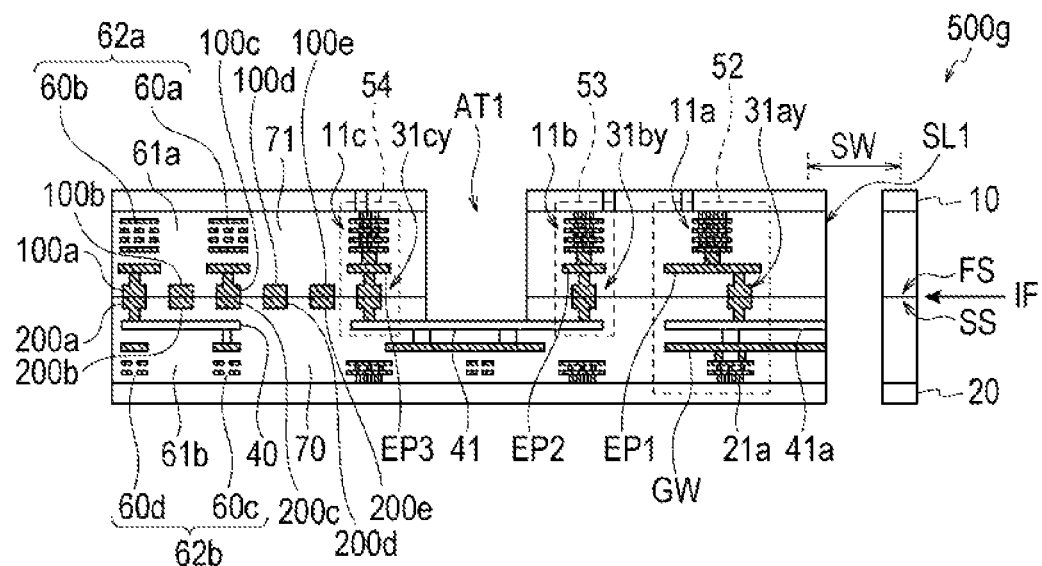
FIGS. 19A and 19B are (fourth) explanatory diagrams illustrating the semiconductor device that is an example of the semiconductor device of the third embodiment according to the present technology.
Figure 19B:
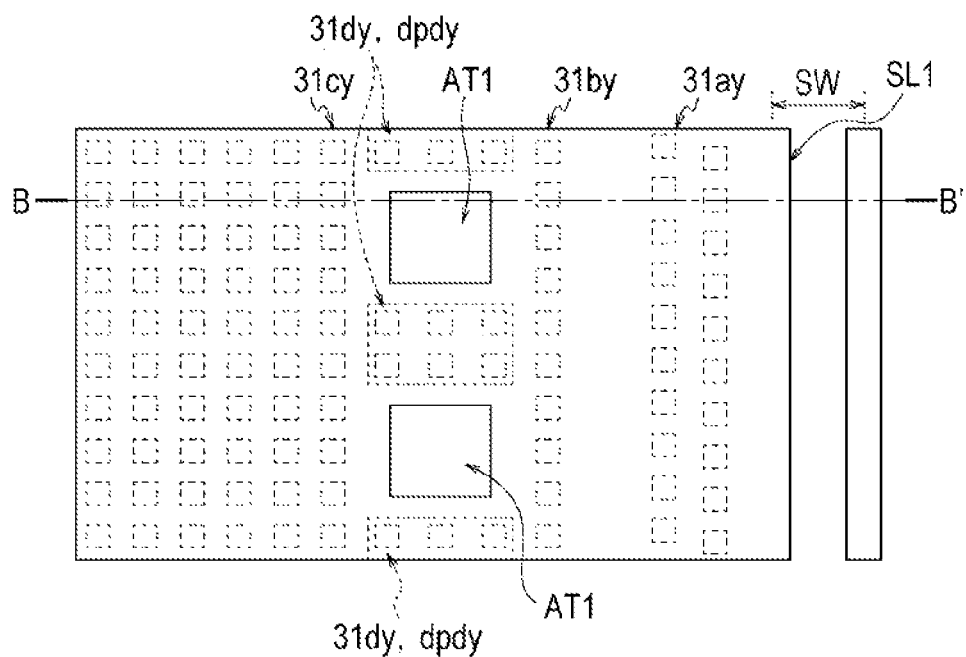

FIGS. 19A and 19B illustrate a semiconductor device 500g that is an example of the semiconductor device of the third embodiment according to the present technology. FIG. 19A illustrates the sectional view of the semiconductor device 500g, and FIG. 19B illustrates the plan view of the semiconductor device 500g.

As illustrated in FIGS. 19A and 19B, in the semiconductor device 500g of the third embodiment according to the present technology, the third guard ring 31dy is further formed on the junction interface IF, at a predetermined interval (discontinuously) by a plurality of second Cu dummies (dpdy), in addition to the semiconductor device 500f. Thus, the semiconductor device 500g of the third embodiment according to the present technology further includes at least one third guard ring 31dy, and the at least one third guard ring 31dy may be formed to surround the opening portion AT1 of the power source pad 41.

As described above, in the semiconductor device that is an example of the semiconductor device of the third embodiment according to the present technology, the guard ring unit is formed to surround at least a part of the circumference of the semiconductor device, and is provided inside the scribe line SL1, and the third guard ring 31 is inconsecutively formed by the plurality of second Cu dummies.

With this arrangement, the semiconductor device that is an example of the semiconductor device of the third embodiment according to the present technology, is capable of preventing or reducing the progress of an inner crack or chipping, and of preventing or reducing the infiltration of the moisture from the outside.

5. Fourth Embodiment (Third Example of Semiconductor Device)

A semiconductor device of a fourth embodiment according to the present technology, is a semiconductor device in which at least one Cu dummy (the first Cu dummy) is further provided, and the Cu dummy is formed on the outer circumference of the guard ring unit, and is formed between the first junction surface and the second junction surface, in the semiconductor device of the first embodiment.

According to the semiconductor device of the fourth embodiment of the present technology, it is possible to increase the junction strength of the junction interface IF, and thus, it is possible to improve the reliability of the quality of the semiconductor device, on the junction surface of the Cu—Cu junction.

Figure 20A:
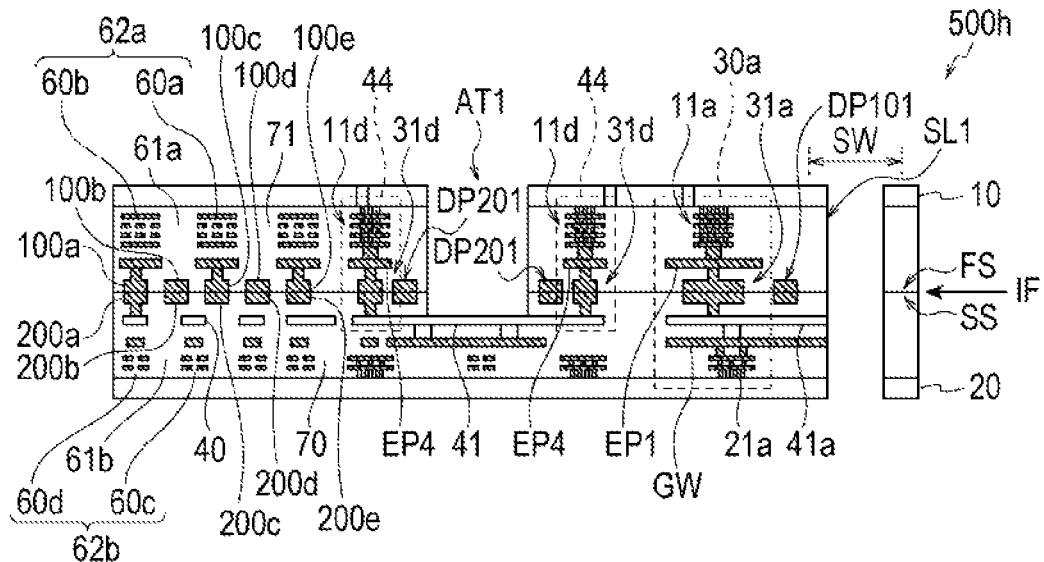
FIGS. 20A and 20B are (first) explanatory diagrams illustrating a semiconductor device that is an example of a semiconductor device of a fourth embodiment according to the present technology.
Figure 20B:
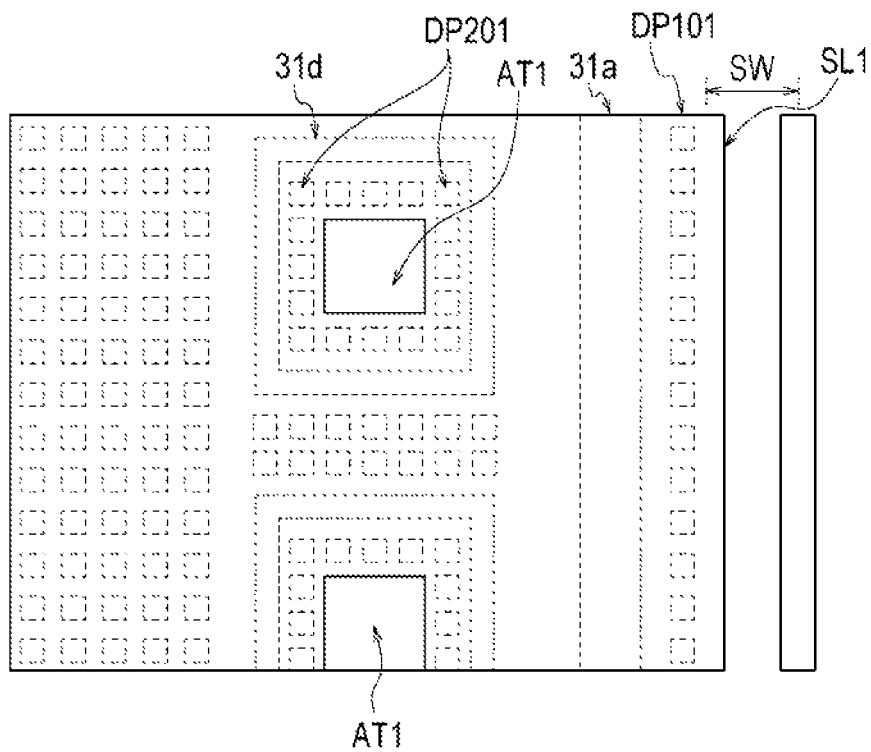

FIGS. 20A and 20B illustrate a semiconductor device 500h that is an example of the semiconductor device of the fourth embodiment according to the present technology. FIG. 20A illustrates the sectional view of the semiconductor device 500h, and FIG. 20B illustrates the plan view of the semiconductor device 500h.

As illustrated in FIGS. 20A and 20B, the semiconductor device 500h of the fourth embodiment according to the present technology, is different from the semiconductor device 500 of the second embodiment, in that at least one first Cu dummy is further provided, and the first Cu dummy is formed on the outer circumference of the first guard ring unit 30a, and is formed on the first junction surface FS and the second junction surface SS.

In FIGS. 20A and 20B, at least one first Cu dummy DP101 is formed between the third guard ring 31a and the scribe line SL1. In addition, a plurality of first Cu dummies DP201 are formed around the opening portion AT1 of the junction interface IF. That is, the plurality of first Cu dummies DP201 are formed to surround the opening portion AT1 between the third guard ring 31d and the opening portion AT1.

In this case, the first guard ring unit 30a includes the first guard ring 11a, the electrode pad EP1, the third guard ring 31a, the power source pad 41a, the global wiring GW, and the second guard ring 21a. The fourth guard ring unit 44 includes the first guard ring 11d, the electrode pad EP4, the third guard ring 31d, and the power source pad 41.

The first guard ring 11d is formed to surround the opening portion AT1 of the power source pad 41. The third guard ring 31d is also formed to surround the opening portion AT1 of the power source pad 41. In addition, the electrode pad EP4 is also formed to surround the opening portion AT1 of the power source pad 41.

Furthermore, it is not necessary that a plurality of first Cu dummies DP101 and a plurality of first Cu dummies DP201 are provided, but at least one first Cu dummy DP101 may be provided.

Figure 21A:
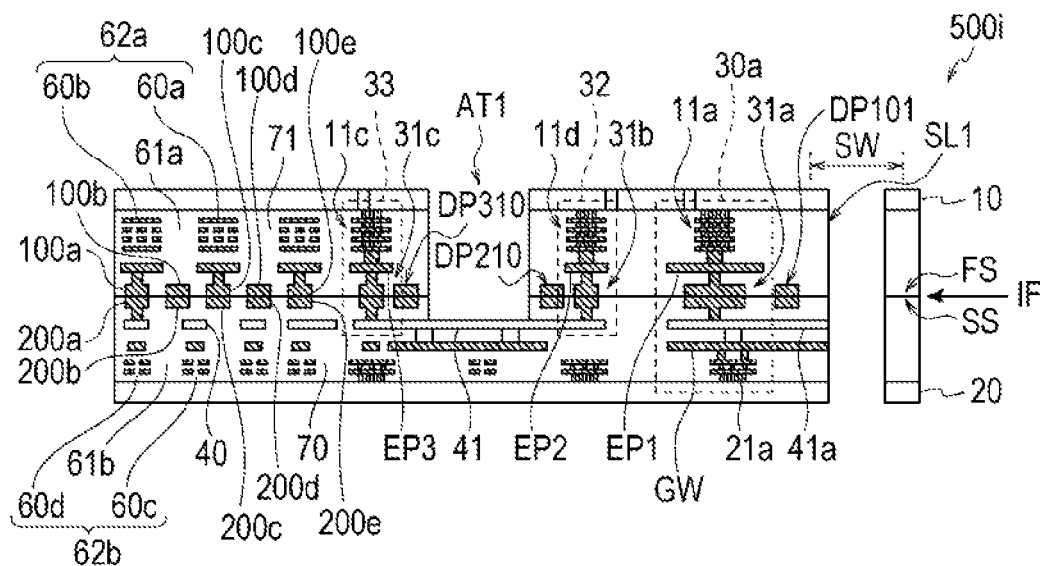
FIGS. 21A and 21B are (second) explanatory diagrams illustrating the semiconductor device that is an example of the semiconductor device of the fourth embodiment according to the present technology.
Figure 21B:
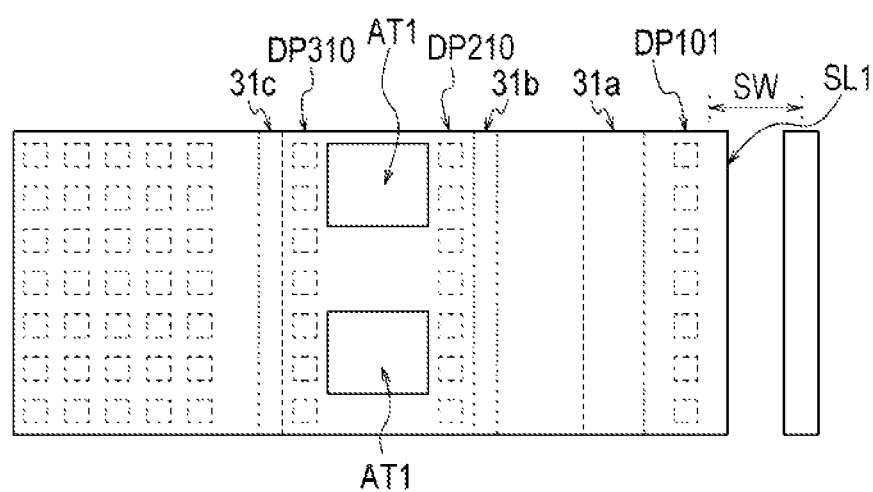

FIGS. 21A and 21B illustrate a semiconductor device 500i that is an example of the semiconductor device of the fourth embodiment according to the present technology. FIG. 21A illustrates the sectional view of the semiconductor device 500i, and FIG. 21B illustrates the plan view of the semiconductor device 500i.

As illustrated in FIGS. 21A and 21B, the semiconductor device 500i of the fourth embodiment according to the present technology, is different from the semiconductor device 500h, in that at least one first Cu dummy DP210 is provided between the third guard ring 31b and the opening portion AT1, and at least one first Cu dummy DP310 is provided between the third guard ring 31c and the opening portion AT1, on the junction interface IF.

In this case, the first guard ring unit 30a includes the first guard ring 11a, the electrode pad EP1, the third guard ring 31a, the power source pad 41a, the global wiring GW, and the second guard ring 21a. The second guard ring unit 32 includes the first guard ring 11b, the electrode pad EP2, the third guard ring 31b, and the power source pad 41. The third guard ring unit 33 includes the first guard ring 11c, the electrode pad EP3, the third guard ring 31c, and the power source pad 41.

Furthermore, it is not necessary that a plurality of first Cu dummies DP101, a plurality of first Cu dummies DP210, and a plurality of first Cu dummies DP310 are not provided, but at least one first Cu dummy DP101 may be provided.

As described above, according to the semiconductor device of the fourth embodiment of the present technology, the at least one first Cu dummy DP101 is further provided, and the first Cu dummy DP101 is formed on the outer circumference of the guard ring unit 30a, and is formed on the first junction surface FS and the second junction surface SS.

With this arrangement, it is possible to improve the junction strength between the first semiconductor substrate 10 and the second semiconductor substrate 20, and thus, for example, in the dicing, it is possible to stop the peeling between the first semiconductor substrate 10 and the second semiconductor substrate 20 outside the first guard ring unit 30a.

6. Fifth Embodiment (Fourth Example of Semiconductor Device)

A semiconductor device of a fifth embodiment according to the present technology, is a semiconductor device in which a slit is further provided, and the slit is provided between the scribe line formed to surround at least a part of the circumference of the semiconductor device and the guard ring unit formed inside the scribe line, and penetrates through the first junction surface and the second junction surface along a dicing direction, in the semiconductor device of the first embodiment.

According to the semiconductor device of the fifth embodiment of the present technology, even when the first semiconductor substrate 10 and the second semiconductor substrate 20 are likely to be peeled off, the peeling can be stopped by the slit, and thus, it is possible to improve the reliability of the quality of the semiconductor device.

Figure 22A:
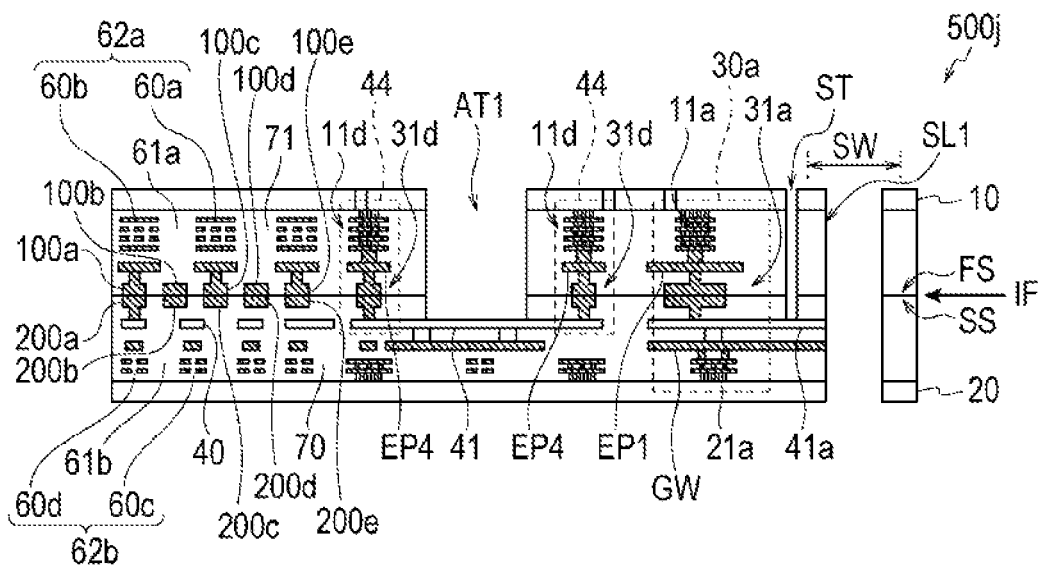
FIGS. 22A and 22B are (first) explanatory diagrams illustrating a semiconductor device that is an example of a semiconductor device of a fifth embodiment according to the present technology.
Figure 22B:
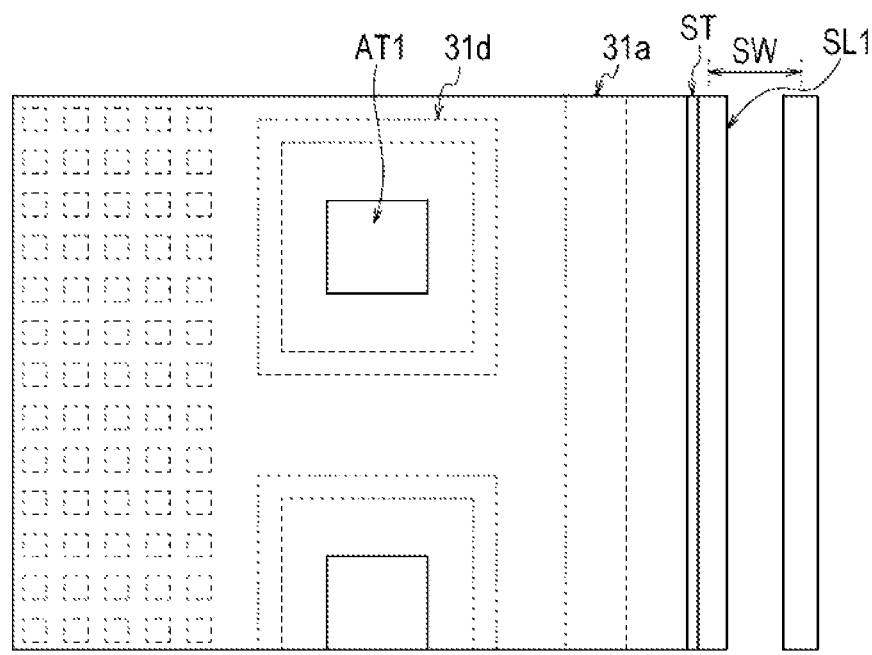

FIGS. 22A and 22B illustrate a semiconductor device 500j that is an example of the semiconductor device of the fifth embodiment according to the present technology. FIG. 22A illustrates the sectional view of the semiconductor device 500j, and FIG. 22B illustrates the plan view of the semiconductor device 500j.

As illustrated in FIGS. 22A and 22B, the semiconductor device 500j of the fifth embodiment according to the present technology further includes a slit ST in the semiconductor device 500, and the slit ST is provided between the scribe line SL1 formed to surround at least a part of the circumference of the semiconductor device 500j and the first guard ring unit 30a formed inside the scribe line SL1, and penetrates through the first junction surface FS and the second junction surface SS along the dicing direction.

With this arrangement, even in a case where the first semiconductor substrate 10 and the second semiconductor substrate 20 are likely to be peeled off at the time of the dicing or after the dicing, the progress of the peeling between the first semiconductor substrate 10 and the second semiconductor substrate 20 can be stopped by the slit ST.

Furthermore, in this case, the first guard ring unit 30a includes the first guard ring 11a, the electrode pad EP1, the third guard ring 31a, the power source pad 41a, the global wiring GW, and the second guard ring 21a. In addition, the fourth guard ring unit 44 includes the first guard ring 11d, the electrode pad EP4, the third guard ring 31d, and the power source pad 41.

Figure 23A:
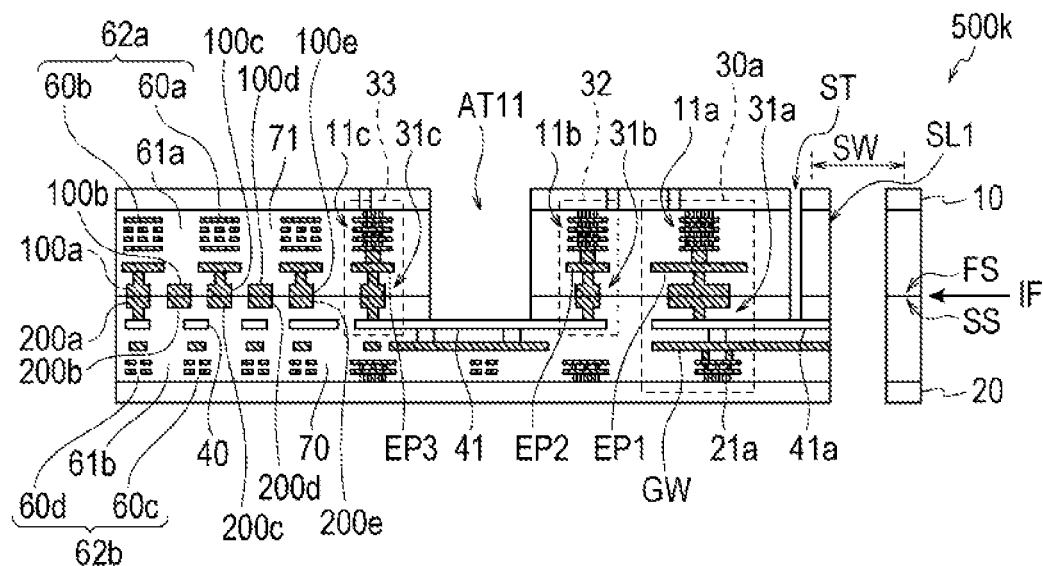
FIGS. 23A and 23B are (second) explanatory diagrams illustrating the semiconductor device that is an example of the semiconductor device of the fifth embodiment according to the present technology.
Figure 23B:
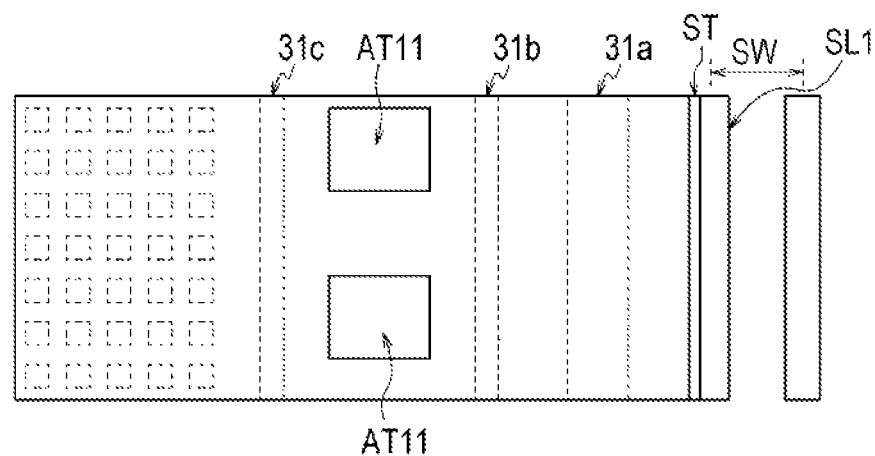

FIGS. 23A and 23B illustrate a semiconductor device 500k that is an example of the semiconductor device of the fifth embodiment according to the present technology. FIG. 23A illustrates the sectional view of the semiconductor device 500k, and FIG. 23B illustrates the plan view of the semiconductor device 500k.

As illustrated in FIGS. 23A and 23B, as with the semiconductor device 500j, the semiconductor device 500k of the fifth embodiment according to the present technology, further includes the slit ST in the semiconductor device 500, and the slit ST is provided between the scribe line SL1 formed to surround at least a part of the circumference of the semiconductor device 500k and the guard ring unit 30a formed inside the scribe line SL1, and penetrates through the first junction surface FS and the second junction surface SS along the dicing direction.

With this arrangement, even in a case where the first semiconductor substrate 10 and the second semiconductor substrate 20 are likely to be peeled off at the time of the dicing or after the dicing, the progress of the peeling between the first semiconductor substrate 10 and the second semiconductor substrate 20 can be stopped by the slit ST.

Furthermore, in this case, the first guard ring unit 30a includes the first guard ring 11a, the electrode pad EP1, the third guard ring 31a, the power source pad 41a, the global wiring GW, and the second guard ring 21a. The second guard ring unit 32 includes the first guard ring 11b, the electrode pad EP2, the third guard ring 31b, and the power source pad 41. The third guard ring unit 33 includes the first guard ring 11c, the electrode pad EP3, the third guard ring 31c, and the power source pad 41.

7. Sixth Embodiment (Fifth Example of Semiconductor Device)

A semiconductor device of a sixth embodiment according to the present technology, is a semiconductor device in which a slit, and at least one Cu dummy (the first Cu dummy) are further provided, the Cu dummy (the first Cu dummy) is formed along the outer circumference of the guard ring unit, and is formed on the first junction surface and the second junction surface, and the slit is provided between the scribe line formed to surround at least a part of the circumference of the semiconductor device and the guard ring unit formed inside the scribe line, and penetrates through the first junction surface and the second junction surface along the dicing direction, in the semiconductor device of the first embodiment.

According to the semiconductor device of the sixth embodiment of the present technology, it is possible to prevent or reduce the peeling between the first semiconductor substrate 10 and the second semiconductor substrate 20, and to prevent or reduce the progress of the peeling, at the time of dicing the semiconductor device.

Figure 24A:
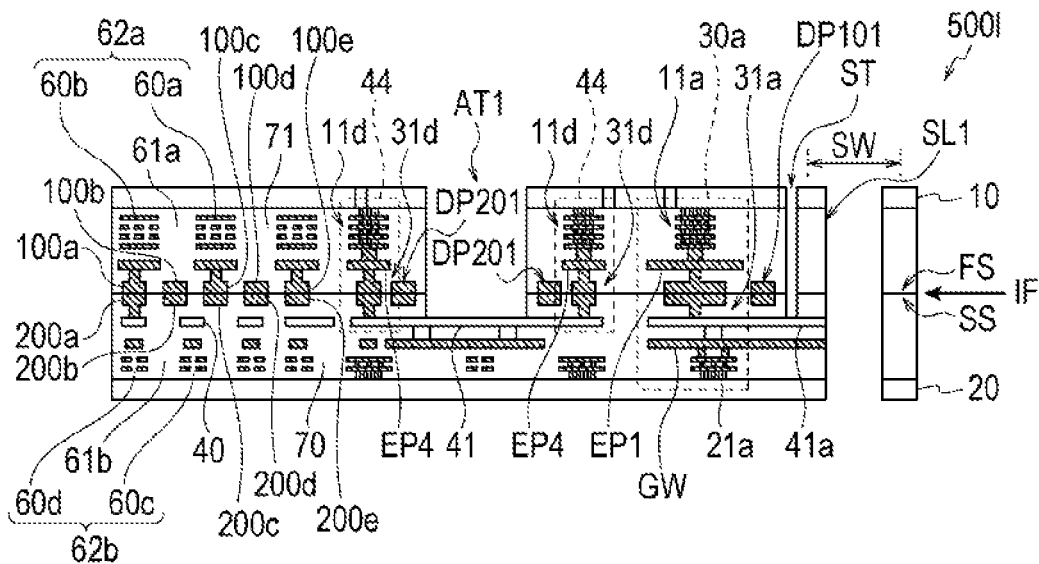
FIGS. 24A and 24B are (first) explanatory diagrams illustrating a semiconductor device that is an example of a semiconductor device of a sixth embodiment according to the present technology.
Figure 24B:
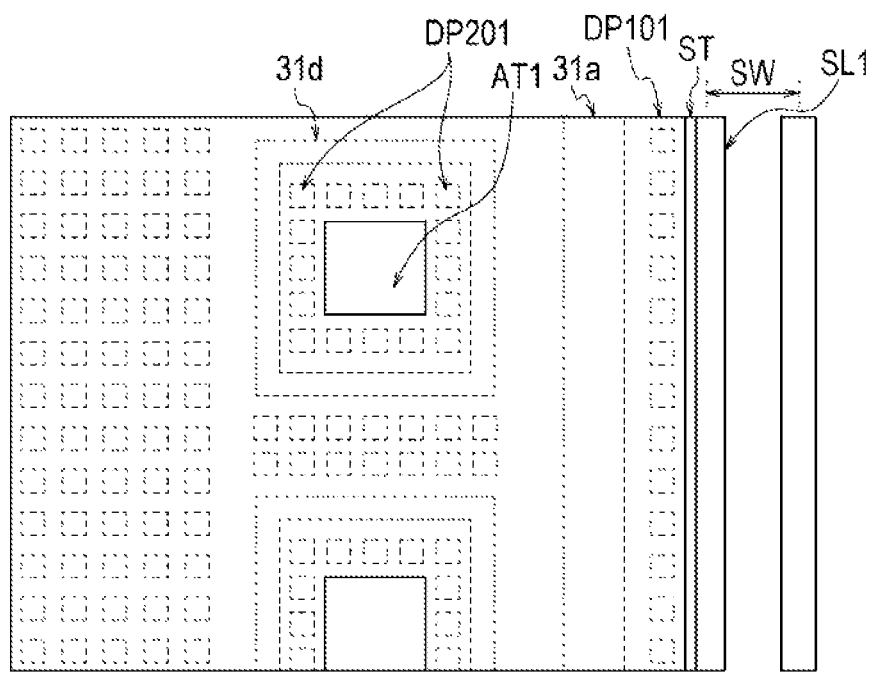

FIGS. 24A and 24B illustrate a semiconductor device 500l that is an example of the semiconductor device of the sixth embodiment according to the present technology. FIG. 24A illustrates the sectional view of the semiconductor device 500l, and FIG. 24B illustrates the plan view of the semiconductor device 500l.

As illustrated in FIGS. 24A and 24B, the semiconductor device 500l of the sixth embodiment according to the present technology, further includes the slit ST, and the at least one first Cu dummy DP101, in the semiconductor device 500h.

The at least one first Cu dummy DP101 is formed along the outer circumference of the first guard ring unit 30a, and is formed on the first junction surface FS and the second junction surface SS. The slit ST is formed inside the scribe line SL1 formed to surround at least a part of the circumference of the semiconductor device 500l, and penetrates through the first junction surface FS and the second junction surface SS along the dicing direction.

In this case, the first guard ring unit 30a includes the first guard ring 11a, the electrode pad EP1, the third guard ring 31a, the power source pad 41a, the global wiring GW, and the second guard ring 21a. In addition, the fourth guard ring unit 44 is formed in at least a part of the circumference of the semiconductor device 500l, and is provided to surround the opening portion AT1 of the power source pad 41. The fourth guard ring unit 44 includes the first guard ring 11d, the electrode pad EP4, the third guard ring 31d, and the power source pad 41.

The first guard ring 11d is provided to surround the opening portion AT1 of the power source pad 41. The third guard ring 31d is also provided to surround the opening portion AT1 of the power source pad 41. In addition, the electrode pad EP4 is also provided to surround the opening portion AT1 of the power source pad 41.

Further, the plurality of first Cu dummies DP201 are formed on the circumference of the opening portion AT1 of the junction interface IF. The plurality of first Cu dummies DP201 are formed to surround the opening portion AT1.

With this arrangement, the semiconductor device 500l is capable of increasing the junction strength of the junction interface IF, not only by the plurality of first Cu dummies DP101, but also by the plurality of first Cu dummies DP201.

Figure 25A:
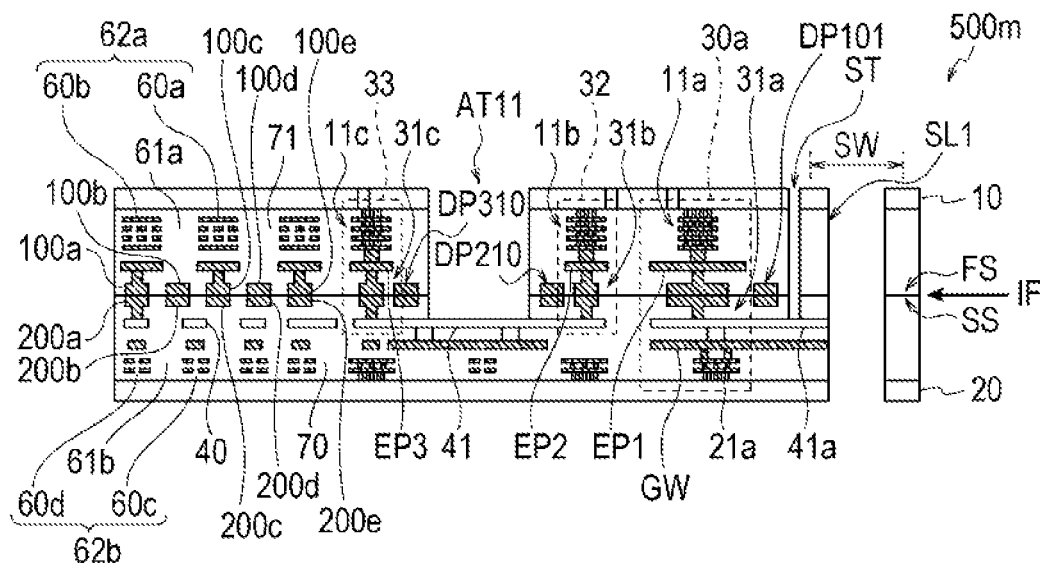
FIGS. 25A and 25B are (second) explanatory diagrams illustrating the semiconductor device that is an example of the semiconductor device of the sixth embodiment according to the present technology.
Figure 25B:
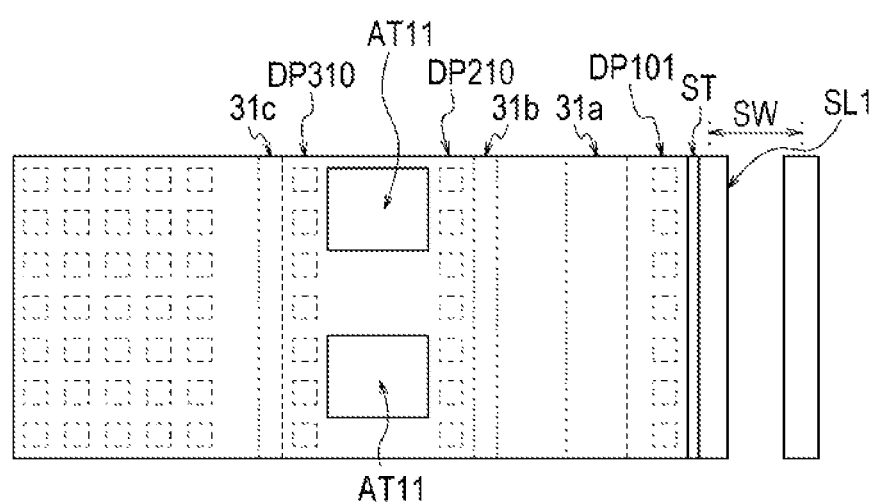

FIGS. 25A and 25B illustrate a semiconductor device 500m that is an example of the semiconductor device of the sixth embodiment according to the present technology. FIG. 25A illustrates the sectional view of the semiconductor device 500m, and FIG. 25B illustrates the plan view of the semiconductor device 500m.

As illustrated in FIGS. 25A and 25B, the semiconductor device 500m of the sixth embodiment according to the present technology, also further includes the slit ST, the at least one first Cu dummy DP101, the at least one first Cu dummy DP210 between the third guard ring 31b and the opening portion AT1, and the at least one first Cu dummy DP310 between the third guard ring 31c and the opening portion AT1, in the semiconductor device 500.

The at least one first Cu dummy DP101 is formed along the first guard ring unit 30a, and is formed on the first junction surface FS and the second junction surface SS. The at least one first Cu dummy DP210 is formed along the second guard ring unit 32, and is formed on the first junction surface FS and the second junction surface SS. The at least one first Cu dummy DP310 is formed along the third guard ring unit 33, and is formed on the first junction surface FS and the second junction surface SS.

The slit ST is provided between the scribe line SL1 formed to surround at least a part of the circumference of the semiconductor device 500m and first guard ring unit 30a formed inside the scribe line SL1, and penetrates through the first junction surface FS and the second junction surface SS along the dicing direction.

According to the semiconductor devices 500l and 500m of the sixth embodiment of the present technology, the slit ST, and the at least one first Cu dummy DP101 are provided, and thus, even in a case where the first semiconductor substrate 10 and the second semiconductor substrate 20 are likely to be peeled off at the time of dicing the semiconductor device or after dicing the semiconductor device, it is possible to increase the junction strength of the first Cu dummy DP101, and to stop the peeling by the slit ST.

With this arrangement, it is possible to improve the reliability of the quality of the semiconductor devices 500l and 500m, on the junction surface of the Cu—Cu junction. In addition, a plurality of first Cu dummies DP201, a plurality of first Cu dummies 210, and a plurality of first Cu dummies 310 are provided, and thus, it is possible to increase the junction strength on the junction interface IF.

8. Seventh Embodiment (Second Example of Manufacturing Method of Semiconductor Device)

A manufacturing method of a semiconductor device of a seventh embodiment according to the present technology, is a manufacturing method of a semiconductor device, including: joining the first semiconductor substrate and the second semiconductor substrate together to face each other; forming the third guard ring on the first junction surface of the first semiconductor substrate and the second junction surface of the second semiconductor substrate; and forming the first guard ring after the first semiconductor substrate and the second semiconductor substrate are joined together.

FIG. 26A to FIG. 38B illustrate an example of the manufacturing method of the semiconductor device of the seventh embodiment according to the present technology. FIG. 26A to FIG. 38B illustrate an example of the manufacturing method of the semiconductor device of the seventh embodiment according to the present technology. Furthermore, unless otherwise particularly noted, "up" indicates an upper direction in FIG. 26A to FIG. 38B, and "down" indicates a lower direction in FIG. 26A to FIG. 38B. In addition, A in each of the drawings, illustrates a sectional view, and B in each of the drawings, illustrates a plan view. Furthermore, the same reference numerals will be applied to the same members as those of the manufacturing method of the semiconductor device of the second embodiment according to the present technology, and the description thereof will be appropriately omitted.

Figure 26A:
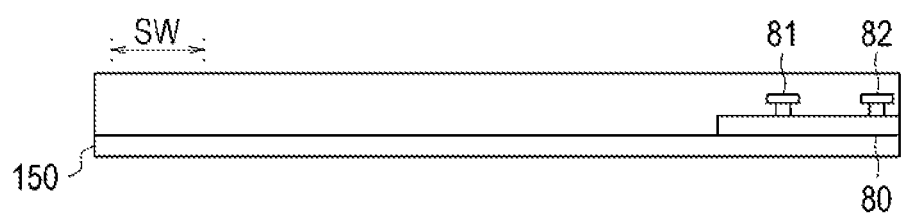
FIGS. 26A and 26B are (first) explanatory diagrams illustrating an example of a manufacturing method of a semiconductor device of a seventh embodiment to which the present technology is applied.
Figure 26B:
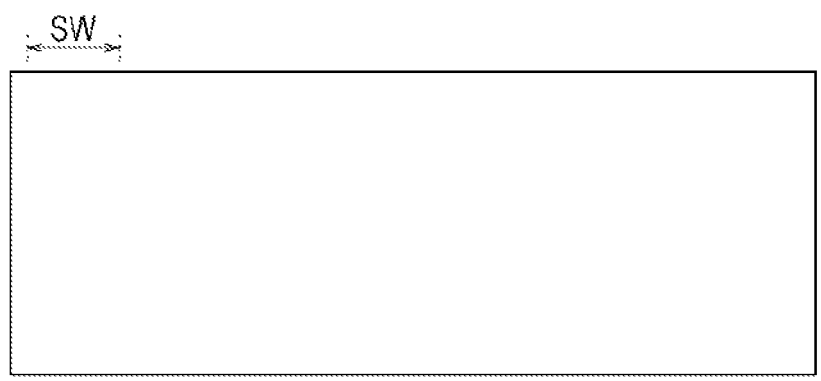
Figure 27A:
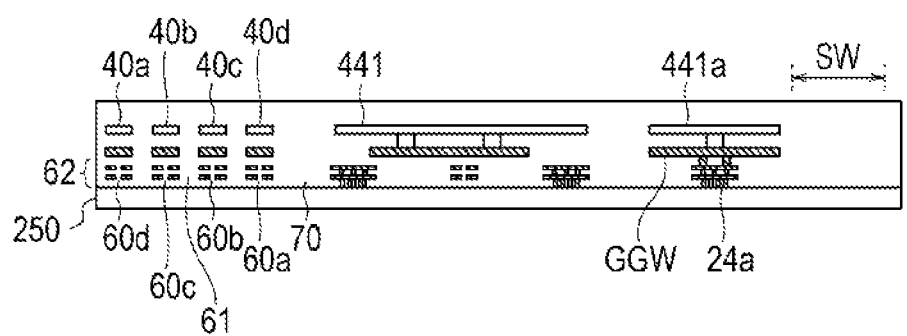
FIGS. 27A and 27B are (second) explanatory diagrams illustrating an example of the manufacturing method of the semiconductor device of the seventh embodiment to which the present technology is applied.
Figure 27B:
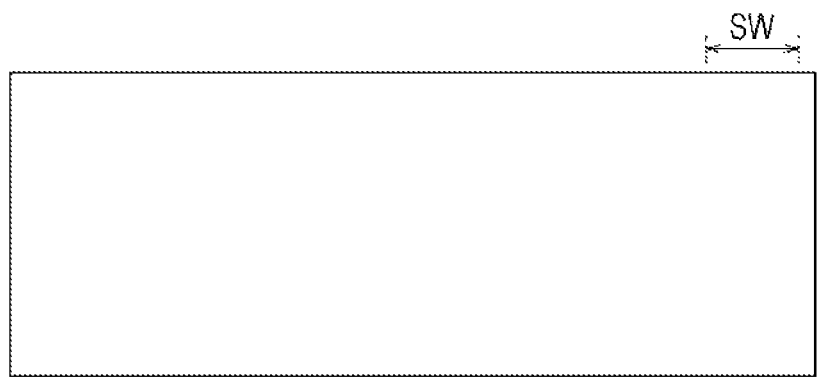

FIGS. 26A and 26B illustrate a first semiconductor substrate 150, and FIGS. 27A and 27B illustrate a second semiconductor substrate 250. The first semiconductor substrate 150 and the second semiconductor substrate 250, for example, contain single crystalline silicon. In addition, the first semiconductor substrate 150 has a structure of a chip on wafer (COW) in which another diced substrate 80 is embedded. An oxide film is formed on the front surface of each of the first semiconductor substrate 150 and the second semiconductor substrate 250, and a plurality of wiring layers are provided on the underlayer.

The first semiconductor substrate 150 illustrated in FIGS. 26A and 26B, includes another substrate 80, an electrode pad 81, and an electrode pad 82.

The second semiconductor substrate 250 illustrated in FIGS. 27A and 27B includes a second guard ring 24a, the power source pad 40a, the power source pad 40b, the power source pad 40c, the power source pad 40d, a power source pad 441, a power source pad 441a, the wiring 60a, the wiring 60b, the wiring 60c, the wiring 60d, the interlayer insulating film 70, and a global wiring GGW. Furthermore, the second guard ring 24a is formed by dummy wiring instead of connection wiring. The second guard ring 24a is connected by wiring or the like in which a via layer is formed between the dummy wirings of each layer, and the dummy wiring of the upper layer and the dummy wiring of the lower layer are connected to each other. With this arrangement, the second guard ring 24a is capable of preventing or reducing an inner crack or chipping. Furthermore, the second guard ring 24a is connected to the power source pad 441a through the global wiring GGW. In addition, the wiring layer 62 includes the wiring 60a, the wiring 60b, the wiring 60c, the wiring 60d, and the insulating film 61.

In the second semiconductor substrate 250, for example, a metal film such as aluminum (Al), copper (Cu), and tungsten (W), can be applied as the material of the wiring layer 62, but the material is not particularly limited thereto. The first semiconductor substrate 150 and the second semiconductor substrate 250 are formed such that all of the wiring layers 62 are formed such that the circumference of the semiconductor device is covered with the second guard ring 24a into the shape of a ring, in order to prevent or reduce the degradation of the wiring 60a, the wiring 60b, the wiring 60c, and the wiring 60d due to the infiltration of the moisture from the power source pad positioned on the wiring layer 62 or the end portion of the semiconductor device, as with the manufacturing method of the semiconductor device of the second embodiment according to with the present technology. Furthermore, the second guard ring 24a is not limited to the shape of a ring, but may be partially discontinuous.

In addition, for example, the first semiconductor substrate 150 includes the receiving element, and the second semiconductor substrate 250 may include the MOS transistor, the diffusion layer, or the like, performing the signal processing as an integrated circuit.

Figure 28A:
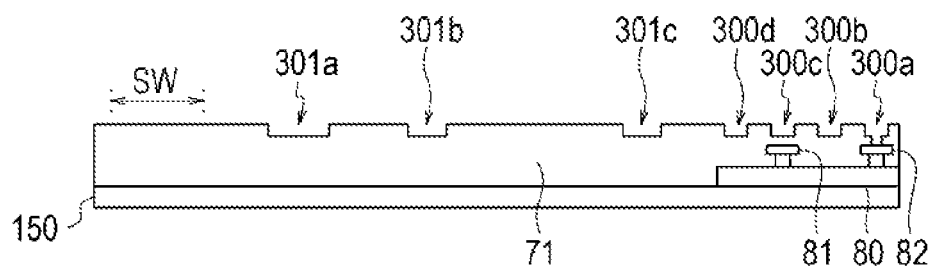
FIGS. 28A and 28B are (third) explanatory diagrams illustrating an example of the manufacturing method of the semiconductor device of the seventh embodiment to which the present technology is applied.
Figure 28B:
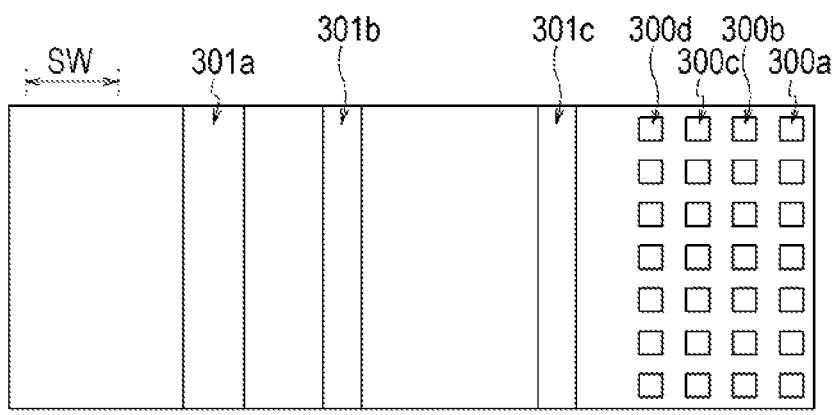

Next, as illustrated in FIGS. 28A and 28B, a connection pad 300a, a connection pad 300b, a connection pad 300c, and a connection pad 300d, of copper (Cu), are formed, and a first guard ring portion 301a, a first guard ring portion 301b, and a first guard ring portion 301c are formed, on the first semiconductor substrate 150.

Furthermore, the connection pad 300a, the connection pad 300b, the connection pad 300c, and the connection pad 300d may form a via in the interlayer portion of the interlayer insulating film 71.

In addition, the first guard ring portion 301a, the first guard ring portion 301b, and the first guard ring portion 301c are respectively formed into the shape of a groove, but for example, may have a structure in which a plurality of vias are arranged. In addition, the first guard ring portion 301b and the first guard ring portion 301c are configured as a separate member, but are not limited thereto, and for example, may form an approximately square shape in the plan view of FIG. 28B, or may be formed into the shape of a groove, as one member.

Figure 29A:
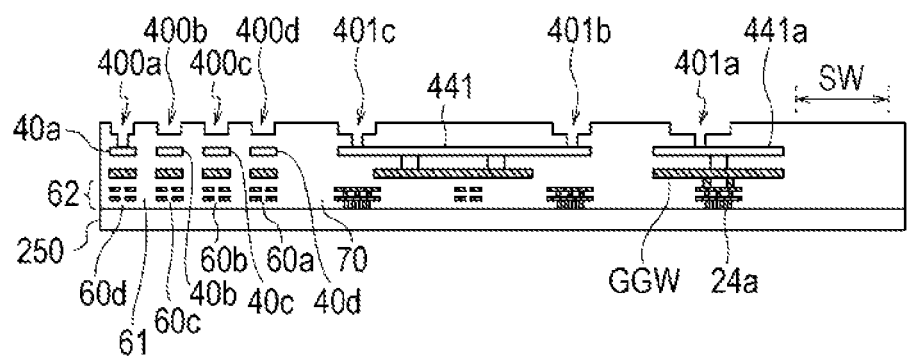
FIGS. 29A and 29B are (fourth) explanatory diagrams illustrating an example of the manufacturing method of the semiconductor device of the seventh embodiment to which the present technology is applied.
Figure 29B:
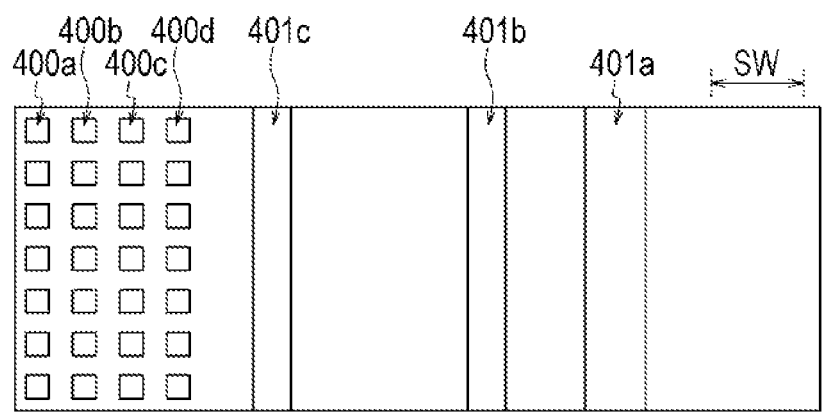

In addition, as illustrated in FIGS. 29A and 29B, a connection pad 400a, a connection pad 400b, a connection pad 400c, and a connection pad 400d, of copper (Cu), are formed, and a second guard ring portion 401a, a second guard ring portion 401b, and a second guard ring portion 401c are formed, on the second semiconductor substrate 250.

Furthermore, the connection pad 400a, the connection pad 400b, the connection pad 400c, and the connection pad 400d may form a via in the interlayer portion of the interlayer insulating film 70.

In addition, the second guard ring portion 401a, the second guard ring portion 401b, and the second guard ring portion 401c are respectively formed into the shape of a groove, but for example, may have a structure in which a plurality of vias are arranged. In addition, the second guard ring portion 401b and the second guard ring portion 401c are configured as a separate member, but are limited thereto, but for example, and may form an approximately square shape in the plan view of FIG. 29B, or may be formed into the shape of a groove, as one member.

Figure 30A:
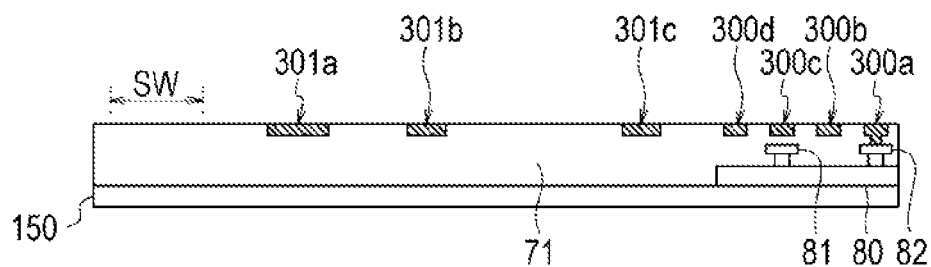
FIGS. 30A and 30B are (fifth) explanatory diagrams illustrating an example of the manufacturing method of the semiconductor device of the seventh embodiment to which the present technology is applied.
Figure 30B:
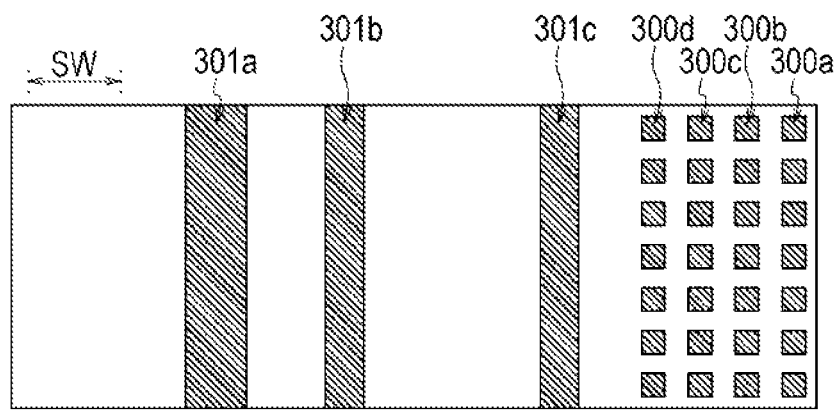

Next, as illustrated in FIGS. 30A and 30B, the connection pad 300a, the connection pad 300b, the connection pad 300c, the connection pad 300d, the first guard ring portion 301a, the first guard ring portion 301b, and the first guard ring portion 301c of the first semiconductor substrate 150 are covered with a barrier metal material or a metal film.

Then, flattening is performed according to the flattening chemical mechanical polishing (CMP), and the excess portion is removed. It is preferable that the barrier metal material, for example, is tantalum (Ta), tantalum nitride (TaN), titanium (Ti), titanium nitride (TiN), or the like, and two or more types of materials can be used by being mixed. Here, copper (Cu) is used as the metal film, but the metal film is not limited to copper (Cu), and for example, an alloy material (manganese bronze (CuMn), magnesium bronze (CuMg), aluminum bronze (CuAl), or the like can be used.

Figure 31A:
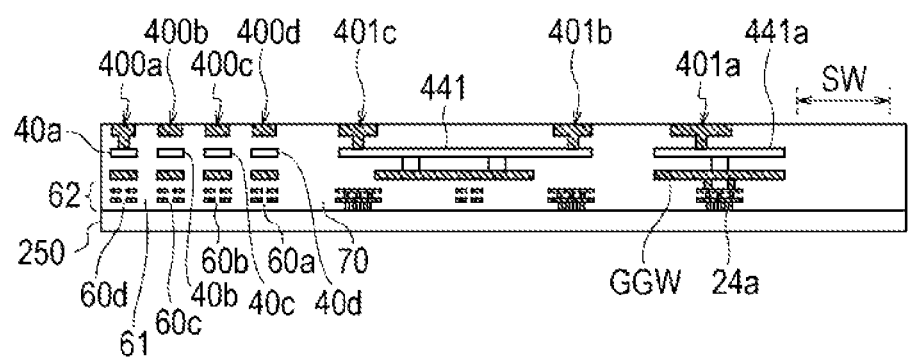
FIGS. 31A and 31B are (sixth) explanatory diagrams illustrating an example of the manufacturing method of the semiconductor device of the seventh embodiment to which the present technology is applied.
Figure 31B:
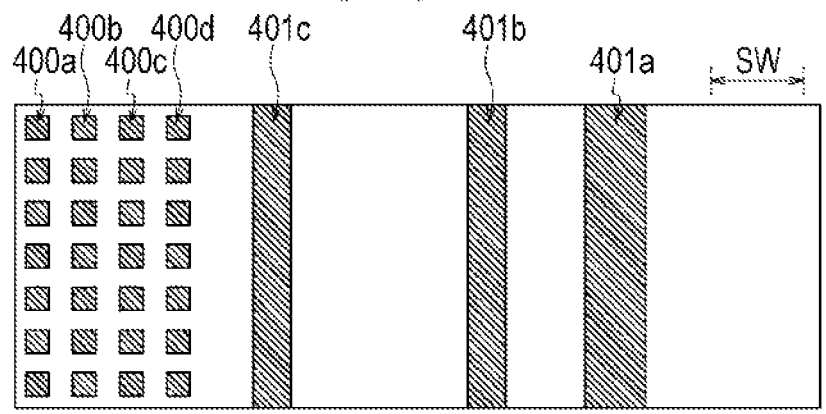

Similarly, as illustrated in FIGS. 31A and 31B, the connection pad 400a, the connection pad 400b, the connection pad 400c, the connection pad 400d, the second guard ring portion 401a, the second guard ring portion 401b, and the second guard ring portion 401c of the second semiconductor substrate 250 are covered with a barrier metal material and a metal film.

Then, flattening is performed according to the flattening CMP, and the excess portion is removed. Here, it is preferable that the barrier metal material, for example, is tantalum (Ta), tantalum nitride (TaN), titanium (Ti), titanium nitride (TiN), or the like, and two or more types of materials can be used by being mixed. Here, copper (Cu) is used as the metal film, but the metal film is not limited to copper (Cu), and for example, an alloy material (manganese bronze (CuMn), magnesium bronze (CuMg), aluminum bronze (CuAl), or the like can be used.

Figure 32A:
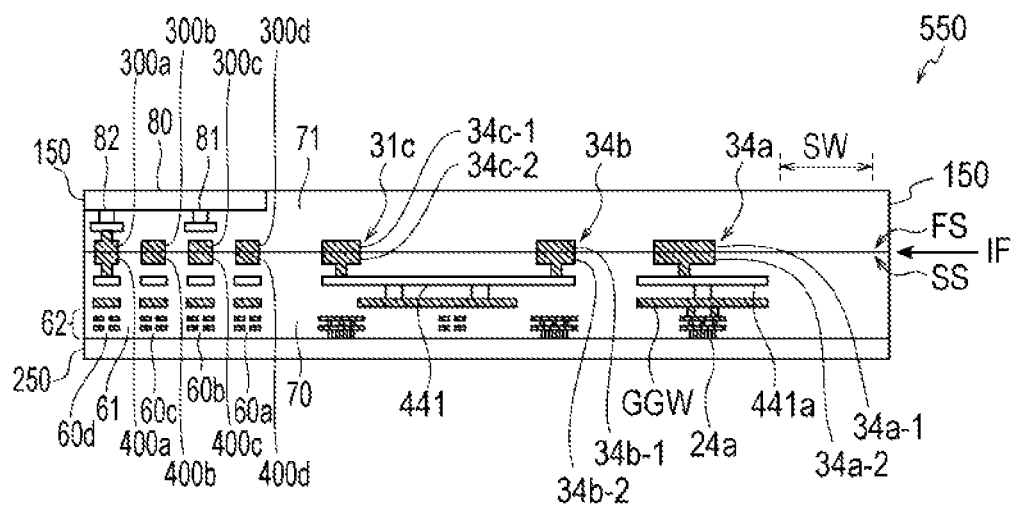
FIGS. 32A and 32B are (seventh) explanatory diagrams illustrating an example of the manufacturing method of the semiconductor device of the seventh embodiment to which the present technology is applied.
Figure 32B:
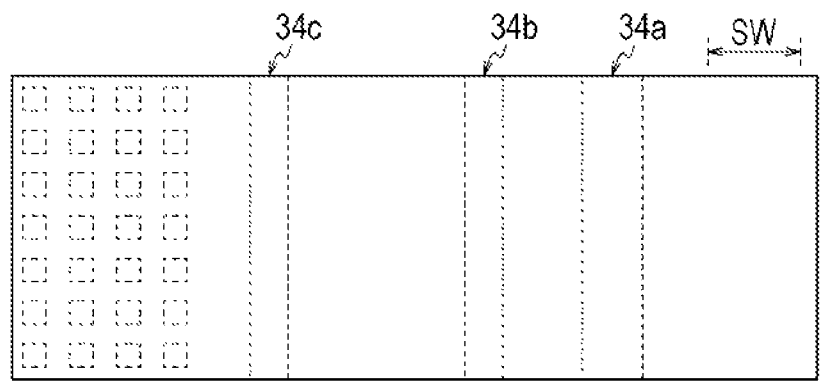

Next, as illustrated in FIGS. 32A and 32B, the first semiconductor substrate 150 illustrated in FIGS. 30A and 30B is reversed on the second semiconductor substrate 250 illustrated in FIGS. 31A and 31B, and the first semiconductor substrate 150 and the second semiconductor substrate 250 are joined together. With this arrangement, a semiconductor device 550 is generated. In addition, in the first semiconductor substrate 150 and the second semiconductor substrate 250, as necessary, the substrate may be thinned, or may be peeled off.

Here, the first semiconductor substrate 150 and the second semiconductor substrate 250 are joined together, and thus, the first guard ring portion 301a, the first guard ring portion 301b, and the first guard ring portion 301c, formed on the first semiconductor substrate 150, and the second guard ring portion 401a, the second guard ring portion 401b, and the second guard ring portion 401c, formed on the second semiconductor substrate 250, are joined together. With this arrangement, the third guard ring 34a, the third guard ring 34b, and the third guard ring 34c are formed.

Specifically, the third guard ring 34a includes the first guard ring portion 301a (34a-1) and the second guard ring portion 401a (34a-2). The third guard ring 34b includes the first guard ring portion 301b (34b-1) and the second guard ring portion 401b (34b-2). The third guard ring 34c includes the first guard ring portion 301c (34c-1) and the second guard ring portion 401c (34c-2).

In addition, the connection pad 300a, the connection pad 300b, the connection pad 300c, and the connection pad 300d of the first semiconductor substrate 150, and the connection pad 400a, the connection pad 400b, the connection pad 400c, and the connection pad 400d of the second semiconductor substrate 250, are connected to each other.

Further, in the semiconductor device 550, the first semiconductor substrate 150 is thinned, and the another diced substrate 80 is exposed.

Figure 33A:
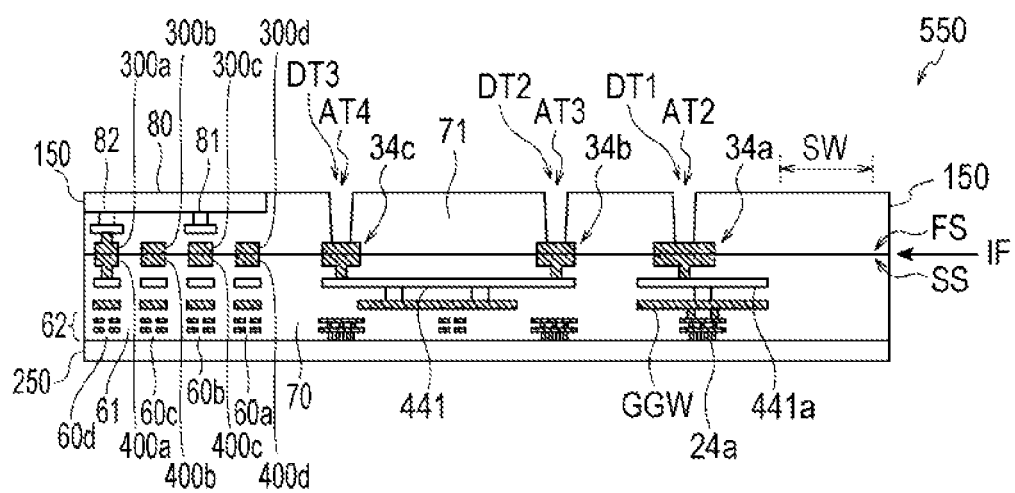
FIGS. 33A and 33B are (eighth) explanatory diagrams illustrating an example of the manufacturing method of the semiconductor device of the seventh embodiment to which the present technology is applied.
Figure 33B:
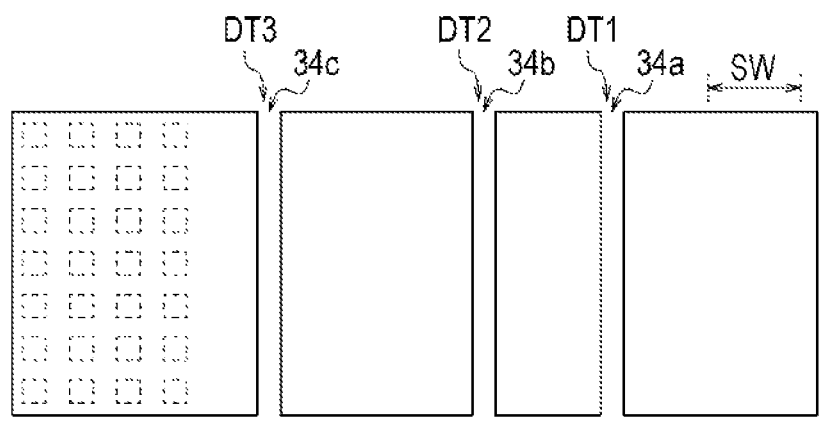

Next, as illustrated in FIGS. 33A and 33B, the generated semiconductor device 550 includes an opening portion AT2, an opening portion AT3, and an opening portion AT4 that penetrate to the back surface portion of the second semiconductor substrate 250 by a general lithography technology, a dry etching technology, or the like, in the shape of a groove. The opening portion AT2 forms a groove DT1, the opening portion AT3 forms a groove DT2, and the opening portion AT4 forms a groove DT3. Here, the opening portions are collectively formed, or may be dividedly formed, but are not limited thereto.

Furthermore, the groove DT2 and the groove DT3 are configured as separate member, but are not limited thereto, and for example, may form an approximately square shape in the plan view of FIG. 33B, or may form a groove, as one member.

Figure 34A:
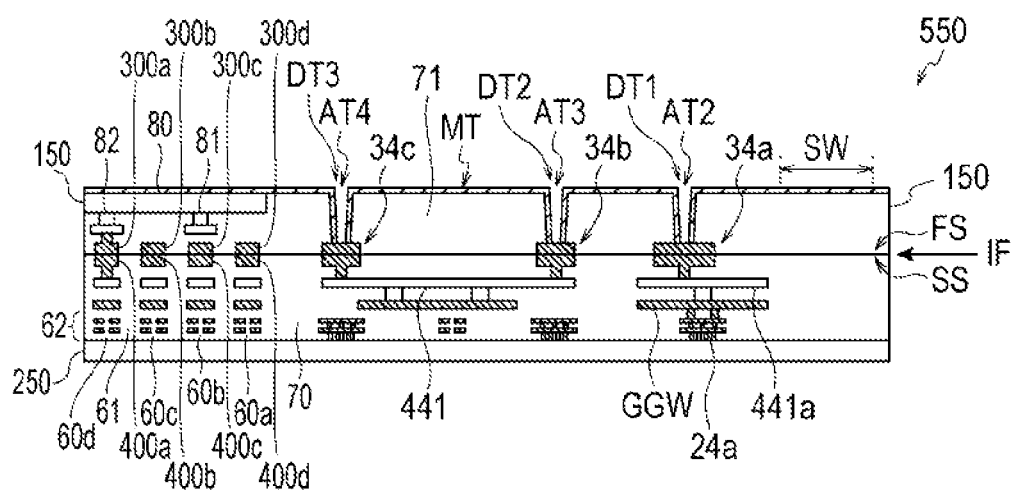
FIGS. 34A and 34B are (ninth) explanatory diagrams illustrating an example of the manufacturing method of the semiconductor device of the seventh embodiment to which the present technology is applied.
Figure 34B:
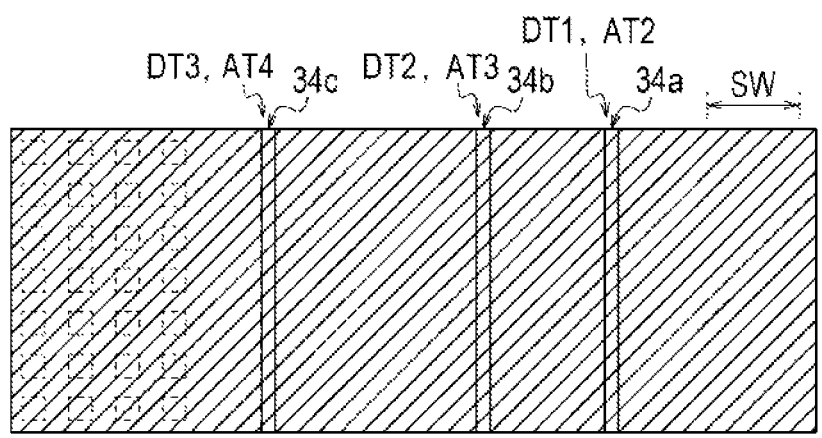

Next, as illustrated in FIGS. 34A and 34B, in the semiconductor device 550, a metal film MT (for example, tungsten (W)) is formed in the groove DT1, the groove DT2, and the groove DT3 of the first semiconductor substrate 150.

Figure 35A:
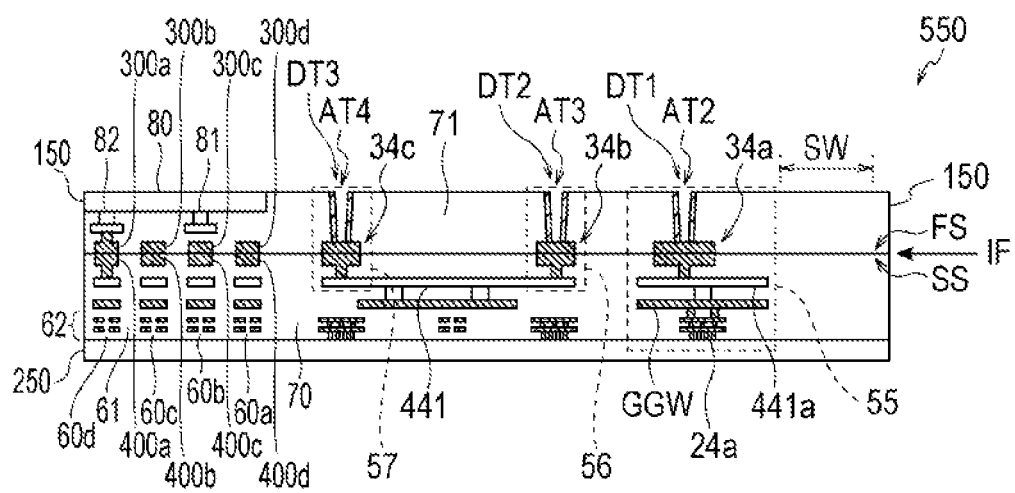
FIGS. 35A and 35B are (tenth) explanatory diagrams illustrating an example of the manufacturing method of the semiconductor device of the seventh embodiment to which the present technology is applied.
Figure 35B:
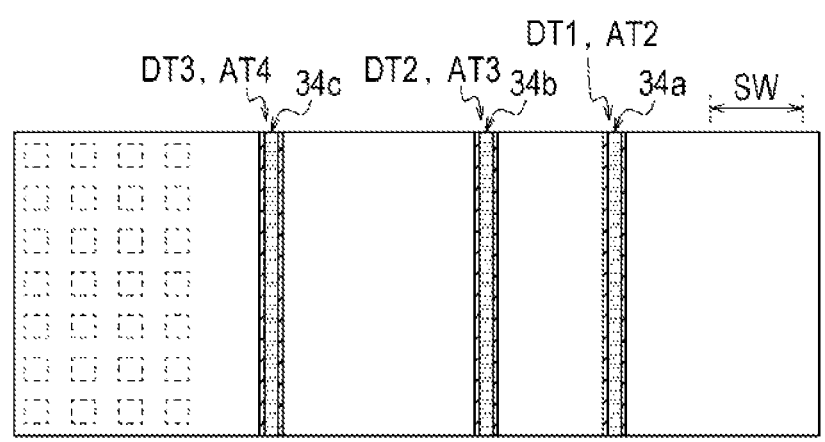

In addition, as illustrated in FIGS. 35A and 35B, the metal film MT formed on the front surface of the first semiconductor substrate 150, is removed by using lithography, dry etching, or the like.

With this arrangement, a fifteenth guard ring unit 55 includes the groove DT1 forming the first guard ring, the third guard ring 34a, the power source pad 441a, the global wiring GGW, and the second guard ring 24a. A sixteenth guard ring unit 56 includes the groove DT2 forming the first guard ring, the third guard ring 34b, and the power source pad 441. A seventeenth guard ring unit 57 includes the groove DT3 forming the first guard ring, the third guard ring 34c, and the power source pad 441.

Figure 36A:
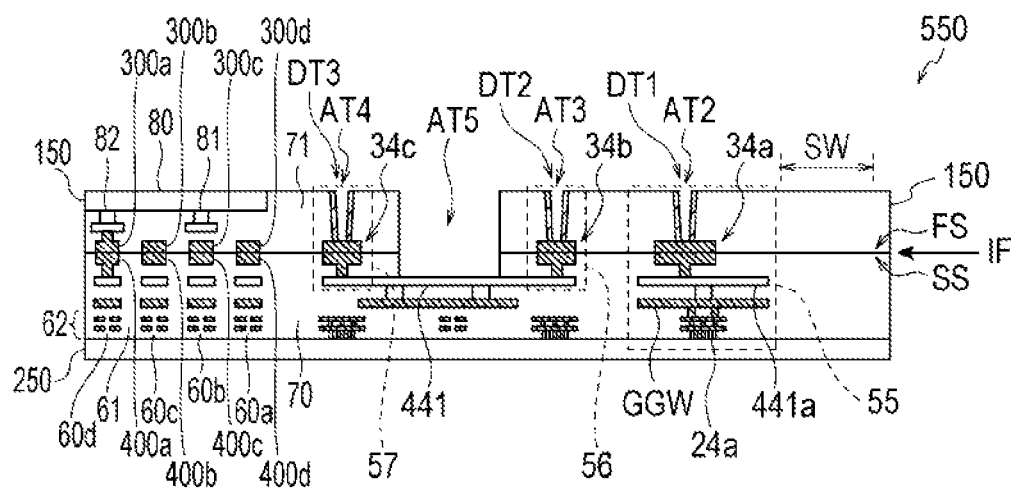
FIGS. 36A and 36B are (eleventh) explanatory diagrams illustrating an example of the manufacturing method of the semiconductor device of the seventh embodiment to which the present technology is applied.
Figure 36B:
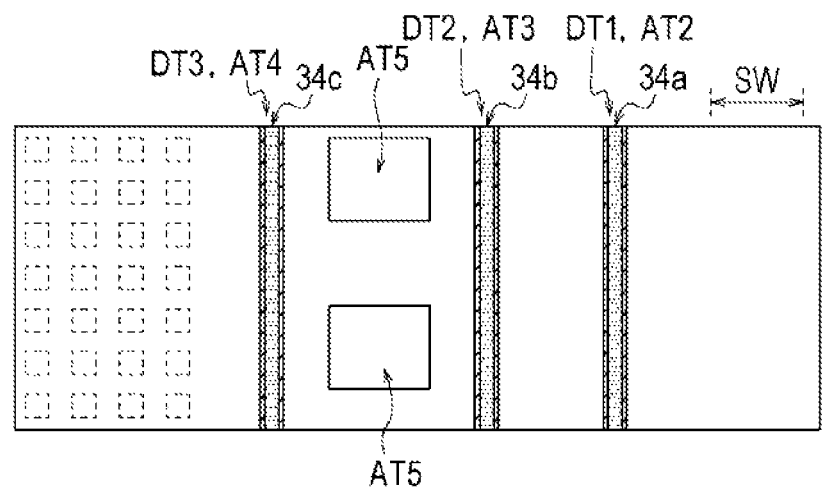

Next, as illustrated in FIGS. 36A and 36B, in the semiconductor device 550, an opening portion AT5 that penetrates through the first semiconductor substrate 150, and opens to the power source pad 441, is formed by using lithography, dry etching, or the like.

Here, the opening portion AT5 is formed, and thus, the moisture easily infiltrates from the outside, but the groove DT1, the groove DT2, and the groove DT3, configuring the first guard ring, include the metal film (for example, tungsten). The groove DT1, the groove DT2, and the groove DT3 form the fifteenth guard ring unit 55, the sixteenth guard ring unit 56, and the seventeenth guard ring unit 57.

That is, the groove DT1, the groove DT2, and the groove DT3 include the metal film (metal), and the fifteenth guard ring unit 55, the sixteenth guard ring unit 56, and the seventeenth guard ring unit 57 cover the wiring layer 62.

With this arrangement, the semiconductor device 550 is capable of preventing or reducing the infiltration of the moisture by the fifteenth guard ring unit 55, the sixteenth guard ring unit 56, and the seventeenth guard ring unit 57. Therefore, it is possible to prevent or reduce the corrosion of the connection pad 300a, the connection pad 300b, the connection pad 300c, the connection pad 300d, the connection pad 400a, the connection pad 400b, the connection pad 400c, the connection pad 400d, and the wiring layer 62, on the junction interface IF.

Figure 37A:
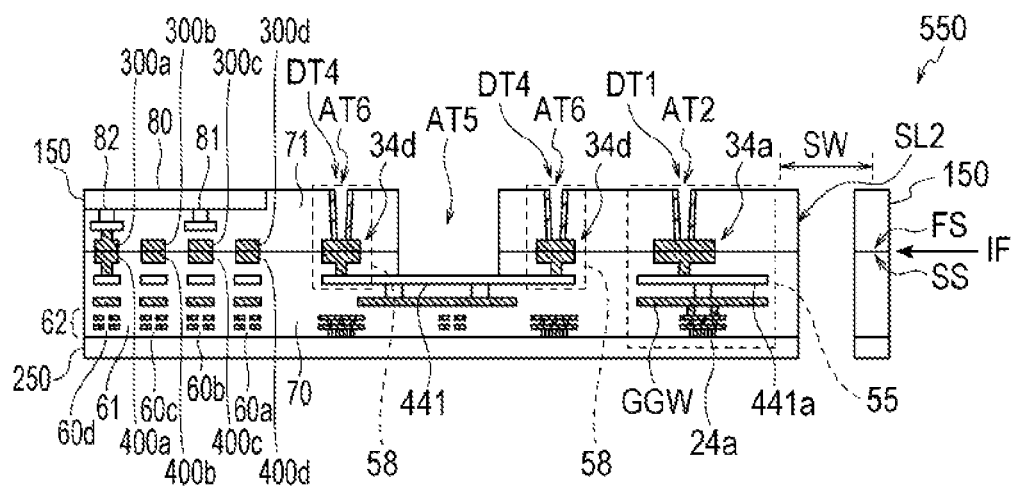
FIGS. 37A and 37B are (twelfth) explanatory diagrams illustrating an example of the manufacturing method of the semiconductor device of the seventh embodiment to which the present technology is applied.
Figure 37B:
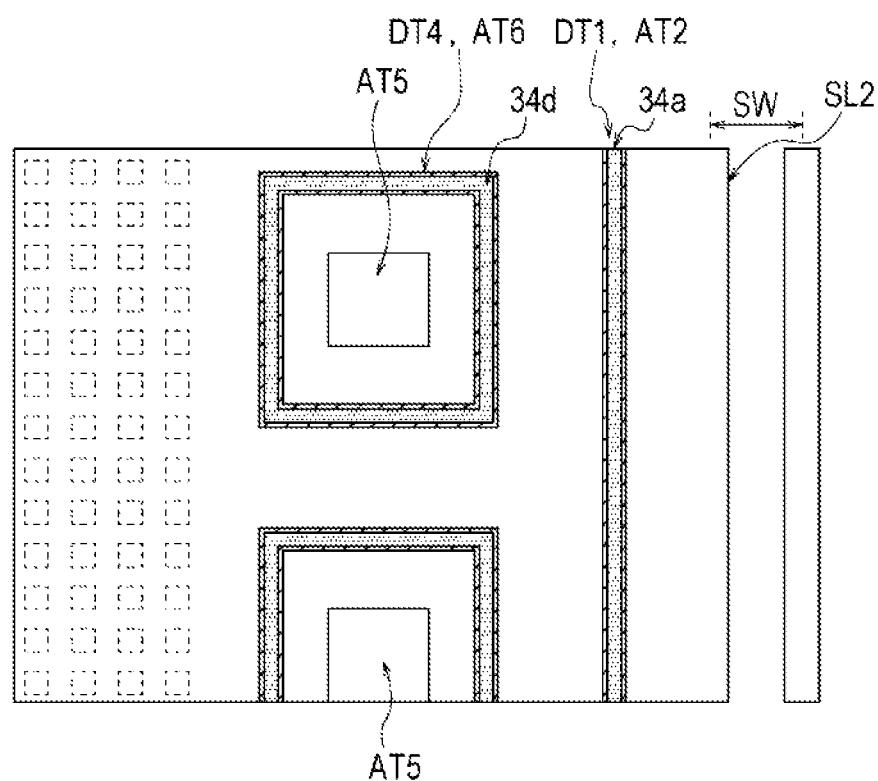

Next, as illustrated in FIGS. 37A and 37B, in the semiconductor device 550, the scribe line width SW (the dicing area) is diced with the dicing blade DB, and thus, is diced for each semiconductor device. In this case, in the semiconductor device 550, the moisture easily infiltrates from the end surface of a scribe line SL2. However, the fifteenth guard ring unit 55 is provided inside the scribe line SL2 formed to surround at least a part of the circumference of the semiconductor device 550, and is consecutively formed by the fifteenth guard ring unit 55. With this arrangement, the semiconductor device 550 is capable of preventing or reducing the infiltration of the moisture from the end surfaces of the first semiconductor substrate 150 and the second semiconductor substrate 250 or the junction interface IF between the first semiconductor substrate 150 and the second semiconductor substrate 250.

In addition, an opening portion AT6 forms a groove DT4. An eighteenth guard ring unit 58 includes the groove DT4 as the first guard ring, the third guard ring 34d, and the power source pad 441.

The eighteenth guard ring unit 58 is provided to surround the opening portion AT5 of the power source pad 441 formed in at least a part of the circumference of the semiconductor device 550. In this case, the eighteenth guard ring unit 58 is formed to surround the opening portion AT5 of the power source pad 441. For this reason, the semiconductor device 550 is capable of preventing or reducing the infiltration of the moisture from the opening portion AT5, and thus, it is possible to prevent or reduce the corrosion in the semiconductor device 550. Furthermore, the opening portion AT5 of the power source pad 41 surrounded by the eighteenth guard ring unit 58 is not limited to one.

Figure 38A:
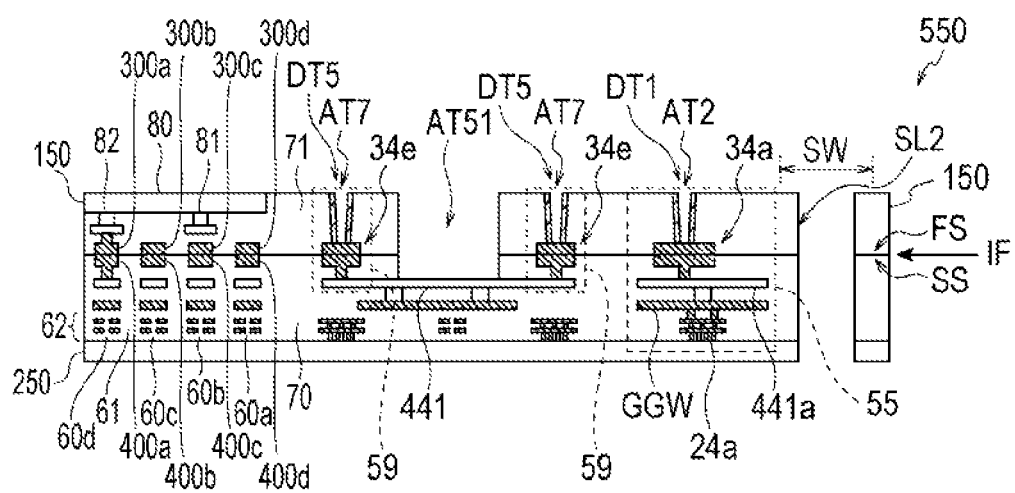
FIGS. 38A and 38B are (thirteenth) explanatory diagrams illustrating an example of the manufacturing method of the semiconductor device of the seventh embodiment to which the present technology is applied.
Figure 38B:
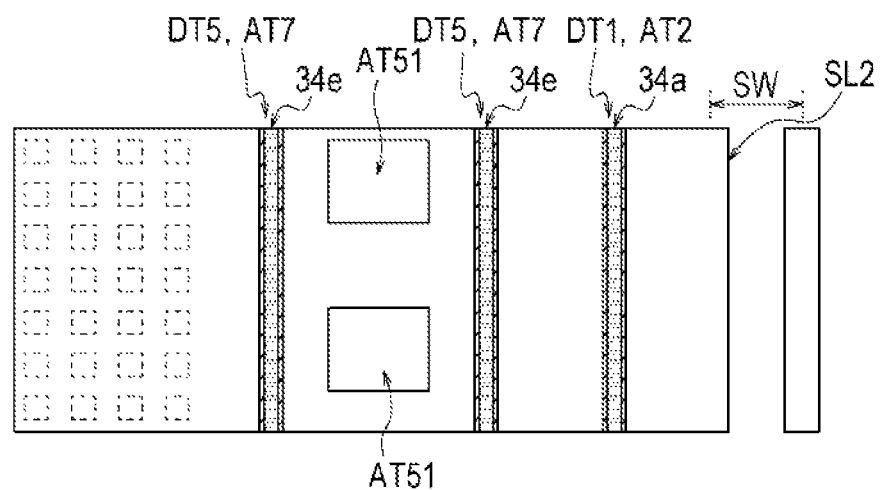

As illustrated in FIGS. 38A and 38B, in the semiconductor device 550, a nineteenth guard ring unit 59 may be provided to surround a plurality of opening portions AT51 formed in at least a part of the circumference of the semiconductor device 550. In this case, similarly, the semiconductor device 550 is capable of preventing or reducing the infiltration of the moisture from the plurality of opening portions AT51, and thus, it is possible to prevent or reduce the corrosion in the semiconductor device 550. Furthermore, the opening portion AT51 is formed for each power source pad 441, but is not limited thereto.

In this case, an opening portion AT7 forms a groove DT5. The nineteenth guard ring unit 59 includes the groove DT5 as the first guard ring, a third guard ring 34e, and the power source pad 441.

Furthermore, it is not necessary that the fifteenth guard ring unit 55, the sixteenth guard ring unit 56, the seventeenth guard ring unit 57, the eighteenth guard ring unit 58, and the nineteenth guard ring unit 59 are formed into the shape of a ring, and for example, the fifteenth guard ring unit 55, the sixteenth guard ring unit 56, the seventeenth guard ring unit 57, the eighteenth guard ring unit 58, and the nineteenth guard ring unit 59 may be partially formed.

Thus, the semiconductor device 1 of the first embodiment according to the present technology can be manufactured according to the second example of the manufacturing method of the semiconductor device 550 of the seventh embodiment.

In addition, in the manufacturing method of the semiconductor device 550 of the seventh embodiment according to the present technology, the third guard ring 34a, the third guard ring 34b, the third guard ring 34c, the third guard ring 34d, and the third guard ring 34e are electrically connected (conductively connected) to the power source pad 441 or the power source pad 441a, but are not limited thereto.

Figure 39A:
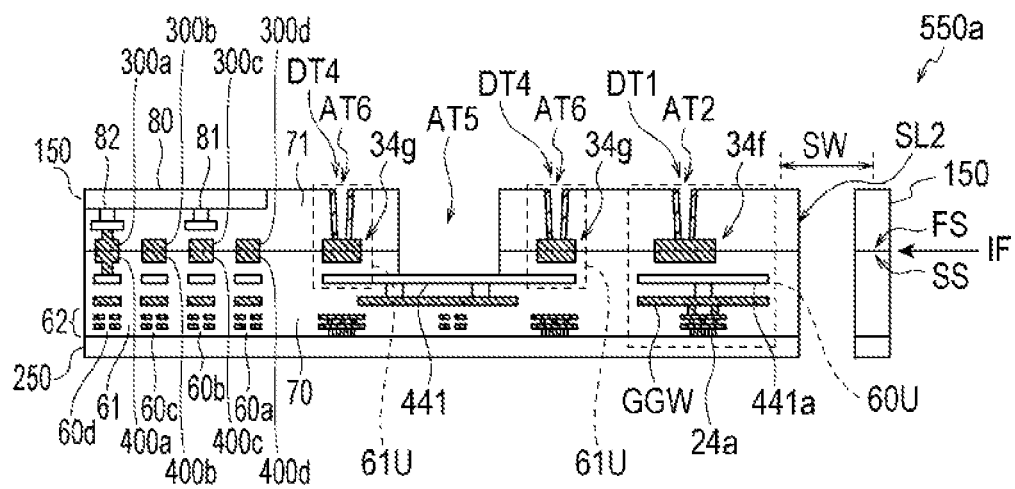
FIGS. 39A and 39B are (first) explanatory diagrams illustrating a case where a third guard ring is not conductively connected to a power source pad, in a semiconductor device manufactured by the manufacturing method of the semiconductor device of the seventh embodiment.
Figure 39B:
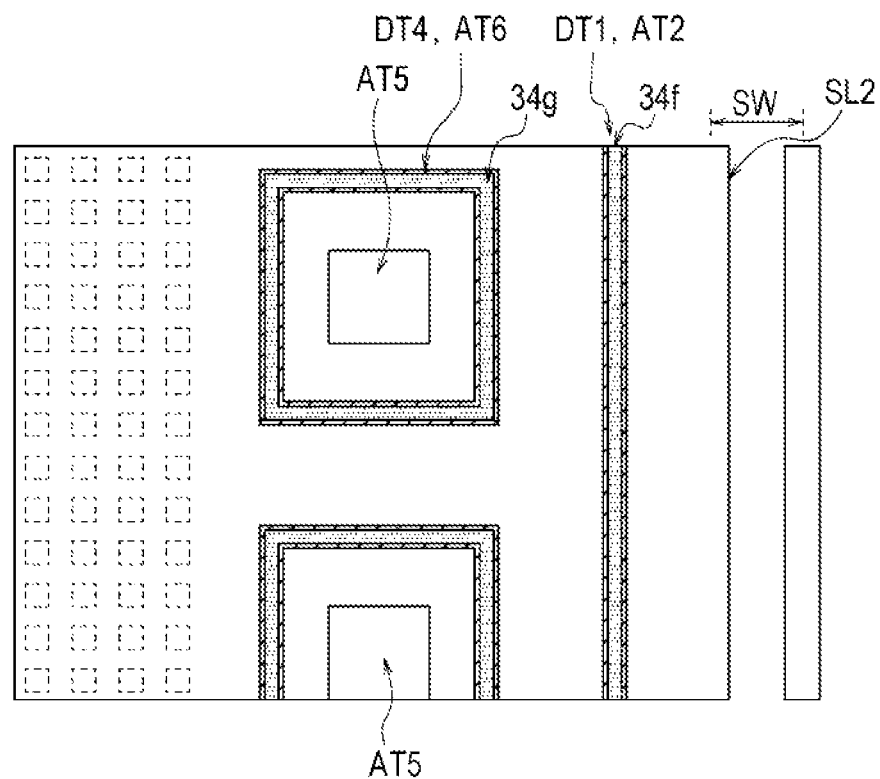

FIGS. 39A and 39B are explanatory diagrams illustrating a case where a third guard ring 34f and a third guard ring 34g are not conductively connected to the power source pad 441 and the power source pad 441a, in a semiconductor device 550a manufactured by the manufacturing method of the semiconductor device of the seventh embodiment according to the present technology.

A twentieth guard ring unit 60U includes the groove DT1 as the first guard ring, the third guard ring 34f, the power source pad 441a, the global wiring GGW, and the second guard ring 24a. A twenty-first guard ring unit 61U includes the groove DT4 as the first guard ring, the third guard ring 34g, and the power source pad 441.

As illustrated in FIGS. 39A and 39B, the third guard ring 34f and the third guard ring 34g are not connected to the power source pad 441 and the power source pad 441a. That is, the third guard ring 34f is not conductively connected to the power source pad 441a. In addition, the third guard ring 34g is not conductively connected to the power source pad 441.

Figure 40A:
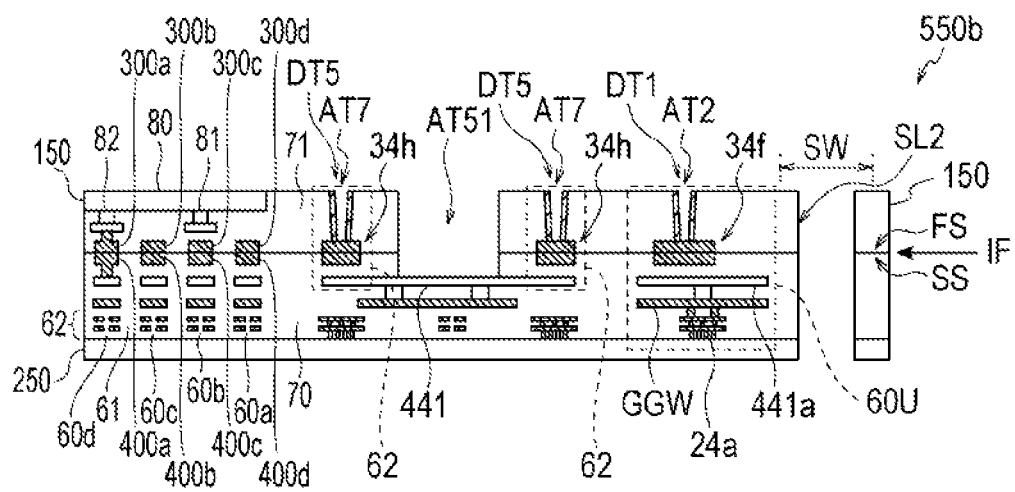
FIGS. 40A and 40B are (second) explanatory diagrams illustrating a case where the third guard ring is not conductively connected to the power source pad, in the semiconductor device manufactured by the manufacturing method of the semiconductor device of the seventh embodiment.
Figure 40B:
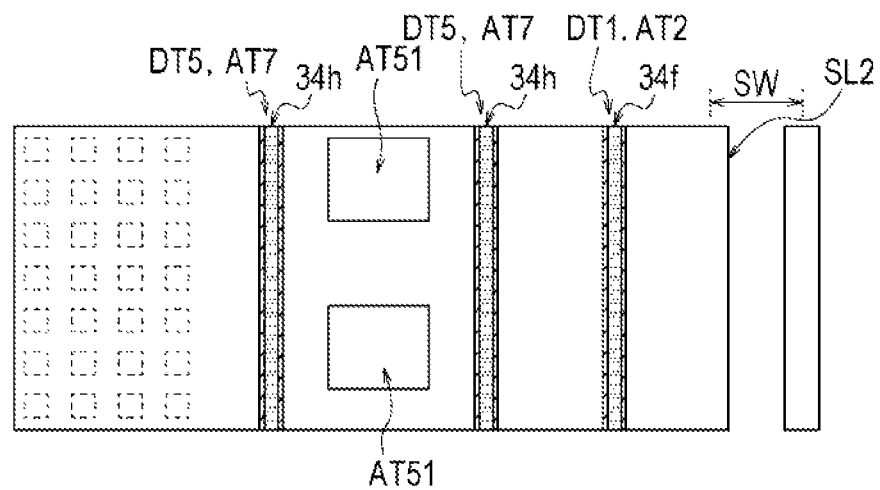

FIGS. 40A and 40B are explanatory diagrams illustrating a case where the third guard ring 34f and a third guard ring 34h are not conductively connected to the power source pad 441 and the power source pad 441a, in the semiconductor device 550b manufactured by the manufacturing method of the semiconductor device of the seventh embodiment according to the present technology.

The twentieth guard ring unit 60U includes the groove DT1 as the first guard ring, the third guard ring 34f, the power source pad 441a, the global wiring GGW, and the second guard ring 24a. The twenty-first guard ring unit 62 includes the groove DT5 as the first guard ring, the third guard ring 34h, and the power source pad 441. The twenty-first guard ring unit 62 is formed to surround the plurality of opening portions AT51.

As with FIGS. 39A and 39B, the third guard ring 34f the third guard ring 34h are not connected to the power source pad 441 and the power source pad 441a, in FIGS. 40A and 40B. That is, the third guard ring 34f is not conductively connected to the power source pad 441a. In addition, the third guard ring 34h is not also conductively connected to the power source pad 441.

Thus, in the case of trying to avoid the electrical connection of the guard ring unit, the third guard ring 34f, the third guard ring 34g, and the third guard ring 34h are not capable of being connected to the power source pad 441 and the power source pad 441a.

9. Eighth Embodiment (Sixth Example of Semiconductor Device)

A semiconductor device of an eighth embodiment according to the present technology, is a semiconductor device in which the guard ring unit is provided inside the scribe line formed to surround at least a part of the circumference of the semiconductor device, and the first guard ring is inconsecutively formed, in the semiconductor device of the first embodiment. In this case, the first guard ring, for example, can be formed at a predetermined interval, along the scribe line.

For example, in the semiconductor device 550 manufactured by the manufacturing method of the semiconductor device of the seventh embodiment according to the present technology, the groove DT1, the groove DT2, and the groove DT3, configuring the first guard ring, are consecutively formed into the shape of a ring. However, the configuration is not limited thereto.

Figure 41A:
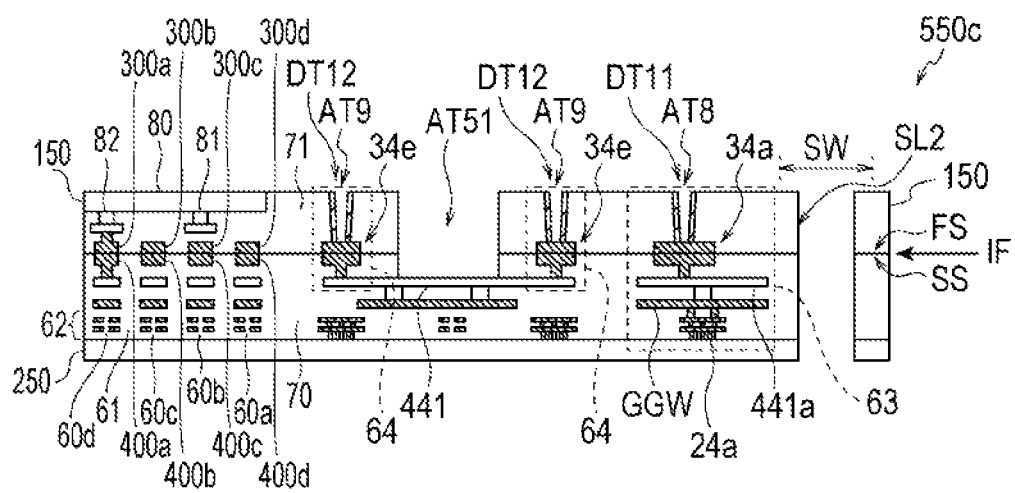
FIGS. 41A and 41B are (first) explanatory diagrams illustrating a semiconductor device that is an example of a semiconductor device of an eighth embodiment according to the present technology.
Figure 41B:
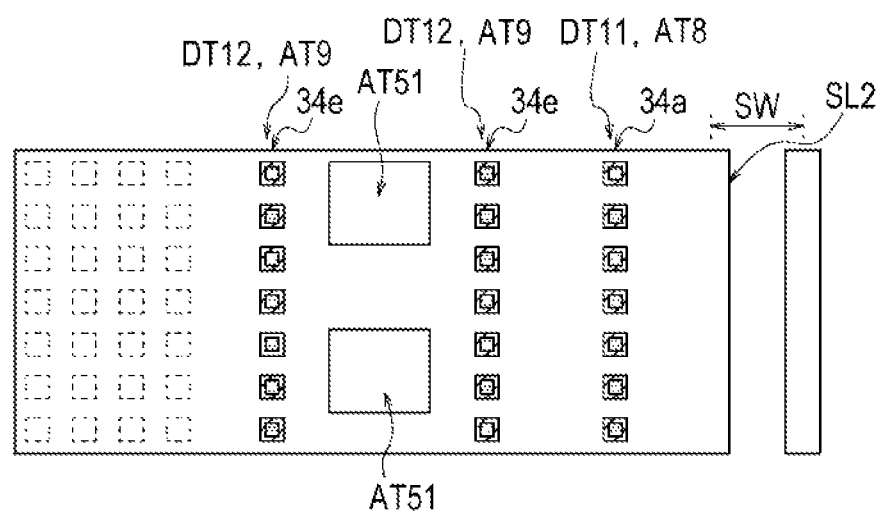

FIGS. 41A and 41B illustrate a semiconductor device 550c that is an example of the semiconductor device of the eighth embodiment according to the present technology. FIG. 41A illustrates the sectional view of the semiconductor device 550c, and FIG. 41B illustrates the plan view of the semiconductor device 550c.

As illustrated in FIGS. 41A and 41B, in the semiconductor device 550c of the eighth embodiment, a plurality of grooves DT11 and a plurality of grooves DT12, configuring the first guard ring, are respectively inconsecutively formed at a predetermined interval. In this case, the plurality of grooves DT11 configure the first guard ring, and the plurality of grooves DT12 configure the first guard ring.

Here, the groove DT11 is formed for each opening portion AT8, and the groove DT12 is formed for each opening portion AT9. A twenty-second guard ring unit 63 includes the plurality of grooves DT11 as the first guard ring, the third guard ring 34a, the power source pad 441a, the global wiring GGW, and the second guard ring 24a. A twenty-third guard ring unit 64 includes the plurality of grooves DT12 as the first guard ring, the third guard ring 34e, and the power source pad 441.

With this arrangement, the twenty-second guard ring unit 63 is provided inside the scribe line SL2 formed to surround at least a part of the circumference of the semiconductor device 550a, and the plurality of grooves DT11 configuring the first guard ring, are inconsecutively formed. In addition, the twenty-third guard ring unit 64 is formed to surround the plurality of opening portions AT51 by the plurality of grooves DT12. Then, the plurality of grooves DT12 configuring the first guard ring, are inconsecutively formed.

In FIGS. 41A and 41B, the plurality of grooves DT11 and the plurality of grooves DT12 respectively have an approximately square shape, but are not limited thereto. Furthermore, the approximately square shape includes a square shape, and can be a quadrangular shape in which a difference between a long side and a short side of a quadrangular shape, for example, is within 10%.

Figure 42A:
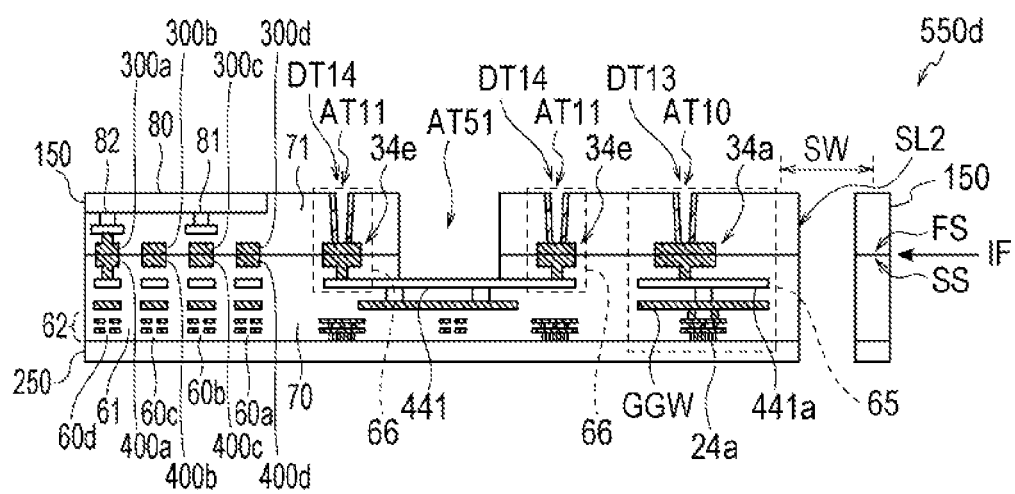
FIGS. 42A and 42B are (second) explanatory diagrams illustrating the semiconductor device that is an example of the semiconductor device of the eighth embodiment according to the present technology.
Figure 42B:
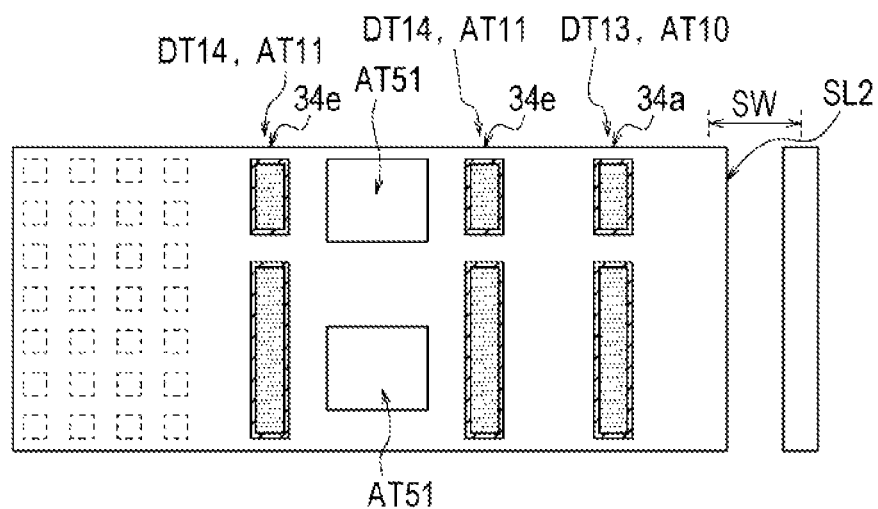

FIGS. 42A and 42B illustrate a semiconductor device 550d that is an example of the semiconductor device of the eighth embodiment according to the present technology. FIG. 42A illustrates the sectional view of the semiconductor device 550d, and FIG. 42B illustrates the plan view of the semiconductor device 550d.

As illustrated in FIGS. 42A and 42B, in the semiconductor device 550d of the eighth embodiment according to the present technology, a plurality of grooves DT13 configuring the first guard ring, and a plurality of grooves DT14 configuring the first guard ring, are respectively formed into the shape of a rectangle, along the scribe line SL2.

In this case, the groove DT13 is formed for each opening portion AT10, and the groove DT14 is formed for each opening portion AT11. A twenty-fourth guard ring unit 65 includes the plurality of grooves DT13 as the first guard ring, the third guard ring 34a, the power source pad 441a, the global wiring GGW, and the second guard ring 24a. A twenty-fifth guard ring unit 66 includes the plurality of grooves DT14 as the first guard ring, the third guard ring 34e, and the power source pad 441.

With this arrangement, the twenty-fourth guard ring unit 65 is provided inside the scribe line SL2 formed to surround at least a part of the circumference of the semiconductor device 550d, and the plurality of grooves DT13 as the first guard ring, are inconsecutively formed. In addition, the twenty-fifth guard ring unit 66 is formed to surround the plurality of opening portions AT51 by the plurality of grooves DT14 as the first guard ring, and the third guard ring 34e. Then, the plurality of grooves DT14 configuring the first guard ring, are discontinuously formed.

As described above, in the semiconductor device (the semiconductor device 550c and the semiconductor device 550d) of the eighth embodiment according to the present technology, the twenty-fourth guard ring unit 65 and the twenty-fifth guard ring unit 66 are formed to surround at least a part of the circumference of the semiconductor device (the semiconductor device 550c and the semiconductor device 550d), and are provided inside the scribe line SL2. In addition, the groove DT11, the groove DT12, the groove DT13, and the groove DT14, as the first guard ring, are inconsecutively formed. In addition, the twenty-fifth guard ring unit 66 is formed to surround the plurality of opening portions AT51. In this case, the plurality of grooves DT14 are formed to surround the plurality of opening portions AT51.

Furthermore, in the semiconductor device (the semiconductor device 550c and the semiconductor device 550d), the groove DT1, the groove DT2, the groove DT3, the groove DT4, the groove DT5, the groove DT11, the groove DT12, the groove DT13, and the groove DT14, configuring the first guard ring, are formed by being opened, but are not limited thereto.

Figure 43A:
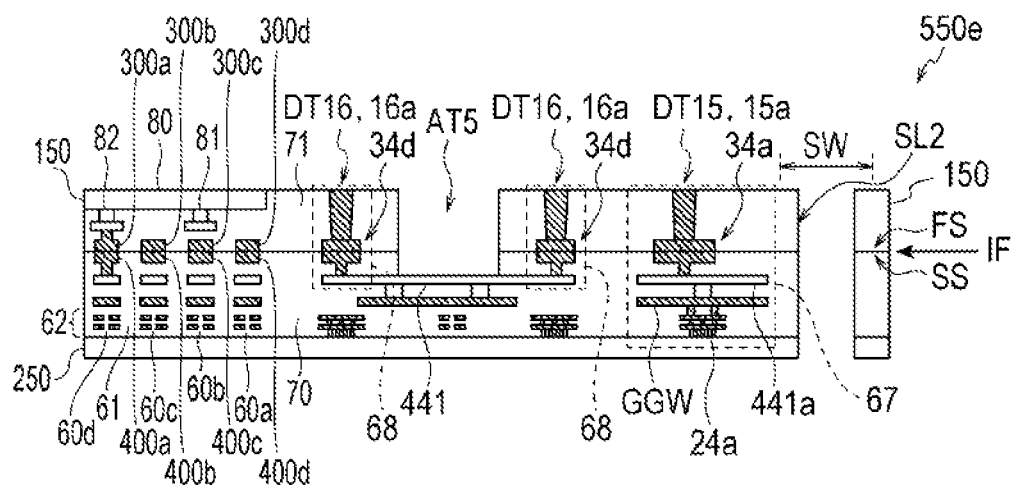
FIGS. 43A and 43B are (third) explanatory diagrams illustrating the semiconductor device that is an example of the semiconductor device of the eighth embodiment according to the present technology.
Figure 43B:
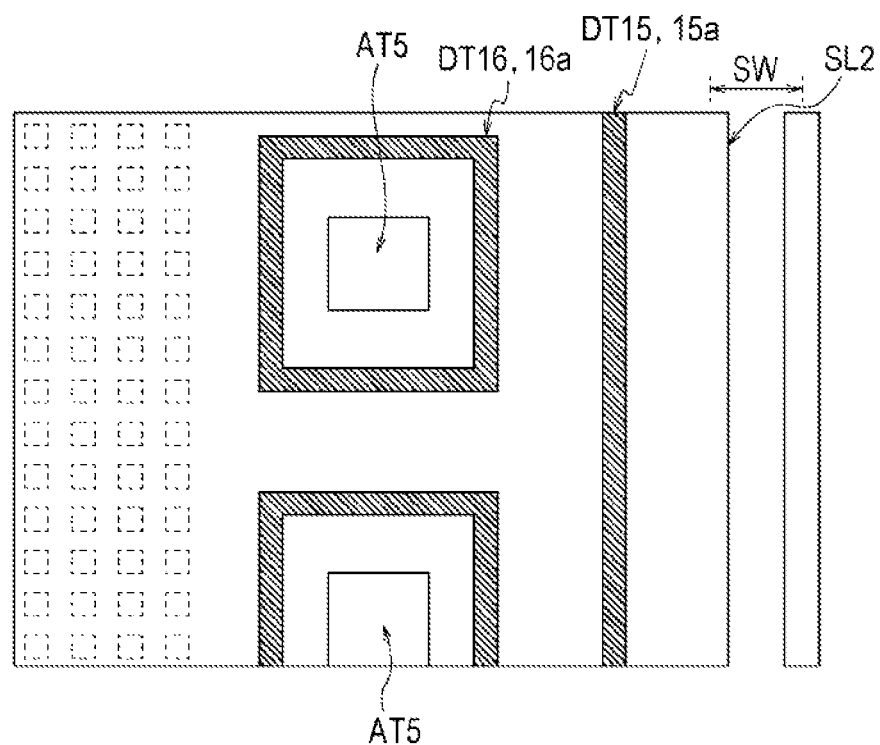

FIGS. 43A and 43B illustrate a semiconductor device 550e that is an example of the semiconductor device of the eighth embodiment according to the present technology. FIG. 43A illustrates the sectional view of the semiconductor device 550e, and FIG. 43B illustrates the plan view of the semiconductor device 550e.

As illustrated in FIGS. 43A and 43B, in the semiconductor device 550e of the eighth embodiment according to the present technology, copper (Cu) is embedded in a groove DT15 and a groove DT16, and thus, the first guard ring is formed. Furthermore, the groove DT15 includes an opening portion 15a, and the groove DT16 includes an opening portion 16a.

In this case, a twenty-sixth guard ring unit 67 includes the groove DT15 as the first guard ring, the third guard ring 34a, the power source pad 441a, the global wiring GGW, and the second guard ring 24a. In addition, a twenty-seventh guard ring unit 68 includes the groove DT16 as the first guard ring, the third guard ring 34d, and the power source pad 441.

In this case, the groove DT16 in which copper (Cu) is embedded, is formed to surround the opening portion AT5.

Figure 44A:
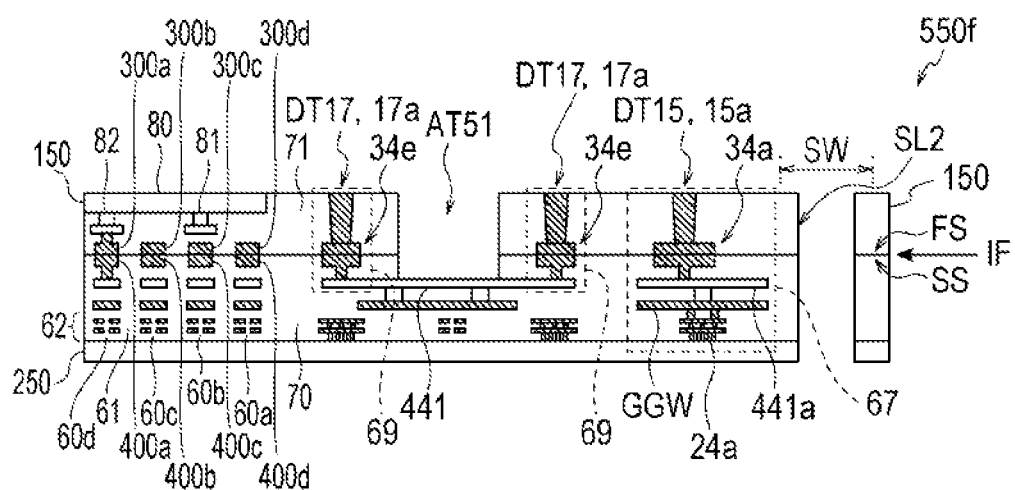
FIGS. 44A and 44B are (fourth) explanatory diagrams illustrating the semiconductor device that is an example of the semiconductor device of the eighth embodiment according to the present technology.
Figure 44B:
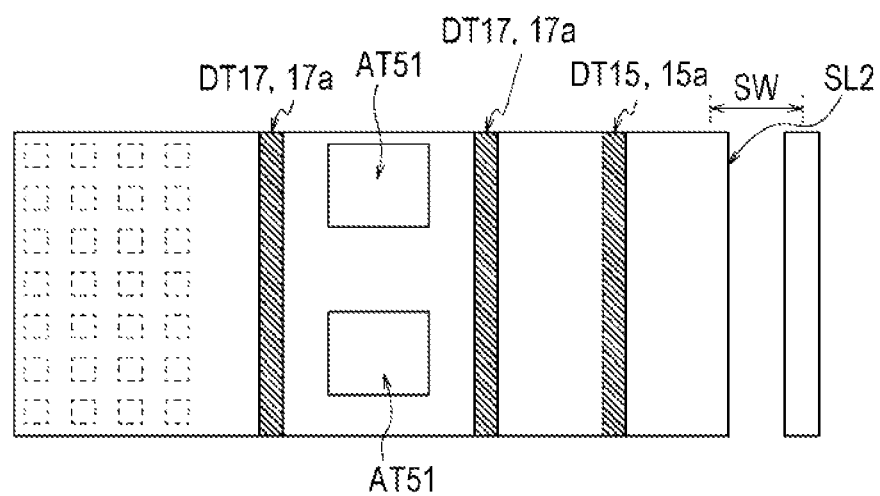

FIGS. 44A and 44B illustrate a semiconductor device 550f that is an example of the semiconductor device of the eighth embodiment according to the present technology.

FIG. 44A illustrates the sectional view of the semiconductor device 550f, and FIG. 44B illustrates the plan view of the semiconductor device 550f.

As illustrated in FIGS. 44A and 44B, in the semiconductor device 550f of the eighth embodiment according to the present technology, copper (Cu) is embedded in the groove DT15, and thus, the first guard ring is formed, and copper (Cu) is embedded in a groove DT17, and thus, the first guard ring is formed. The groove DT15 includes the opening portion 15a, and the groove DT17 includes an opening portion 17a.

In this case, a twenty-eighth guard ring unit 69 includes the groove DT17 as the first guard ring, the third guard ring 34e, and the power source pad 441. In addition, the twenty-eighth guard ring unit 69 is formed to surround the plurality of opening portions AT51. In addition, the groove DT17 is formed to surround the plurality of opening portions AT51, and the third guard ring 34e is also formed to surround the plurality of opening portions AT51.

Furthermore, the shape of the first guard ring is not limited to the shape of a groove.

Figure 45A:
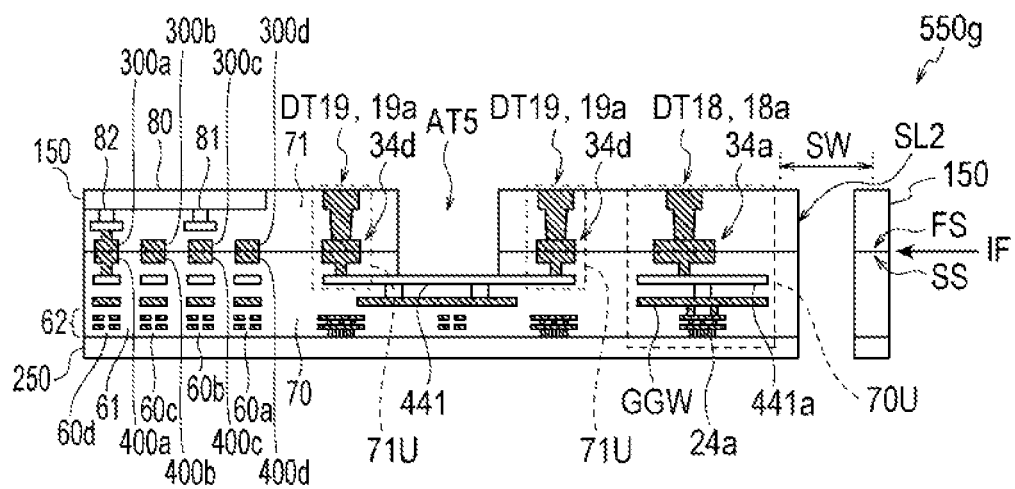
FIGS. 45A and 45B are (fifth) explanatory diagrams illustrating the semiconductor device that is an example of the semiconductor device of the eighth embodiment according to the present technology.
Figure 45B:
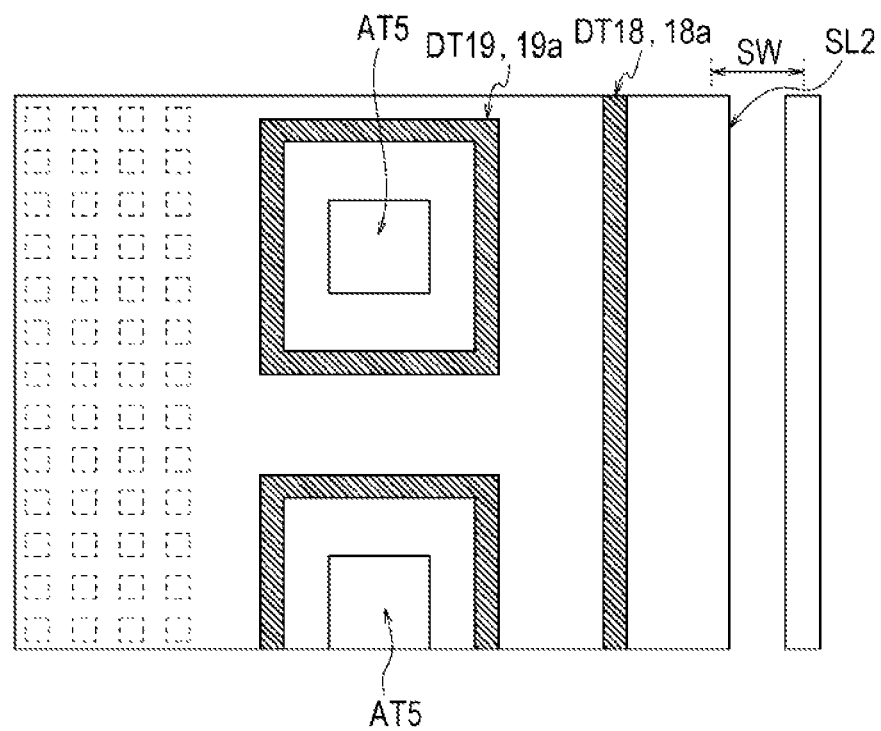

FIGS. 45A and 45B illustrate a semiconductor device 550g that is an example of the semiconductor device of the eighth embodiment according to the present technology. FIG. 45A illustrates the sectional view of the semiconductor device 550g, and FIG. 45B illustrates the plan view of the semiconductor device 550g.

As illustrated in FIGS. 45A and 45B, in the semiconductor device 550g of the eighth embodiment according to the present technology, copper (Cu) is embedded in a groove DT18 and a groove DT19, and thus, the first guard ring is formed. Furthermore, the groove DT18 includes an opening portion 18a, and the groove DT19 includes an opening portion 19a. In addition, in the groove DT18 and the groove DT19, an opening side is wider than that of the shape of a groove.

In this case, a twenty-ninth guard ring unit 70U includes the groove DT18 as the first guard ring, the third guard ring 34a, the power source pad 441a, the global wiring GGW, and the second guard ring 24a. A thirtieth guard ring unit 71U includes the groove DT19 as the first guard ring, the third guard ring 34d, and the power source pad 441. The thirtieth guard ring unit 71U is formed to surround the opening portion AT5. The groove DT19 and the third guard ring 34d are formed to surround the opening portion AT5.

Furthermore, the shape of the opening side is widened as the first guard ring, and thus, for example, durability with respect to an inner crack, and an effect of preventing or reducing the infiltration of the moisture can be expected. Furthermore, the shape of the first guard ring is not limited thereto, and the first guard ring is capable of having an arbitrary shape insofar as the first guard ring is in a shape where a resist can be patterned by a general lithography technology.

Figure 46A:
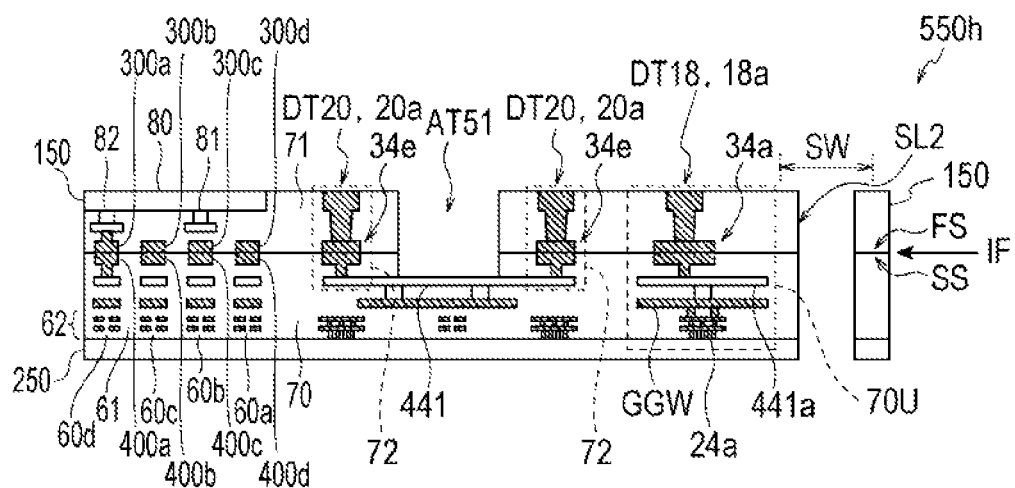
FIGS. 46A and 46B are (sixth) explanatory diagrams illustrating the semiconductor device that is an example of the semiconductor device of the eighth embodiment according to the present technology.
Figure 46B:
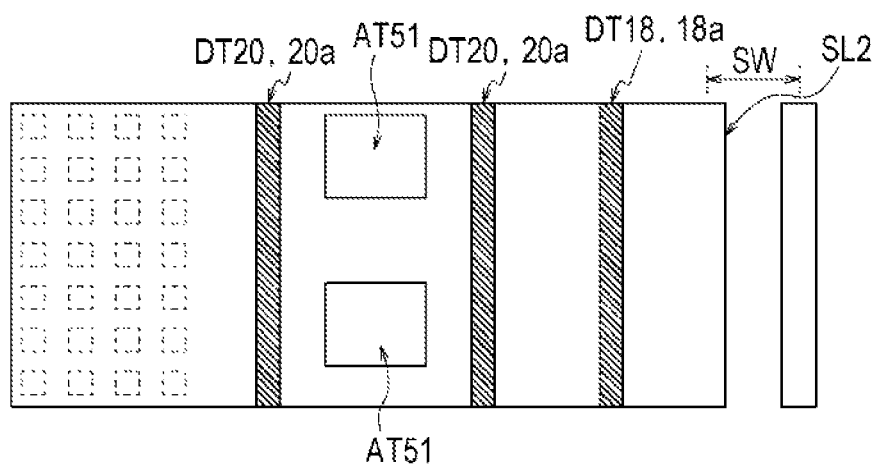

FIGS. 46A and 46B illustrate a semiconductor device 550h that is an example of the semiconductor device of the eighth embodiment according to the present technology. FIG. 46A illustrates the sectional view of the semiconductor device 550h, and FIG. 46B illustrates the plan view of the semiconductor device 550h.

As illustrated in FIGS. 46A and 46B, in the semiconductor device 550h of the eighth embodiment according to the present technology, copper (Cu) is embedded in the groove DT18 and a groove DT20, and thus, the first guard ring is formed. Furthermore, the groove DT18 includes the opening portion 18a, and the groove DT19 includes the opening portion 19a. In addition, in the groove DT18 and the groove DT19, an opening side is wider than that of the shape of a groove.

In this case, the twenty-ninth guard ring unit 70U includes the groove DT18 as the first guard ring, the third guard ring 34a, the power source pad 441a, the global wiring GGW, and the second guard ring 24a. A thirtieth guard ring unit 72 includes the groove DT20 as the first guard ring, the third guard ring 34e, and the power source pad 441. The thirtieth guard ring unit 72 is formed to surround the plurality of opening portions AT51. The groove DT20 and the third guard ring 34e are formed to surround the opening portion AT51.

Thus, in the semiconductor device (the semiconductor device 550g and the semiconductor device 550h) of the eighth embodiment according to the present technology, the shape of the groove of the first guard ring can be an arbitrary shape.

10. Ninth Embodiment (Seventh Example of Semiconductor Device)

A semiconductor device of a ninth embodiment according to the present technology, is a semiconductor device, including: at least two guard ring units adjacent to each other on the right and left, in which the at least two guard ring units are juxtaposed inside the scribe line formed to surround at least a part of the circumference of the semiconductor device, along the direction of the scribe line, the third guard rings of the adjacent guard ring units are inconsecutively formed along the scribe line, and the third guard rings adjacent to each other on the right and left, are asymmetric, in the semiconductor device of the first embodiment.

According to the semiconductor device of the ninth embodiment of the present technology, even in a case where an inner crack or chipping occurs, the third guard ring is capable of stopping the progress of the inner crack or the chipping, and thus, it is possible to improve the reliability of the quality of the semiconductor device.

FIG. 47 to FIG. 55B illustrate an example of the semiconductor device 1 of the ninth embodiment according to the present technology. FIG. 47 to FIG. 55B are explanatory diagrams illustrating an example of the semiconductor device 1 of the ninth embodiment according to the present technology. Furthermore, unless otherwise particularly noted, "up" indicates an upper direction in each of the drawings, and "left" indicates a left direction in each of the drawings.

Figure 47:
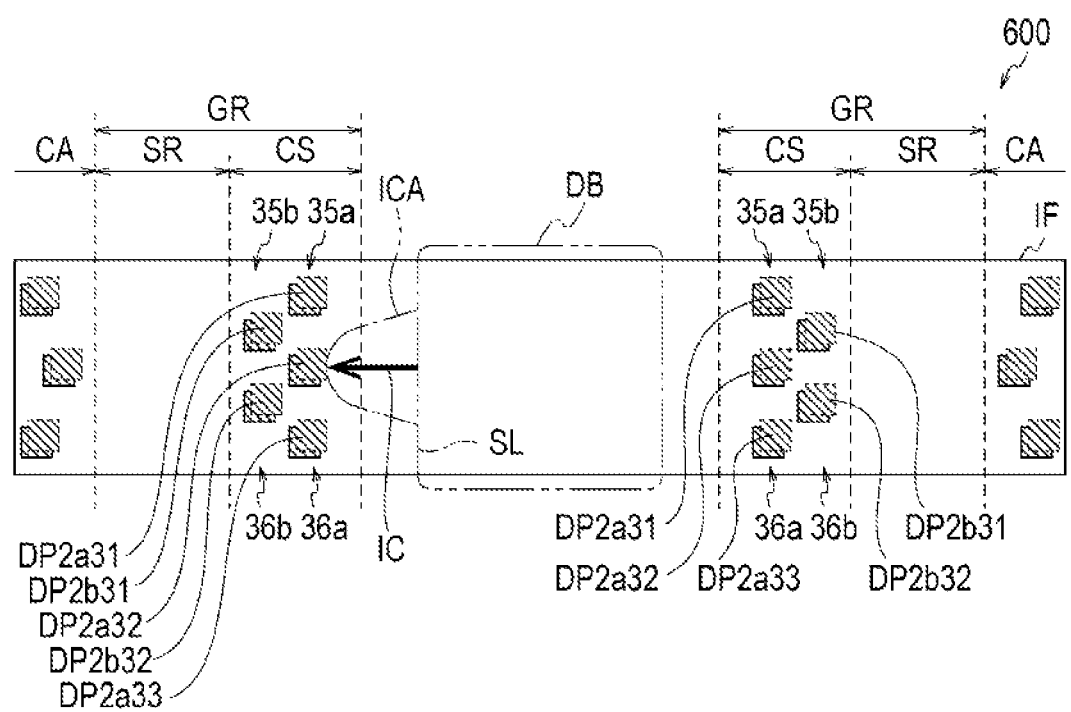
FIG. 47 is an explanatory diagram illustrating a semiconductor device that is an example of a semiconductor device of a ninth embodiment according to the present technology.

FIG. 47 illustrates the plan view of the junction interface IF at the time of dicing a semiconductor device 600. FIG. 47 illustrates the semiconductor device 600 that is an example of the semiconductor device of the ninth embodiment according to the present technology.

As illustrated in FIG. 47, the semiconductor device 600 of the ninth embodiment according to the present technology, includes at least two guard ring units of a guard ring unit 35a and a guard ring unit 35b adjacent to each other on the right and left, in the semiconductor device 1 of the first embodiment. Then, the at least two guard ring units of the guard ring unit 35a and the guard ring unit 35b are formed to surround at least a part of the circumference of the semiconductor device 600, and are juxtaposed inside the scribe line SL, along the scribe line SL, and a third guard ring 36a and a third guard ring 36b of the adjacent guard ring units of the guard ring unit 35a and the guard ring unit 35b, are inconsecutively formed along the scribe line SL, and the third guard ring 36a and the third guard ring 36b adjacent to each other on the right and left, are asymmetric.

In FIG. 47, the third guard ring 36a is inconsecutively formed by three second Cu dummies of a second Cu dummy DP2a31, a second Cu dummy DP2a32, and a second Cu dummy DP2a33, in the crack stopper region CS. The third guard ring 36b is inconsecutively formed by two second Cu dummies of a second Cu dummy DP2b31 and a second Cu dummy DP2b32.

Furthermore, a state where the third guard ring 36a and the third guard ring 36b are inconsecutively formed, indicates that the third guard ring 36a and the third guard ring 36b are not linearly connected to each other along the scribe line SL. That is, the state indicates that the third guard ring 31a and the third guard ring 31b respectively include a plurality of second Cu dummies, and each of the Cu dummies is formed into the shape of an island.

Then, in a case where the third guard ring 36a and the third guard ring 36b are inconsecutively formed, and the third guard ring 36a and the third guard ring 36b adjacent to each other on the right and left, are asymmetric, the third guard ring 36a and the third guard ring 36b are respectively capable of preventing or reducing the progress of an inner crack or chipping. Furthermore, an inner crack region ICA represents a range that is affected by an inner crack IC.

Figure 48A:
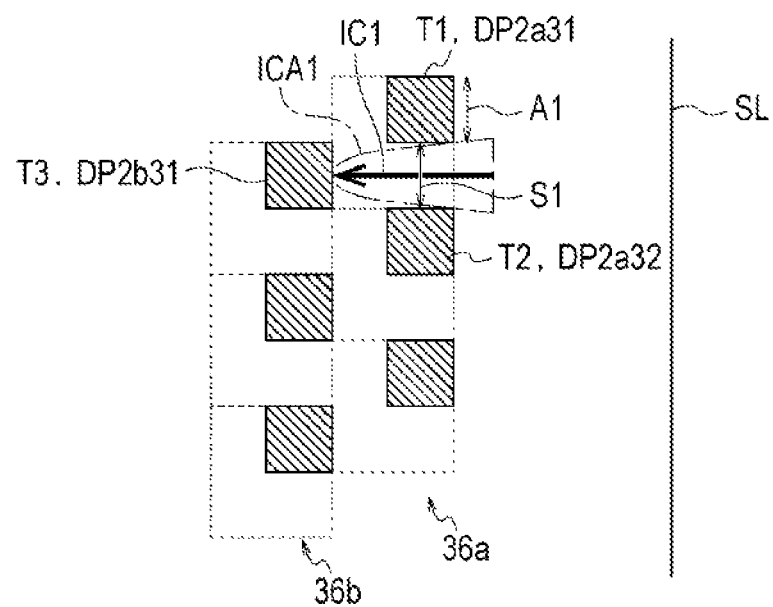
FIGS. 48A and 48B are explanatory diagrams illustrating an arrangement example of a third guard ring of the semiconductor device that is an example of the semiconductor device of the ninth embodiment according to the present technology.
Figure 48B:
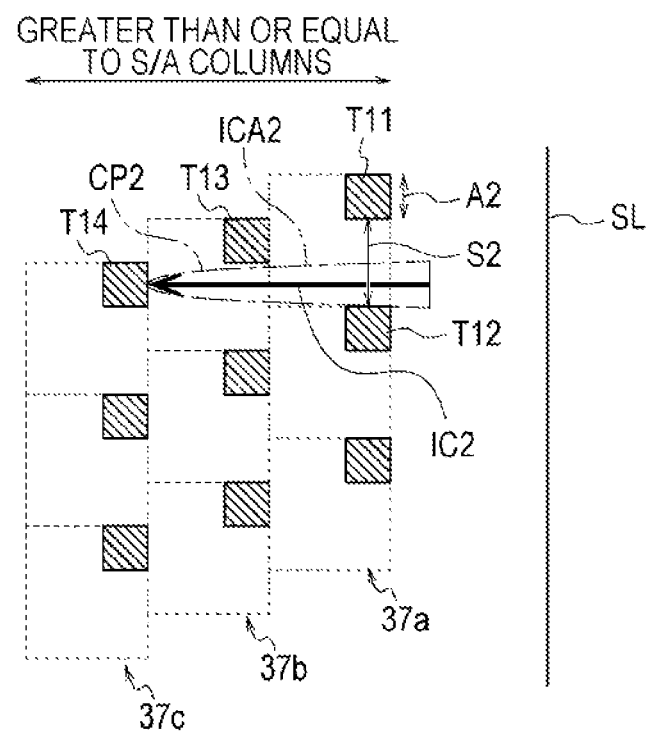

FIGS. 48A and 48B illustrate an example in which the third guard ring includes the plurality of second Cu dummies. Furthermore, FIG. 48A illustrates a case where the third guard ring 36a and the third guard ring 36b respectively include three second Cu dummies, and FIG. 48B illustrates a case where a third guard ring 37a, a third guard ring 37b, and a third guard ring 37c respectively include three second Cu dummies. Furthermore, FIG. 48A and FIG. 48B are plan views in which the plurality of second Cu dummies are formed on the junction interface, and a part thereof is displayed.

First, the principle that the third guard ring 36a stops an inner crack IC1, will be described by using FIG. 48A. For example, in the example of FIG. 48A, the width of a second Cu dummy T1 (DP2a31) along the scribe line SL, is set to A1, and the width between the second Cu dummy T1 (DP2a31) and a second Cu dummy T2 (DP2a32) along the scribe line SL, is set to S1. In this case, when the width S1 between the second Cu dummy T1 (DP2a31) and the second Cu dummy T2 (DP2a32), and the width A1 of the second Cu dummy T1 (DP2a31) are 1 to 1, two columns of the third guard ring 36a and the third guard ring 36b are formed in the plurality of second Cu dummies, and thus, the inner crack IC1 can be stopped.

For example, the inner crack IC1 progressing between the second Cu dummy T1 (DP2a31) and the second Cu dummy T2 (DP2a32), is stopped in a second Cu dummy T3 (DP2b31) on the left side in FIG. 48A.

In addition, in the example of FIG. 48B, the width of a second Cu dummy T11 along the scribe line SL, is set to A2, and a width between the second Cu dummy T11 and a second Cu dummy T12 along the scribe line SL, is set to S2. In this case, when the width S2 between the second Cu dummy T11 and the second Cu dummy T12, and the width A2 of the second Cu dummy T11 are 2 to 1, three columns of the third guard ring 37a, the third guard ring 37b, and the third guard ring 37c are formed in the plurality of second Cu dummies, and thus, an inner crack IC2 can be stopped.

For example, the inner crack IC2 progressing between the second Cu dummy T11 and the second Cu dummy T12, is stopped by a second Cu dummy T13 and a second Cu dummy T14 on the left side in FIG. 48B.

Therefore, in FIGS. 48A and 48B, the number of columns of the third guard ring, is set to the number of columns greater than a value that is obtained by dividing the width (S1, S2) between the second Cu dummies adjacent in an up and down direction by the width (A1, A2) of the second Cu dummy, and thus, the third guard ring is capable of stopping the inner crack IC1 and the inner crack IC2.

Thus, in the semiconductor device 600 of the ninth embodiment according to the present technology, in a case where the third guard ring 36a, the third guard ring 36b, a third guard ring 36c, the third guard ring 37a, the third guard ring 37b, and the third guard ring 37c are inconsecutively formed by the plurality of second Cu dummies, and the third guard rings adjacent to each other on the right and left, are asymmetric, a plurality of columns of the third guard rings are formed, and thus, it is possible to stop the inner crack IC1 and the inner crack IC2.

Next, the overall structure of the semiconductor device 600 of the ninth embodiment according to the present technology, will be described.

Figure 49A:
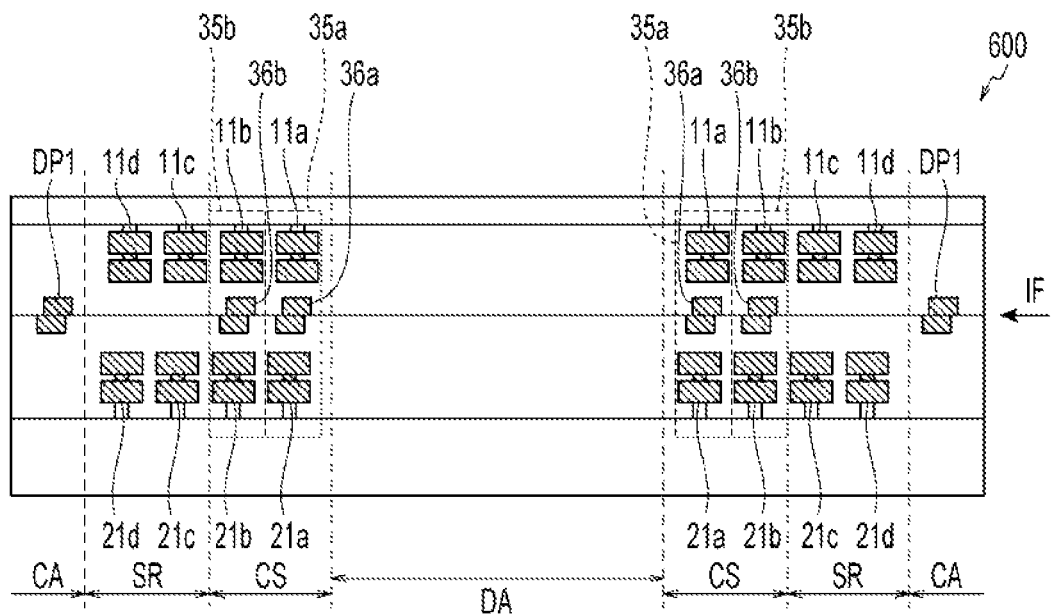
FIGS. 49A and 49B are explanatory diagrams illustrating the semiconductor device that is an example of the semiconductor device of the ninth embodiment according to the present technology.
Figure 49B:
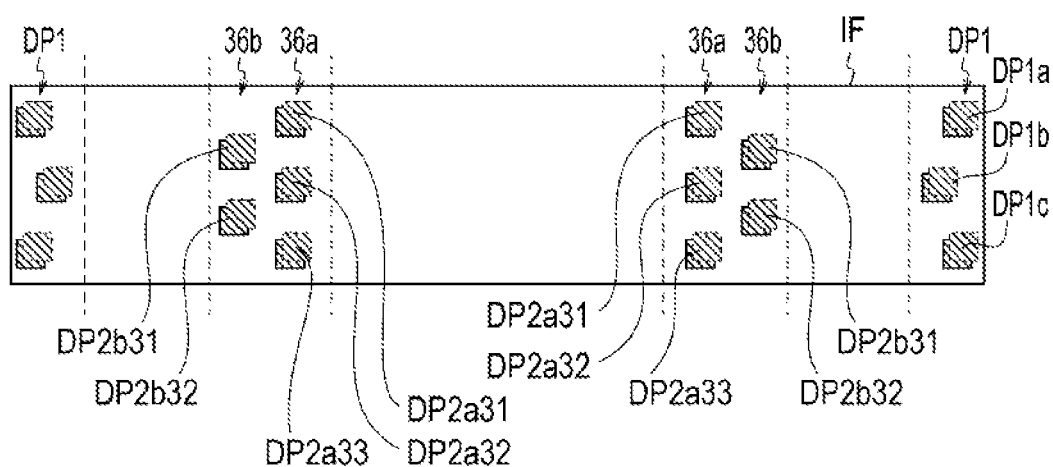

In FIGS. 49A and 49B, FIG. 49A illustrates the sectional view of the semiconductor device 600 of the ninth embodiment according to the present technology, and FIG. 49B illustrates the plan view of the junction interface IF of the semiconductor device 600 on which the third guard ring 31 is arranged.

As illustrated in FIG. 49A, the third guard ring 36a and the third guard ring 36b are formed, and the guard ring unit 35a and the guard ring unit 35b are formed, in the crack stopper region CS. Specifically, the guard ring unit 35a includes the first guard ring 11a, the second guard ring 21a, and the third guard ring 36a. The guard ring unit 35b includes the first guard ring 11b, the second guard ring 21b, and the third guard ring 36b. Furthermore, the third guard ring 36a is inconsecutively formed by three second Cu dummies of the second Cu dummy DP2a31, the second Cu dummy DP2a32, and the second Cu dummy DP2a33. The third guard ring 36b is inconsecutively formed by two second Cu dummies of the second Cu dummy DP2b31 and the second Cu dummy DP2b32.

The sealing region SR includes the first guard ring 11c and the first guard ring 11d, and includes the second guard ring 21c and the second guard ring 21d. Furthermore, three first Cu dummies DP1 (a first Cu dummy DP1a, a first Cu dummy DP1b, and a first Cu dummy DP1c) are formed in the chip region CA.

Figure 50A:
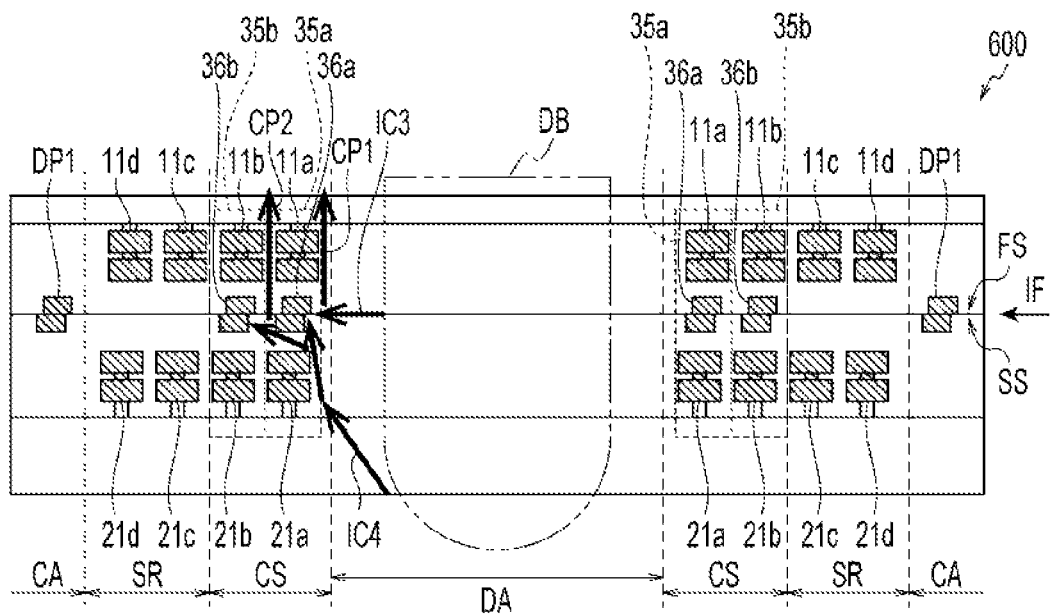
FIGS. 50A and 50B are explanatory diagrams illustrating a state in which a semiconductor device is cut by a dicing blade.
Figure 50B:
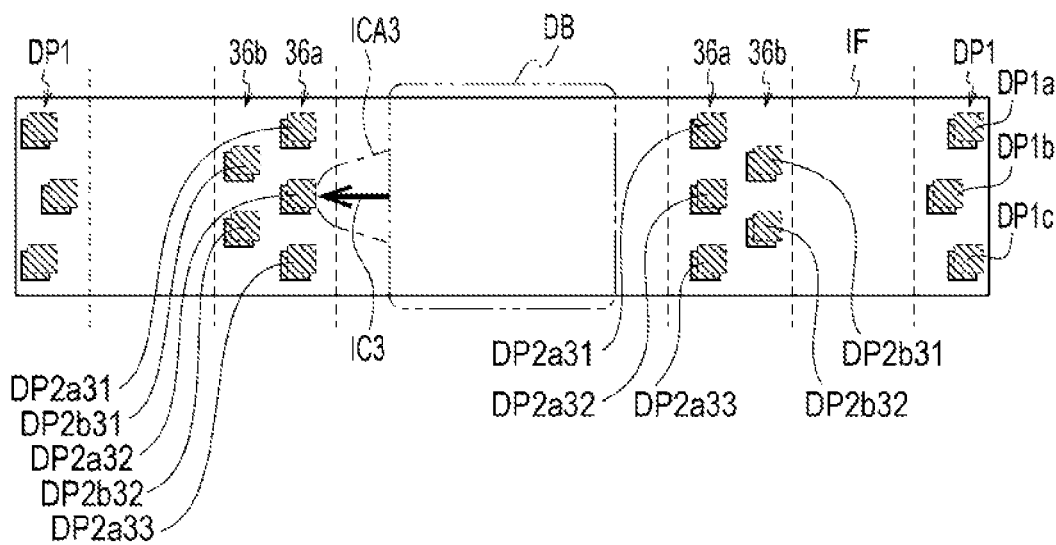

FIGS. 50A and 50B illustrate a state of dicing the semiconductor device 600 with the dicing blade DB as the semiconductor device of the ninth embodiment according to the present technology. FIG. 50A illustrates a sectional view in which the semiconductor device 600 of the ninth embodiment according to the present technology is machined by the dicing blade DB, and FIG. 50B illustrates the plan view of the junction interface IF on which the semiconductor device 600 of the ninth embodiment according to the present technology is machined by the dicing blade DB.

As illustrated in FIGS. 50A and 50B, the third guard ring 36a is inconsecutively formed by three second Cu dummies of the second Cu dummy DP2a31, the second Cu dummy DP2a32, and the second Cu dummy DP2a33, on the junction interface IF of the semiconductor device 600. In addition, the third guard ring 36b is inconsecutively formed by two second Cu dummies of the second Cu dummy DP2b31 and the second Cu dummy DP2b32. Then, in a case where the semiconductor device 600 is diced by the dicing blade DB, an inner crack IC3 and an inner crack IC4 are capable of occurring. In this case, an inner crack region ICA3 represents a range that is affected by the inner crack IC3.

Figure 51A:
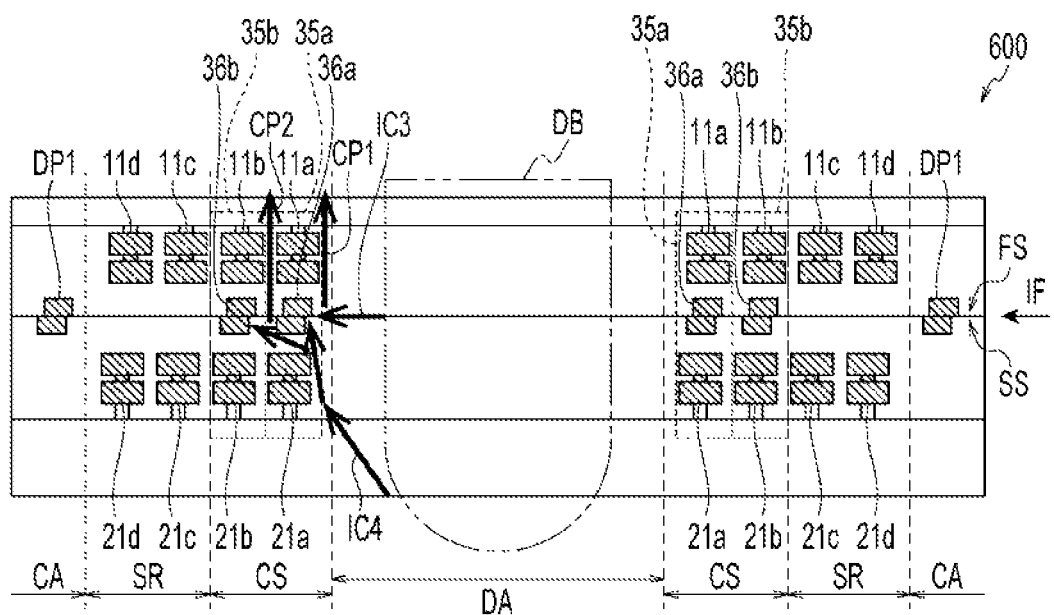
FIGS. 51A and 51B are explanatory diagrams illustrating a state of a case where a Cu dummy of the third guard ring stops an inner crack, in the semiconductor device of the ninth embodiment of the present technology.
Figure 51B:
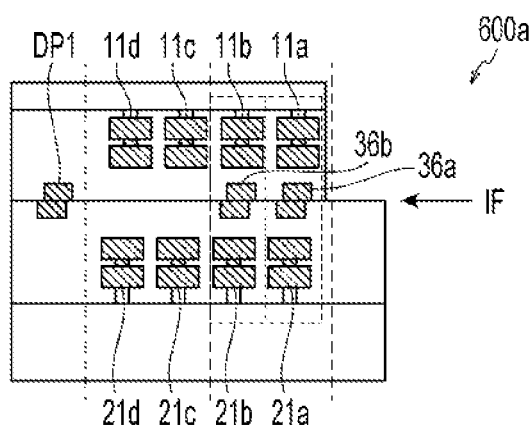

FIGS. 51A and 51B illustrate the state of a case where the third guard ring 36a and the third guard ring 36b stop the inner crack IC3 and the inner crack IC4, in the semiconductor device of the ninth embodiment of the present technology. FIG. 51A illustrates a sectional view in which the semiconductor device 600 is machined by the dicing blade DB, and FIG. 51B illustrates the sectional view of the junction interface IF of a semiconductor device 600a after being machined.

As illustrated in FIG. 51A, in a case where the semiconductor device 600 is diced by the dicing blade DB, the third guard ring 36a and the third guard ring 36b are capable of stopping the inner crack IC3 and the inner crack IC4.

Here, the third guard ring 36a stops the inner crack IC3, and generates chipping CP1. In addition, the third guard ring 36b stops the inner crack IC4, and generates chipping CP2. Furthermore, the third guard ring 36a and the third guard ring 36b are not limited to stopping the inner crack IC3 and the inner crack IC4 by any one of the third guard ring 36a and the third guard ring 36b. For example, there is a case where the inner crack IC4 is stopped, and the chipping CP2 is generated, by two third guard rings of the third guard ring 36a and the third guard ring 36b.

In addition, as illustrated in FIG. 51B, the third guard ring 36a and the third guard ring 36b stop the inner crack IC3 and the inner crack IC4 after the dicing, and thus, it is possible to perform the dicing in a state where the chip region CA is protected.

In this case, the chipping CP1 and the chipping CP2, illustrated in FIG. 51A, appear on the front surface of the semiconductor device 600, and thus, it is possible to determine that the chip region CA is not affected, and to determine the semiconductor device 600 as a non-defective product.

As described above, semiconductor device of the ninth embodiment of the present technology, is capable of stopping the progress of the inner crack IC or the chipping CP affecting the chip region CA. In addition, the inner crack is capable of appearing in the guard ring region on the front surface of the semiconductor device 600, as the chipping, and thus, an examination can be easily performed, the quality of the semiconductor device can be improved, and the cost of an examination device can also be reduced.

Furthermore, the semiconductor device of the ninth embodiment of the present technology, is not limited to such an embodiment. For example, a first region formed inside the scribe line SL, and a second region formed inside the scribe line SL and outside the first region, may be provided on the first semiconductor substrate and the second semiconductor substrate, and the adjacent guard ring units may be formed in at least any one of the first region or the second region. Specifically, the first region corresponds to the sealing region SR, and the second region corresponds to the crack stopper region CS.

For this reason, in the ninth embodiment, the third guard ring 36a and the third guard ring 36b can be formed in both of the sealing region SR and the crack stopper region CS.

Figure 52A:
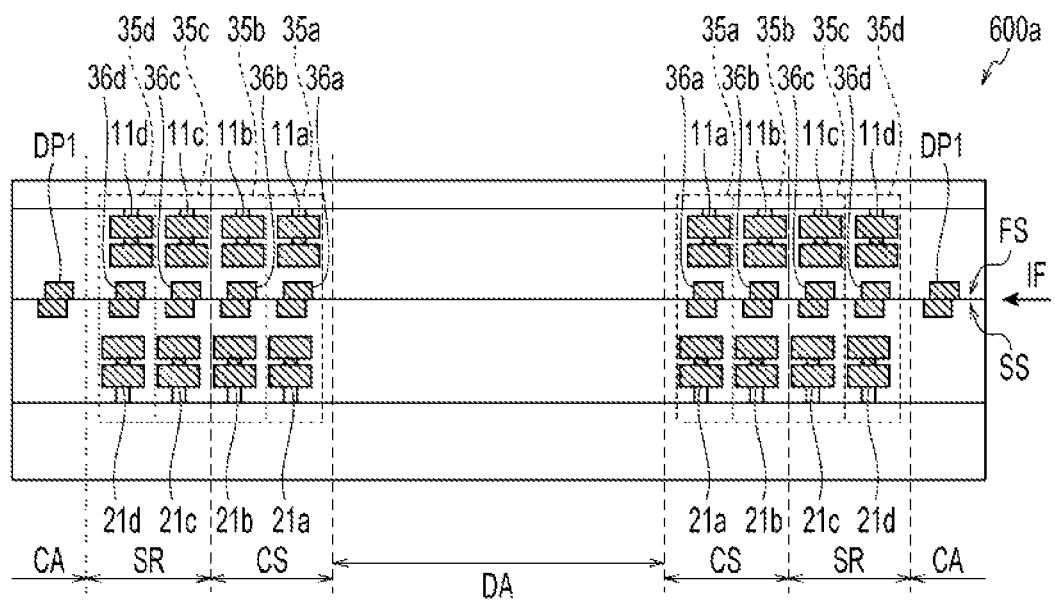
FIGS. 52A and 52B are explanatory diagrams illustrating the semiconductor device in which the third guard ring is formed in both of a sealing region and a crack stopper region, in the semiconductor device of the ninth embodiment.
Figure 52B:
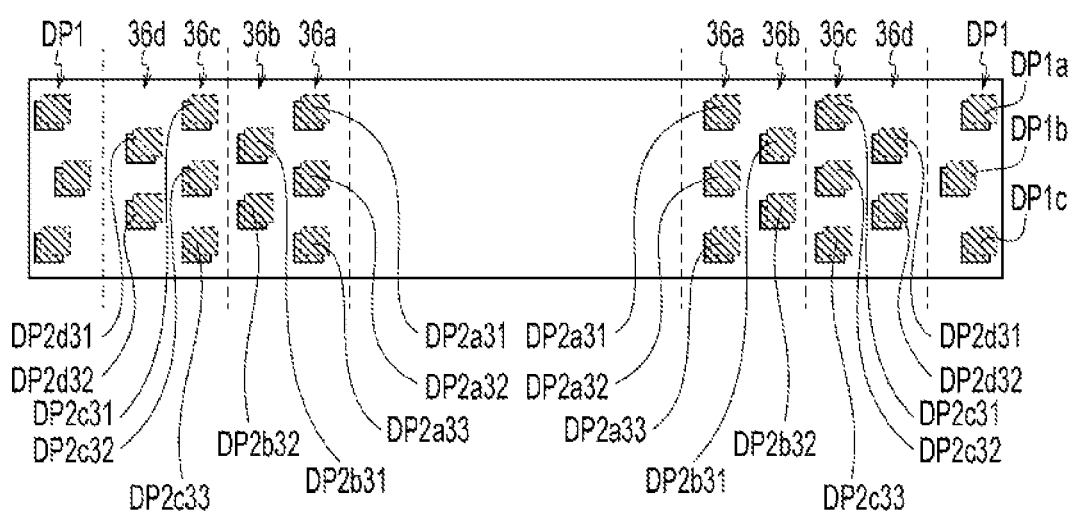

FIGS. 52A and 52B illustrate the semiconductor device 600a in which the third guard ring 36 is formed in both of the sealing region SR and the crack stopper region CS, in the semiconductor device of the ninth embodiment according to the present technology. FIG. 52A illustrates the sectional view of the semiconductor device 600a of the ninth embodiment according to the present technology, and FIG. 52B illustrates the plan view of the sealing region SR and the crack stopper region CS on the junction interface IF.

As illustrated in FIGS. 52A and 52B, the semiconductor device 600a includes the third guard ring 36c and a third guard ring 36d, including the plurality of second Cu dummies, not only in the crack stopper region CS, but also in the sealing region SR. That is, the third guard ring 36a, the third guard ring 36b, the third guard ring 36c, and the third guard ring 36d are formed.

Specifically, the third guard ring 36a includes three second Cu dummies of the second Cu dummy DP2a31, the second Cu dummy DP2a32, and the second Cu dummy DP2a33. In addition, the third guard ring 36b includes two second Cu dummies of the second Cu dummy DP2b31 and the second Cu dummy DP2b32. The third guard ring 36c includes three second Cu dummies of a second Cu dummy DP2c31, a second Cu dummy DP2c32, and a second Cu dummy DP2c33. In addition, the third guard ring 36d includes two second Cu dummies of a second Cu dummy DP2d31 and a second Cu dummy DP2d32.

With this arrangement, even in a case where an inner crack or chipping occurs in the semiconductor device 600a, the semiconductor device 600a is capable of more reliably stopping the inner crack or the chipping.

In addition, in the third guard ring 36a and the third guard ring 36b, for example, in FIG. 47, the inner crack IC is vertical to the scribe line SL, but the ninth embodiment is not limited thereto.

Figure 53A:
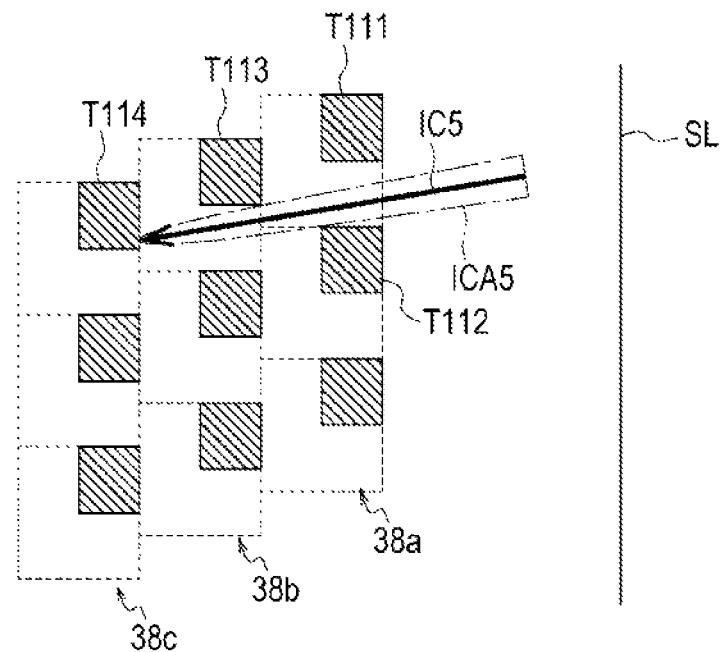
FIGS. 53A and 53B are explanatory diagrams illustrating an example where the inner crack obliquely enters the third guard ring, and an example where the shape of the third guard ring is changed, in the semiconductor device of the ninth embodiment.
Figure 53B:
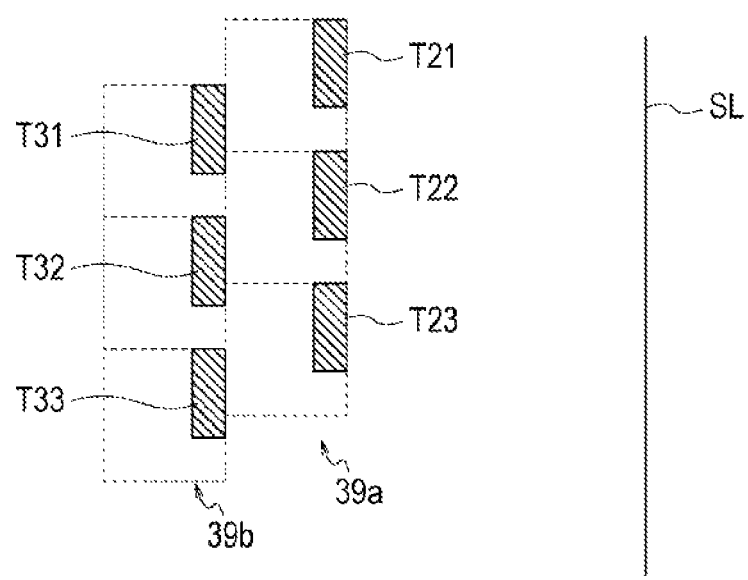

FIG. 53A illustrates an example in which an inner crack IC5 obliquely enters a third guard ring 38a, a third guard ring 38b, and a third guard ring 38c, in the semiconductor device of the ninth embodiment of the present technology, and FIG. 53B illustrates an example in which the shape of a third guard ring 39a and a third guard ring 39b is changed.

As illustrated in FIG. 53A, the third guard ring 38a includes three second Cu dummies (a second Cu dummy T111, a second Cu dummy T112, and the like). In addition, the third guard ring 38b includes three second Cu dummies (a second Cu dummy T113 and the like). The third guard ring 38c includes three second Cu dummies (a second Cu dummy T114 and the like). The inner crack IC5 obliquely enters the plurality of second Cu dummies forming the third guard ring 38a, the third guard ring 38b, and the third guard ring 38c (that is, with respect to the scribe line SL).

In a case where the inner crack IC5 obliquely enters, in general, it is assumed that the width of the inner crack region ICA5 is narrowed. In this case, it is considered that the inner crack IC5 slips through the adjacent third guard rings 38, that is, between the third guard ring 38a and the third guard ring 38b.

Therefore, the rear column of the third guard ring 38a and the third guard ring 38b adjacent to each other on the right and left (the third guard ring 38c on the leftmost side in FIGS. 53A and 53B), for example, may be formed such that the adjacent third guard rings 38 (for example, the third guard ring 38a and the third guard ring 38b) are covered with each other by overlapping each other, along the scribe line SL.

With this arrangement, in FIG. 48A, the second Cu dummy T3 (DP2b31) stops the inner crack IC1, and in FIG. 53A, the third guard ring 38c including the second Cu dummy T114 is formed, and thus, even in a case where the inner crack IC5 obliquely occurs, the second Cu dummy T114 of the third guard ring 38c is capable of stopping the progress of the inner crack.

In addition, the same rule as the design rule of the chip region CA is applied to the third guard ring, and thus, the shape of the third guard ring can be changed within a range where the design rule is allowed.

For example, as illustrated in FIG. 53B, in a third guard ring 39a and a third guard ring 39b, the shape of the plurality of second Cu dummies forming the third guard ring 39a and the third guard ring 39b, can be changed within the range where the design rule is allowed. The third guard ring 39a illustrated in FIG. 53B, is configured according to the shape of three second Cu dummies of a second Cu dummy T21, a second Cu dummy T22, and a second Cu dummy T23. In addition, the third guard ring 39b is configured according to the shape of three second Cu dummies of a second Cu dummy T31, a second Cu dummy T32, and a second Cu dummy T33.

More accurately, a coverage is defined in the design rule, and thus, the shape of the third guard ring 39a and the third guard ring 39b can be arbitrary changed within a range where the coverage is allowed.

11. Tenth Embodiment (Eighth Example of Semiconductor Device)

A semiconductor device of a tenth embodiment according to the present technology, is a semiconductor device, further including: a fourth guard ring and a fifth guard ring between the guard ring unit and the scribe line, in which the fourth guard ring is formed on the first junction surface and the second junction surface, the fifth guard ring is formed on the second semiconductor substrate, the first guard ring, the fourth guard ring, and the fifth guard ring are formed into the shape of a step, in this order, and the fifth guard ring is formed in a position closer to the scribe line than the first guard ring, in the semiconductor device of the ninth embodiment.

According to the semiconductor device of the tenth embodiment of the present technology, for example, when an inner crack occurs, the first guard ring, the fourth guard ring, and the fifth guard ring are formed into the shape of a step, and thus, it is possible to intentionally chip the inner crack on the front surface of the semiconductor device, and to improve the reliability of the quality of the semiconductor device.

Figure 54A:
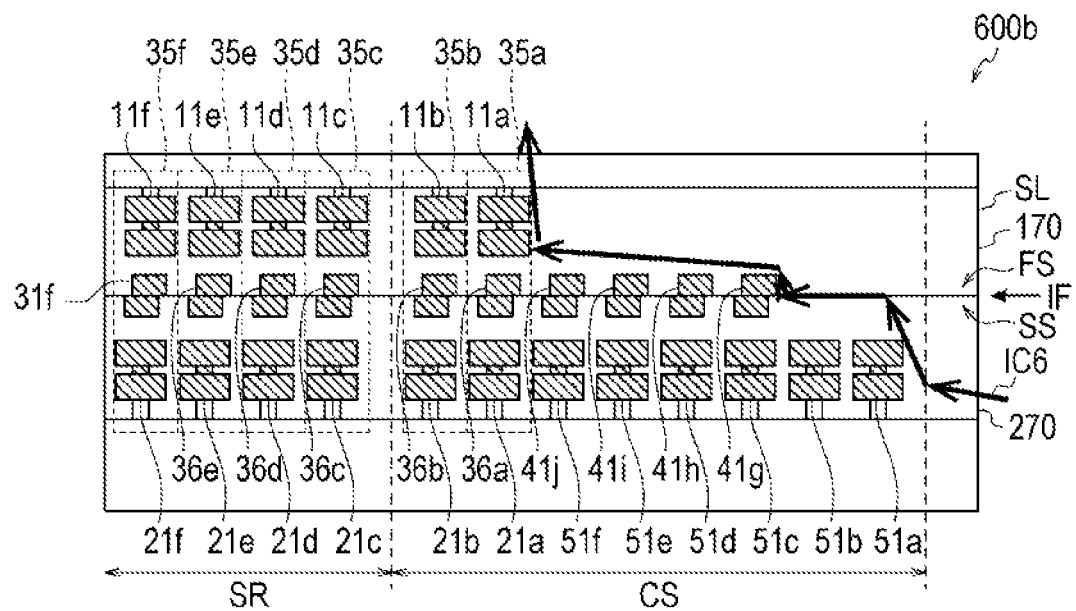
FIGS. 54A and 54B are (first) diagrams of a semiconductor device illustrating an example of a semiconductor device of a tenth embodiment according to the present technology.
Figure 54B:
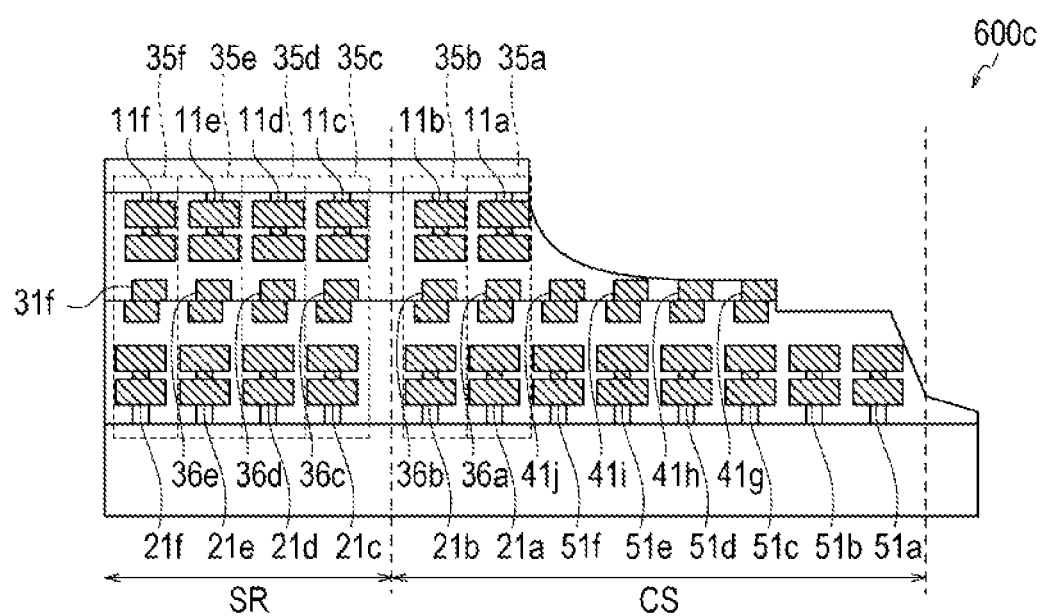

FIGS. 54A and 54B illustrate an example of the semiconductor device of the tenth embodiment according to the present technology. FIG. 54A illustrates a case where an inner crack IC6 occurs in a semiconductor device 600b according to an embodiment of the present technology, and FIG. 54B illustrates a semiconductor device 600c obtained by dicing the semiconductor device 600b according to an embodiment of the present technology. Furthermore, unless otherwise particularly noted, "up" indicates an upper direction in FIGS. 54A and 54B, and "right" indicates a right direction in FIGS. 54A and 54B.

As illustrated in FIGS. 54A and 54B, the semiconductor device 600b of the tenth embodiment according to the present technology, includes the guard ring unit 35a, the guard ring unit 35b, a guard ring unit 35c, a guard ring unit 35d, a guard ring unit 35e, and a guard ring unit 35f, in the semiconductor device 600 of the ninth embodiment.

In addition, the semiconductor device 600b further includes a fourth guard ring 41g, a fourth guard ring 41h, a fourth guard ring 41i, a fourth guard ring 41j, a fifth guard ring 51a, a fifth guard ring 51b, a fifth guard ring 51c, a fifth guard ring 51d, a fifth guard ring 51e, and a fifth guard ring 51f, between the guard ring unit 35a and the scribe line SL.

The fourth guard ring 41g, the fourth guard ring 41h, the fourth guard ring 41i, and the fourth guard ring 41j are formed on the first junction surface FS and the second junction surface SS. In addition, the fifth guard ring 51a, the fifth guard ring 51b, the fifth guard ring 51c, the fifth guard ring 51d, the fifth guard ring 51e, and the fifth guard ring 51f are formed on a second semiconductor substrate 270.

Then, the first guard ring 11a, the first guard ring 11b, the first guard ring 11c, the first guard ring 11d, the first guard ring 11e, the first guard ring 11f, the fourth guard ring 41g, the fourth guard ring 41h, the fourth guard ring 41i, the fourth guard ring 41j, the fifth guard ring 51a, the fifth guard ring 51b, the fifth guard ring 51c, the fifth guard ring 51d, the fifth guard ring 51e, and the fifth guard ring 51f are formed into the shape of a step, in this order.

In addition, the fifth guard ring 51a, the fifth guard ring 51b, the fifth guard ring 51c, the fifth guard ring 51d, the fifth guard ring 51e, and the fifth guard ring 51f are formed in a position closer to the scribe line SL than the first guard ring 11a, the first guard ring 11b, the first guard ring 11c, the first guard ring 11d, the first guard ring 11e, and the first guard ring 11f.

Furthermore, the fourth guard ring 41g, the fourth guard ring 41h, the fourth guard ring 41i, and the fourth guard ring 41j respectively include the plurality of second Cu dummies. In addition, the fifth guard ring 51a, the fifth guard ring 51b, the fifth guard ring 51c, the fifth guard ring 51d, the fifth guard ring 51e, and the fifth guard ring 51f respectively include the plurality of second Cu dummies.

With this arrangement, when the inner crack IC6 occurs in the semiconductor device 600b, the inner crack IC6 is output to the front surface of the semiconductor device 600b from the first guard ring 11a through the fifth guard ring 51a and the fourth guard ring 41g. Furthermore, the first guard ring 11a is included in the guard ring unit 35a, and is formed on the first semiconductor substrate 170.

According to the semiconductor device 600b of the tenth embodiment of the present technology, even in a case where the inner crack IC6 occurs, the inner crack IC6 can be output to the front surface of the semiconductor device 600b as chipping, by the fourth guard ring 41g, the fifth guard ring 51a, and the guard ring unit 35a that are formed into the shape of a step, and thus, the examination of the semiconductor device 600b can be easily performed, and the quality of the semiconductor device 600b can be improved.

In addition, as illustrated in FIG. 54B, even in a case where the semiconductor device 600b is diced, in the semiconductor device 600c, the guard ring unit 35a is capable of stopping the progress of the inner crack IC6, and thus, it is possible to improve the quality of the semiconductor device 600c. In particular, it is possible to easily visually determine the front surface of the semiconductor device 600c, and thus, it is possible to increase an examination efficiency.

Next, a case where the progress of the inner crack is stopped in the inner layer of the semiconductor device, will be described.

Figure 55A:
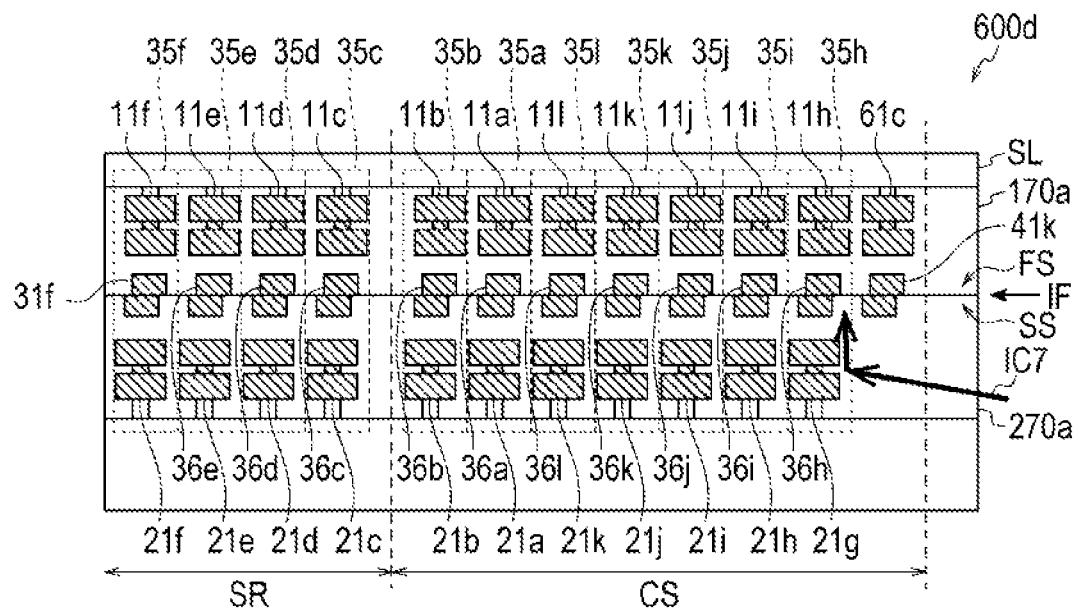
FIGS. 55A and 55B are (second) diagrams of the semiconductor device illustrating an example of the semiconductor device of the tenth embodiment according to the present technology.
Figure 55B:
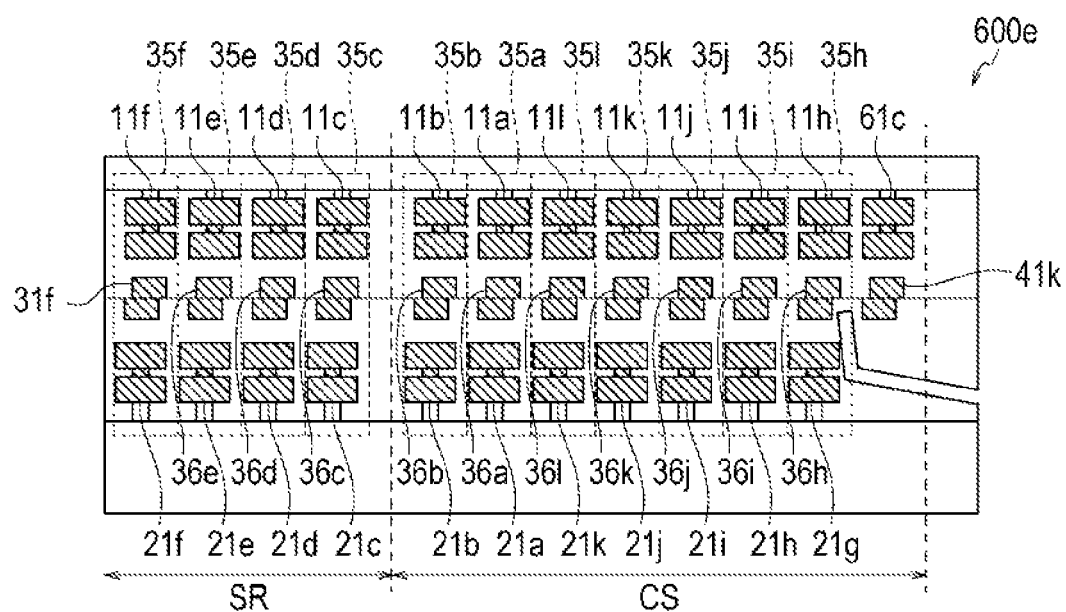

FIGS. 55A and 55B illustrate an example of the semiconductor device of the tenth embodiment according to the present technology. FIG. 55A illustrates a case where an inner crack IC7 occurs in a semiconductor device 600d according to an embodiment of the present technology, and FIG. 55B is an explanatory diagram illustrating a semiconductor device 600e obtained by dicing the semiconductor device 600d according to an embodiment of the present technology. Furthermore, unless otherwise particularly noted, "up" indicates an upper direction in FIGS. 55A and 55B, and "down" indicates a lower direction in FIGS. 55A and 55B.

The semiconductor device 600d of the tenth embodiment according to the present technology is different from the semiconductor device 600b of the tenth embodiment, in that a fourth guard ring 41k and a sixth guard ring 61c are further provided outside the guard ring unit 35a, the guard ring unit 35b, the guard ring unit 35c, the guard ring unit 35d, the guard ring unit 35e, the guard ring unit 35f, the guard ring unit 35h, the guard ring unit 35i, the guard ring unit 35j, the guard ring unit 35k, and the guard ring unit 35l. Furthermore, the fourth guard ring 41k and the sixth guard ring 61c include the plurality of second Cu dummies.

That is, in the semiconductor device 600d, the entire guard ring is formed into the shape of a step, but the sixth guard ring 61c is arranged in a position closer to the scribe line SL than the second guard ring 21g, on the first semiconductor substrate 170a and the second semiconductor substrate 270a.

In this case, the fourth guard ring 41k and the sixth guard ring 61c are formed into the shape of an inverted step, and thus, in a case where the inner crack IC7 occurs, it is difficult for the inner crack IC7 to appear on the front surface of the semiconductor device 600d as chipping.

For example, as illustrated in FIG. 55B, in a case where the semiconductor device 600d is diced, the inner crack IC7 is easily stopped in the semiconductor device 600e. In this case, the chipping does not appear on the front surface of the semiconductor device 600e, and thus, it is difficult to perform non-defective product determination. For this reason, it is necessary to perform the examination by separately using a special examination device, and thus, the manufacturing cost increases.

For this reason, in the semiconductor device 600b of the tenth embodiment according to the present technology, the fourth guard ring 41g, the fourth guard ring 41h, the fourth guard ring 41i, the fourth guard ring 41j, the fifth guard ring 51a, the fifth guard ring 51b, the fifth guard ring 51c, the fifth guard ring 51d, the fifth guard ring 51e, and the fifth guard ring 51f are further provided outside the guard ring unit 35a. In the semiconductor device 600b, the first guard ring 11a, the fourth guard ring 41g, and the fifth guard ring 51a are formed into the shape of a step, in this order, and the fifth guard ring 51a is formed in a position closer to the scribe line SL than the first guard ring 11a.

According to the semiconductor device 600b of the tenth embodiment of the present technology, even in a case where the inner crack IC7 occurs, the guard ring unit 35a is capable of outputting the inner crack IC7 to the front surface of the semiconductor device 600b, as the chipping, and thus, it is possible to easily examine the semiconductor device 600b, and to improve the quality of the semiconductor device 600b.

12. Eleventh Embodiment Relevant to Electronic Device

An electronic device of an eleventh embodiment according to the present technology, is an electronic device mounted with a semiconductor device, in which the semiconductor device includes a first semiconductor substrate, a second semiconductor substrate, and at least one guard ring unit including a first guard ring, a second guard ring, and a third guard ring, the first semiconductor substrate and the second semiconductor substrate are joined together by a first junction surface of the first semiconductor substrate and a second junction surface of the second semiconductor substrate, the first guard ring is formed on the first semiconductor substrate, the second guard ring is formed on the second semiconductor substrate, and the third guard ring is formed on the first junction surface and the second junction surface. In addition, the electronic device of the eleventh embodiment according to the present technology, may be an electronic device mounted with the semiconductor device of the first embodiment to the tenth embodiment according to the present technology.

Figure 56:
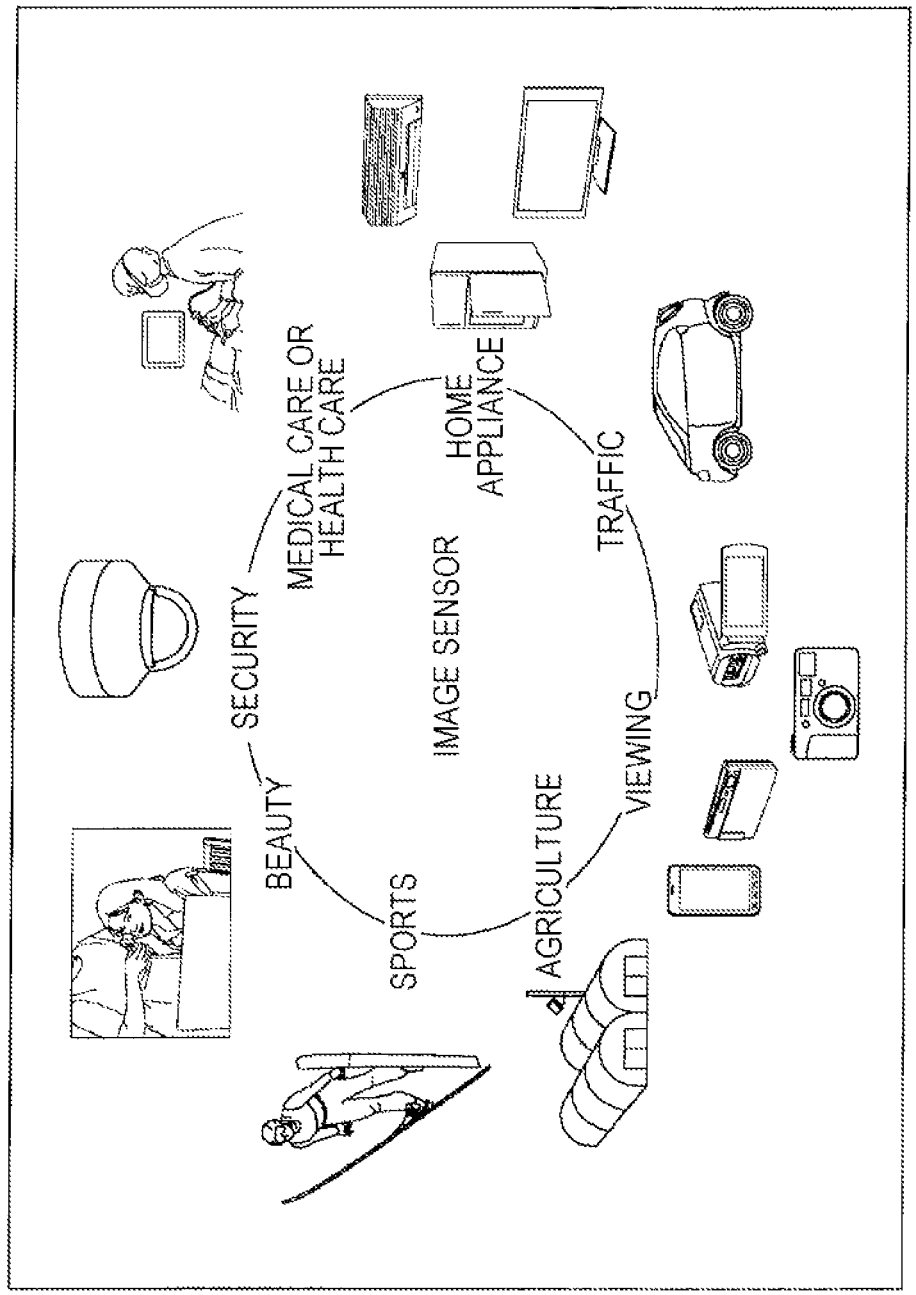
FIG. 56 is a diagram illustrating a usage example of a solid-state imaging device of the first embodiment to the tenth embodiment to which the present technology is applied.

13. Usage Example of Semiconductor Device to which Present Technology is Applied FIG. 56 is a diagram illustrating a usage example of the semiconductor device of the first embodiment to the tenth embodiment according to the present technology, as an image sensor.

The semiconductor device of the first embodiment to the tenth embodiment described above, for example, can be used in various cases of sensing light such as visible light, infrared light, ultraviolet light, and an X-ray, as described below. That is, as illustrated in FIG. 56, for example, the semiconductor device of the first embodiment to the tenth embodiment can be used in a device to be used in the field of viewing in which an image to be used for viewing is photographed, the field of traffic, the field of home appliance, the field of medical care or health care, the field of security, the field of beauty, the field of sports, the field of agriculture, and the like (for example, the electronic device of the eleventh embodiment described above).

Specifically, in the field of viewing, for example, the semiconductor device of the first embodiment to the tenth embodiment can be used in a device for photographing an image to be used for viewing, such as a digital camera, a smart phone, or a mobile phone with a camera function.

In the field of traffic, for example, the semiconductor device of the first embodiment to the tenth embodiment can be used in a device to be used for traffic, such as an in-car sensor photographing the front, the rear, the surroundings of an automobile, the inside of the automobile, and the like, a monitoring camera monitoring a traveling vehicle or a road, or a distance measuring sensor measuring a distance between vehicles, or the like, in order for a safety operation such as automatic stop, the recognition of the state of a driver, or the like.

In the field of home appliance, for example, the semiconductor device of the first embodiment to the tenth embodiment can be used in a device to be used for the home appliance such as a television receiver, a refrigerator, or an air conditioner, in order to perform a device manipulation according to the gesture of a user by photographing the gesture.

In the field of medical care or health care, for example, the semiconductor device of the first embodiment to the tenth embodiment can be used in a device to be used for medical care or health care, such as an endoscope, or a device photographing a blood vessel by receiving infrared light.

In the field of security, for example, the semiconductor device of the first embodiment to the tenth embodiment can be used in a device to be used for security, such as a monitoring camera for security, or a camera for figure authentication.

In the field of beauty, for example, the semiconductor device of the first embodiment to the tenth embodiment can be used in a device to be used for beauty, such as a skin measuring device photographing the skin, or a microscope photographing the scalp.

In the field of sports, for example, the semiconductor device of the first embodiment to the tenth embodiment can be used in a device to be used for sports, such as an action camera or a wearable camera for sports or the like.

In the field of agriculture, for example, the semiconductor device of the first embodiment to the tenth embodiment can be used in a device to be used for agriculture, such as a camera for monitoring the state of fields or crops.

Figure 57:
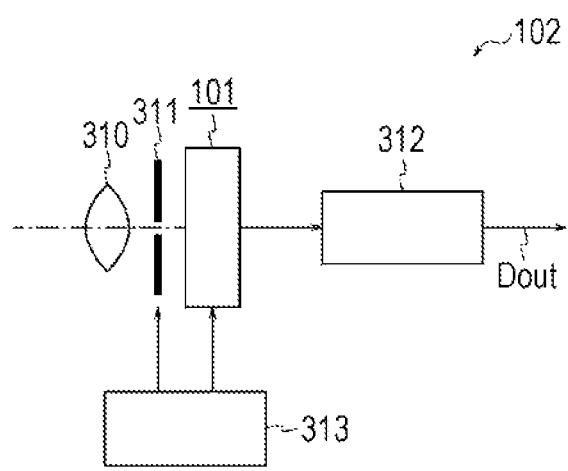
FIG. 57 is a functional block diagram of an example of an electronic device to which the present technology is applied.

Next, a usage example of the semiconductor device of the first embodiment to the tenth embodiment according to the present technology, will be specifically described. For example, the semiconductor device described above, for example, can be applied to all types of electronic devices having an imaging function, such as a camera system such as a digital still camera or a video camera, or a mobile phone having an imaging function. FIG. 57 illustrates the overall configuration of an electronic device 102 (a camera), as an example. The electronic device 102, for example, is a video camera that is capable of photographing a still image or a moving image, and includes a solid-state imaging device 101, an optical system (an optical lens) 310, a shutter device 311, a driving unit 313 driving the solid-state imaging device 101 and the shutter device 311, and a signal processing unit 312.

The optical system 310 guides image light (incident light) from a subject to a pixel portion of the solid-state imaging device 101. The optical system 310 may include a plurality of optical lenses. The shutter device 311 controls a light irradiation period and a light shield period with respect to the solid-state imaging device 101. The driving unit 313 controls a transfer operation of the solid-state imaging device 101 and a shutter operation of the shutter device 311. The signal processing unit 312 performs various signal processings with respect to a signal output from the solid-state imaging device 101. A video signal Dout after the signal processing, is stored in a storage medium such as a memory, or is output to a monitor or the like.

14. Application Example with Respect to Endoscopic Surgery System

The technology according to the present disclosure (the present technology) can be applied to various products. For example, the technology according to the present disclosure may be applied to an endoscopic surgery system.

Figure 58:
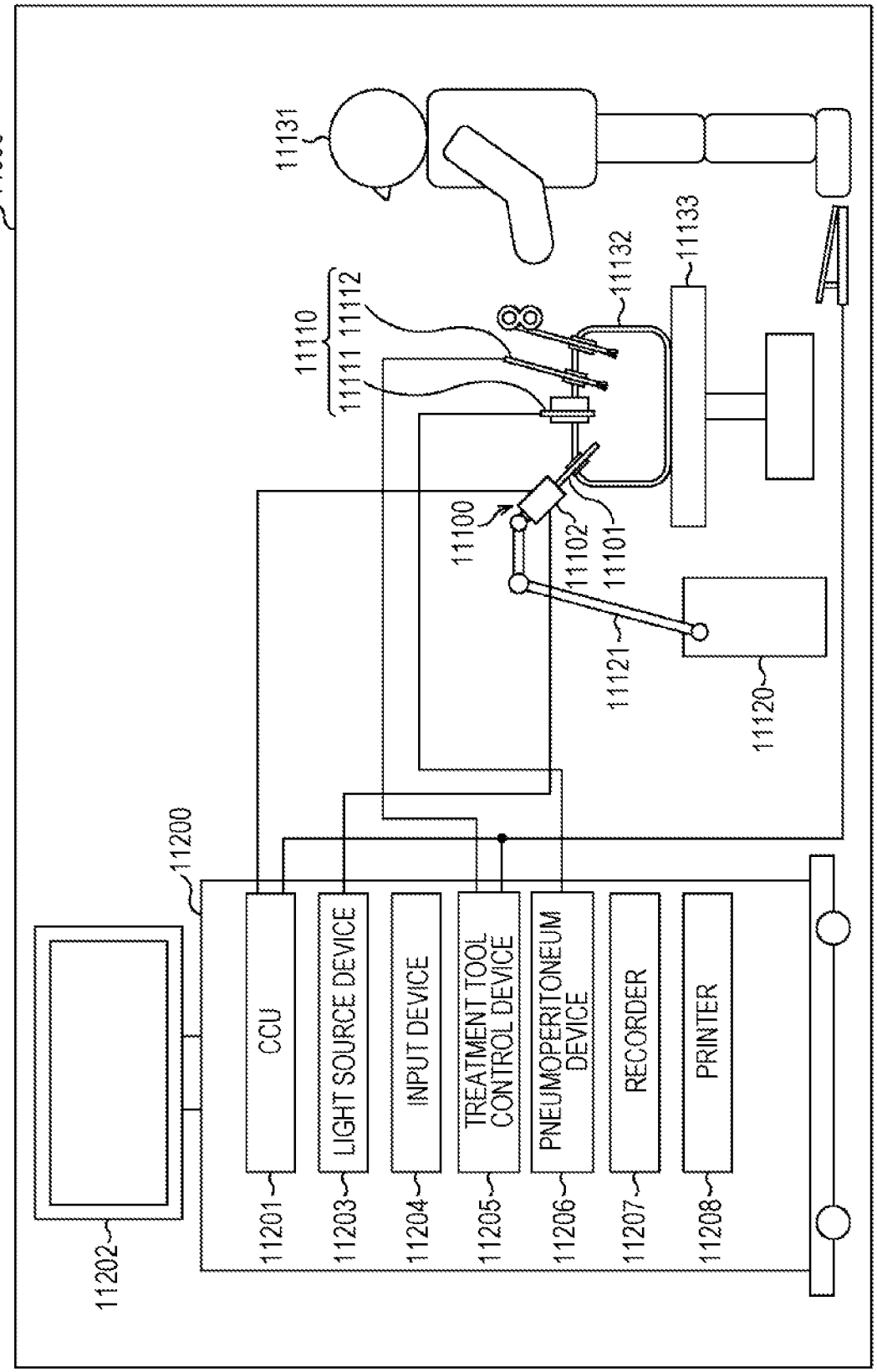
FIG. 58 is a diagram illustrating an example of a schematic configuration of an endoscopic surgery system.

FIG. 58 is a diagram illustrating an example of the schematic configuration of the endoscopic surgery system to which the technology according to the present disclosure (the present technology) can be applied.

In FIG. 58, a state is illustrated in which an operator (a medical doctor) 11131 performs a surgery with respect to a patient 11132 on a patient bed 11133, by using an endoscopic surgery system 11000. As illustrated, the endoscopic surgery system 11000 includes an endoscope 11100, other surgical tools 11110 such as a pneumoperitoneum tube 11111 or an energy treatment tool 11112, a support arm device 11120 supporting the endoscope 11100, and a cart 11200 on which various devices for a surgery with an endoscope are mounted.

The endoscope 11100 includes a lens tube 11101 in which a region of a predetermined length from the tip end is inserted into the body cavity of the patient 11132, and a camera head 11102 to be connected to the base end of the lens tube 11101. In the illustrated example, the endoscope 11100 is configured as a so-called rigid lens including a rigid lens tube 11101, is illustrated, but the endoscope 11100 may be configured as a so-called soft lens including a soft lens tube.

An opening portion in which an objective lens is fitted, is provided on the tip end of the lens tube 11101. A light source device 11203 is connected to the endoscope 11100, and light generated by the light source device 11203 is guided to the tip end of the lens tube by a light guide extending in the lens tube 11101, and is emitted to an observation target in the body cavity of the patient 11132 through the objective lens. Furthermore, the endoscope 11100 may be a direct view lens, or may be an oblique view lens or a side view lens.

An optical system and an imaging element are provided in the camera head 11102, and reflection light (observation light) from the observation target is condensed on the imaging element by the optical system. The observation light is subjected to photoelectric conversion by the imaging element, and an electric signal corresponding to the observation light, that is, an image signal corresponding to an observation image, is generated. The image signal is transmitted to a camera control unit (CCU) 11201 as RAW data.

The CCU 11201 includes a central processing unit (CPU), a graphics processing unit (GPU), or the like, and comprehensively controls the operation of the endoscope 11100 and a display device 11202. Further, the CCU 11201 receives the image signal from the camera head 11102, and for example, performs various image processings for displaying an image based on the image signal, such as develop processing (demosaic processing), with respect to the image signal.

The display device 11202 displays the image based on the image signal that is subjected to the image processing by the CCU 11201, according to the control from the CCU 11201.

The light source device 11203, for example, includes a light source such as a light emitting diode (LED), and supplies irradiation light at the time of photographing a surgery portion or the like, to the endoscope 11100.

An input device 11204 is an input interface with respect to the endoscopic surgery system 11000. The user is capable of performing the input of various information items or the input of an instruction with respect to the endoscopic surgery system 11000, through the input device 11204. For example, the user inputs an instruction to the effect of changing an imaging condition according to the endoscope 11100 (the type of irradiation light, a magnification, a focal distance, and the like), or the like.

A treatment tool control device 11205 controls the driving of the energy treatment tool 11112 such as the ablation or the incision of a tissue, or the sealing of a blood vessel. A pneumoperitoneum device 11206 inflates the body cavity of the patient 11132 in order to ensure a visual field according to the endoscope 11100 or to ensure a working space of an operator, and thus, feeds gas into the body cavity through the pneumoperitoneum tube 11111. A recorder 11207 is a device capable of recording various information items relevant to the surgery. A printer 11208 is a device capable of printing various information items relevant to the surgery in various formats such as a text, an image, or a graph.

Furthermore, the light source device 11203 supplying the irradiation light at the time of photographing the surgery portion, to the endoscope 11100, for example, is capable of including a white light source including an LED, a laser light source, or a combination thereof. In a case where the white light source includes a combination of RGB laser light sources, it is possible to control an output strength and an output timing of each color (each wavelength) with a high accuracy, and thus, in the light source device 11203, it is possible to adjust a white balance of the imaged image. In addition, in this case, the observation target is irradiated with laser light from each of the RGB laser light sources in time division, and the driving of the imaging element of the camera head 11102 is controlled in synchronization with the irradiation timing, and thus, an image corresponding to each of RGB, can also be imaged in time division. According to the method, it is possible to obtain a color image without providing a color filter in the imaging element.

In addition, the driving of the light source device 11203 may be controlled such that the intensity of light to be output is changed for each predetermined time. The driving of the imaging element of the camera head 11102 is controlled in synchronization with a timing when the intensity of the light is changed, an image is acquired in time division, and the image is synthesized, and thus, it is possible to generate an image of a high dynamic range without so-called black crushing and overexposure.

In addition, the light source device 11203 may be configured such that light of a predetermined wavelength band corresponding to special light observation can be supplied. In the special light observation, for example, light of a band narrower than that of the irradiation light (that is, white light) at the time of general observation, is emitted by using a wavelength dependency of light absorption in the body tissue, and thus, a so-called narrow band light observation (narrow band imaging) of photographing a predetermined tissue such as the blood vessel of the mucous surface layer, with a high contrast, is performed. Alternatively, in the special light observation, fluorescent observation of obtaining an image by fluorescent light generated according to the irradiation with excitation light, may be performed. In the fluorescent observation, the body tissue can be irradiated with the excitation light, and the fluorescent light from the body tissue can be observed (self-fluorescent observation), or a reagent such as Indian cyanine green (ICG) can be locally injected to the body tissue, and the body tissue can be irradiated with excitation light corresponding to a fluorescent wavelength of the reagent, and thus, a fluorescent image can be obtained. The light source device 11203 is configured such that narrow band light and/or excitation light corresponding to the special light observation, can be supplied.

Figure 59:
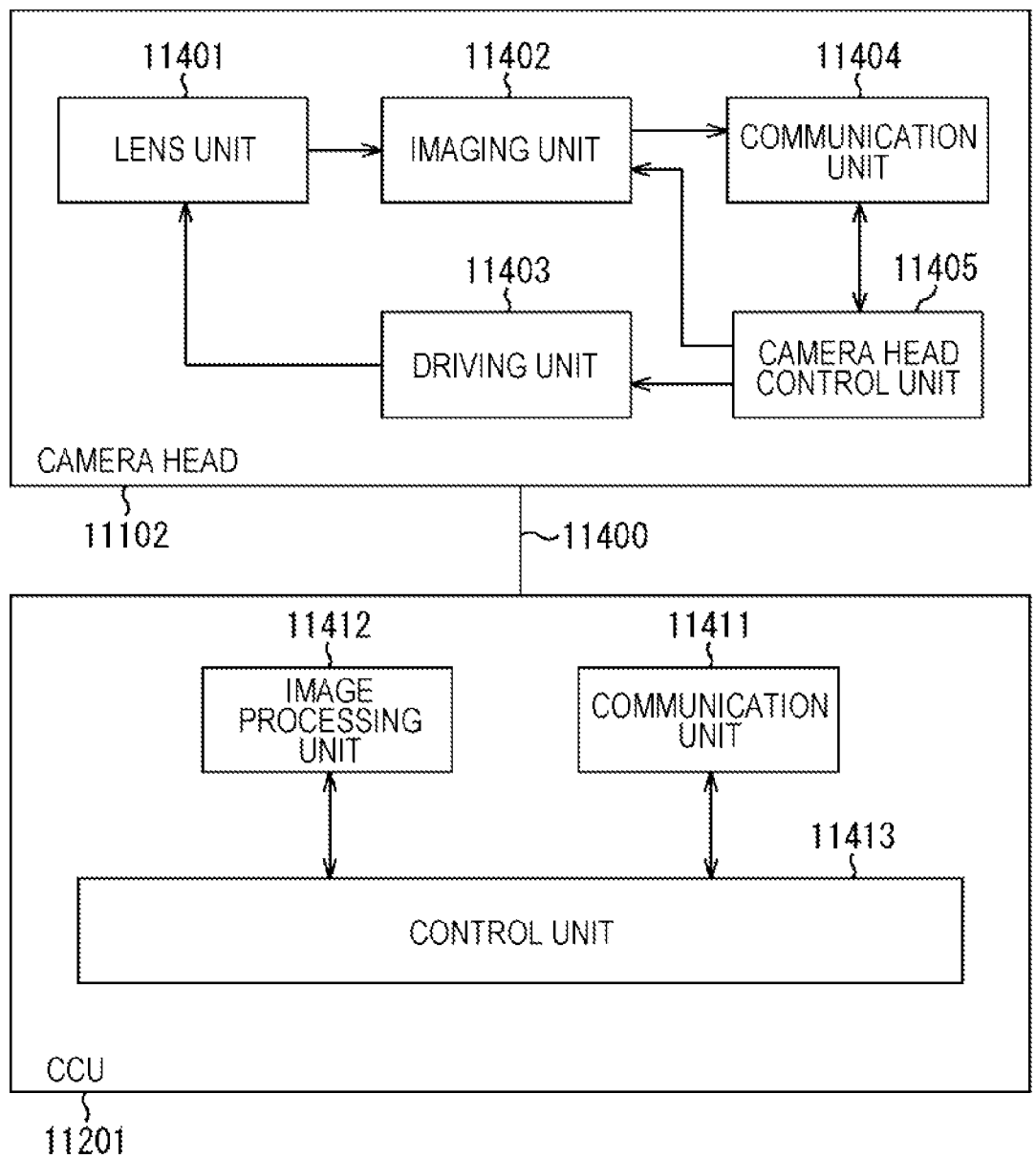
FIG. 59 is a block diagram illustrating an example of a functional configuration of a camera head and a CCU.

FIG. 59 is a block diagram illustrating an example of a functional configuration of the camera head 11102 and the CCU 11201 illustrated in FIG. 58.

The camera head 11102 includes a lens unit 11401, an imaging unit 11402, a driving unit 11403, a communication unit 11404, and a camera head control unit 11405. The CCU 11201 includes a communication unit 11411, an image processing unit 11412, and a control unit 11413. The camera head 11102 and the CCU 11201 are connected to each other such that communication can be performed by a transmission cable 11400.

The lens unit 11401 is an optical system provided in a connection portion with respect to the lens tube 11101. The observation light taken from the tip end of the lens tube 11101, is guided to the camera head 11102, and is incident on the lens unit 11401. The lens unit 11401 is configured by combining a plurality of lenses including a zoom lens and a focus lens.

The imaging unit 11402 includes an imaging element. In the imaging element configuring the imaging unit 11402, one (so-called single plate type) imaging element may be provided, or a plurality of (so-called multi-plate type) imaging elements may be provided. In a case where the imaging unit 11402 includes the multi-plate type imaging elements, for example, an image signal corresponding to each of RGB may be generated by each of the imaging elements, and may be synthesized, and thus, a color image may be obtained. Alternatively, the imaging unit 11402 may include a pair of imaging elements for acquiring each image signal for a right eye and a left eye, corresponding to three-dimensional (3D) display. According to the 3D display, the operator 11131 is capable of more accurately grasping the depth of the biological tissue in the surgery portion. Furthermore, in a case where the imaging unit 11402 includes the multi-plate type imaging elements, a plurality of lens units 11401 can also be provided corresponding to each of the imaging elements.

In addition, it is not necessary that the imaging unit 11402 is provided in the camera head 11102. For example, the imaging unit 11402 may be provided immediately after the objective lens in the lens tube 11101.

The driving unit 11403 includes an actuator, and moves the zoom lens and the focus lens of the lens unit 11401 by only a predetermined distance, along a light axis, according to the control from the camera head control unit 11405. With this arrangement, a magnification and a focal point of the imaged image of the imaging unit 11402, can be suitably adjusted.

The communication unit 11404 includes a communication device for transmitting and receiving various information items with respect to the CCU 11201. The communication unit 11404 transmits the image signal obtained from the imaging unit 11402, to the CCU 11201, as the RAW data, through the transmission cable 11400.

In addition, the communication unit 11404 receives a control signal for controlling the driving of the camera head 11102 from the CCU 11201, and supplies the control signal to the camera head control unit 11405. The control signal, for example, includes information associated with the imaging condition, such as information for designating a frame rate of the imaged image, information for designating an exposure value at the time of imaging, and/or information for designating the magnification and the focal point of the imaged image.

Furthermore, the imaging condition such as the frame rate, the exposure value, the magnification, or the focal point, described above, may be suitably designated by the user, or may be automatically set by the control unit 11413 of the CCU 11201, on the basis of the acquired image signal. In the latter case, a so-called auto exposure (AE) function, an auto focus (AF) function, and an auto white balance (AWB) function are provided in the endoscope 11100.

The camera head control unit 11405 controls the driving of the camera head 11102, on the basis of the control signal received from the CCU 11201 through the communication unit 11404.

The communication unit 11411 includes a communication device for transmitting and receiving various information items with respect to the camera head 11102. The communication unit 11411 receives the image signal to be transmitted through the transmission cable 11400, from the camera head 11102.

In addition, the communication unit 11411 transmits the control signal for controlling the driving of the camera head 11102, to the camera head 11102. The image signal or the control signal can be transmitted through electric communication, light communication, or the like.

The image processing unit 11412 performs various image processings with respect to the image signal that is the RAW data transmitted from the camera head 11102.

The control unit 11413 performs various controls relevant to the imaging of the surgery portion or the like of the endoscope 11100, and the display of the imaged image obtained by imaging the surgery portion or the like. For example, the control unit 11413 generates the control signal for controlling the driving of the camera head 11102.

In addition, the control unit 11413 displays the imaged image on which the surgery portion or the like is reflected, on the display device 11202, on the basis of the image signal that is subjected to the image processing by the image processing unit 11412. At this time, the control unit 11413 may recognize various objects in the imaged image by using various image recognition technologies. For example, the control unit 11413 detects the shape, the color, or the like of the edge of the object included in the imaged image, and thus, is capable of recognizing a surgical tool such as forceps, a specific biological portion, bleed, mist at the time of using the energy treatment tool 11112, or the like. The control unit 11413 may display various surgery support information items to be superimposed on the image of the surgery portion by using a recognition result, at the time of displaying the imaged image on the display device 11202. The surgery support information is displayed by being superimposed, and is presented to the operator 11131, and thus, the load of the operator 11131 can be reduced, or the operator 11131 is capable of reliably promoting the surgery.

The transmission cable 11400 connecting the camera head 11102 and the CCU 11201 together, is an electric signal cable corresponding to the communication of an electric signal, a light fiber corresponding to light communication, or a composite cable thereof.

Here, in the illustrated example, the communication is performed in a wired manner by using the transmission cable 11400, but the communication between the camera head 11102 and the CCU 11201 may be performed in a wireless manner.

As described above, an example of the endoscopic surgery system to which the technology according to the present disclosure can be applied, has been described. In the configuration described above, the technology according to the present disclosure can be applied to the endoscope 11100, (the imaging unit 11402 of) the camera head 11102, or the like. Specifically, the solid-state imaging device 111 of the present disclosure, can be applied to the imaging unit 10402. The technology according to the present disclosure is applied to the endoscope 11100, (the imaging unit 11402 of) the camera head 11102, or the like, and thus, it is possible to improve a yield ratio, and to reduce a manufacturing cost.

Here, the endoscopic surgery system has been described an example, but the technology according to the present disclosure, for example, may be applied to a microscope surgery system or the like in addition to the endoscopic surgery system.

15. Application Example with Respect to Mobile Object

The technology according to the present disclosure (the present technology) can be applied to various products. For example, the technology according to the present disclosure may be realized as a device to be mounted on any type of mobile object such as an automobile, an electric automobile, a hybrid electric automobile, a motorcycle, a bicycle, a personal mobility, an airplane, a drone, a ship, and a robot.

Figure 60:
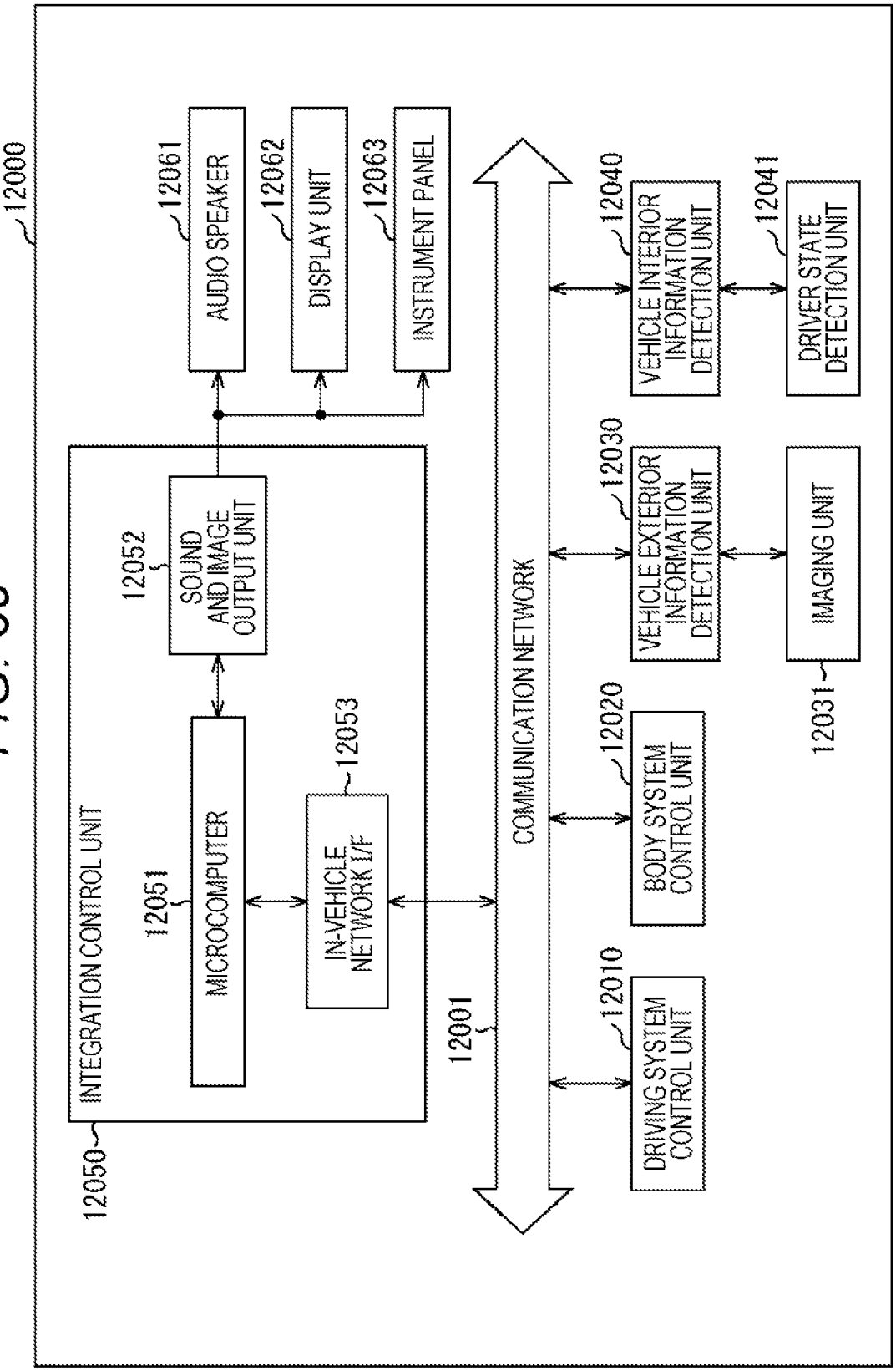
FIG. 60 is a block diagram illustrating an example of a schematic configuration of a vehicle control system.

FIG. 60 is a block diagram illustrating a schematic configuration example of a vehicle control system that is an example of a mobile object control system to which the technology according to the present disclosure can be applied.

A vehicle control system 12000 includes a plurality of electronic control units connected to each other through a communication network 12001. In the example illustrated in FIG. 60, the vehicle control system 12000 includes a driving system control unit 12010, a body system control unit 12020, a vehicle exterior information detection unit 12030, a vehicle interior information detection unit 12040, and an integration control unit 12050. In addition, a microcomputer 12051, a sound and image output unit 12052, and an in-vehicle network interface (I/F) 12053 are illustrated, as a functional configuration of the integration control unit 12050.

The driving system control unit 12010 controls the operation of a device relevant to a driving system of a vehicle, according to various programs. For example, the driving system control unit 12010 functions as a control device of a driving force generating device for generating a driving force of a vehicle, such as an internal combustion or a driving motor, a driving force transfer mechanism for transferring a driving force to wheels, a steering mechanism adjusting a rudder angle of the vehicle, a braking device generating a braking force of the vehicle, and the like.

The body system control unit 12020 controls the operation of various devices mounted on a vehicle body according to various programs. For example, the body system control unit 12020 functions as a control device of a keyless entry system, a smart key system, a power window device, or various lamps such as a head lamp, a back lamp, a brake lamp, an indicator, or a fog lamp. In this case, an electric wave transmitted from a portable device that substitutes a key, or signals of various switches can be input into the body system control unit 12020. The body system control unit 12020 receives the input of the electric wave or the signal, and controls a door lock device, a power window device, a lamp, or the like of the vehicle.

The vehicle exterior information detection unit 12030 detects outside information of the vehicle provided with the vehicle control system 12000. For example, an imaging unit 12031 is connected to the vehicle exterior information detection unit 12030. The vehicle exterior information detection unit 12030 allows the imaging unit 12031 to image a vehicle exterior image, and receives the imaged image. The vehicle exterior information detection unit 12030 may perform object detection processing or distance detection processing with respect to people, vehicles, obstacles, signs, characters on the road, or the like, on the basis of the received image.

The imaging unit 12031 is a light sensor that receives light, and outputs an electric signal according to the received amount of light. The imaging unit 12031 is capable of outputting the electric signal as an image, and of outputting the electric signal as distance measuring information. In addition, the light received by the imaging unit 12031, may be visible light, or may be non-visible light such as an infrared ray.

The vehicle interior information detection unit 12040 detects vehicle interior information. For example, a driver state detection unit 12041 detecting the state of the driver is connected to the vehicle interior information detection unit 12040. The driver state detection unit 12041, for example, may include a camera imaging the driver, and the vehicle interior information detection unit 12040 may calculate the degree of fatigue or the degree of concentration of the driver, or may determine whether or not the driver dozes off, on the basis of detection information to be input from the driver state detection unit 12041.

The microcomputer 12051 is capable of calculating a control target value of the driving force generating device, the steering mechanism, or the braking device, on the basis of the vehicle interior information and the vehicle exterior information acquired by the vehicle exterior information detection unit 12030 or the vehicle interior information detection unit 12040, and is capable of outputting a control command to the driving system control unit 12010. For example, the microcomputer 12051 is capable of performing collaborative control for realizing the function of an advanced driver assistance system (ADAS) including collision avoidance or impact relaxation of the vehicle, follow-up traveling based on a distance between vehicles, speed maintenance traveling, vehicle collision warning, vehicle lane deviation warning, or the like.

In addition, the microcomputer 12051 controls the driving force generating device, the steering mechanism, the braking device, or the like, on the basis of vehicle circumference information acquired by the vehicle exterior information detection unit 12030 or the vehicle interior information detection unit 12040, and thus, is capable of performing collaborative control for automated driving or the like in which the vehicle autonomously travels without depending on the manipulation of the driver.

In addition, the microcomputer 12051 is capable of outputting the control command to the body system control unit 12020, on the basis of the vehicle exterior information acquired by the vehicle exterior information detection unit 12030. For example, the microcomputer 12051 controls the head lamp according to the position of a leading vehicle or an oncoming vehicle that is sensed by the vehicle exterior information detection unit 12030, and thus, is capable of performing collaborative control for anti-glaring such as switching of a high beam to a low beam.

The sound and image output unit 12052 transmits an output signal of at least one of a sound or an image to an output device that is capable of visually or auditorily notifying a passenger of the vehicle or the vehicle exterior of information. In the example of FIG. 60, an audio speaker 12061, a display unit 12062, and an instrument panel 12063 are exemplified as the output device. The display unit 12062, for example, may include at least one of an on-board display or a head-up display.

Figure 61:
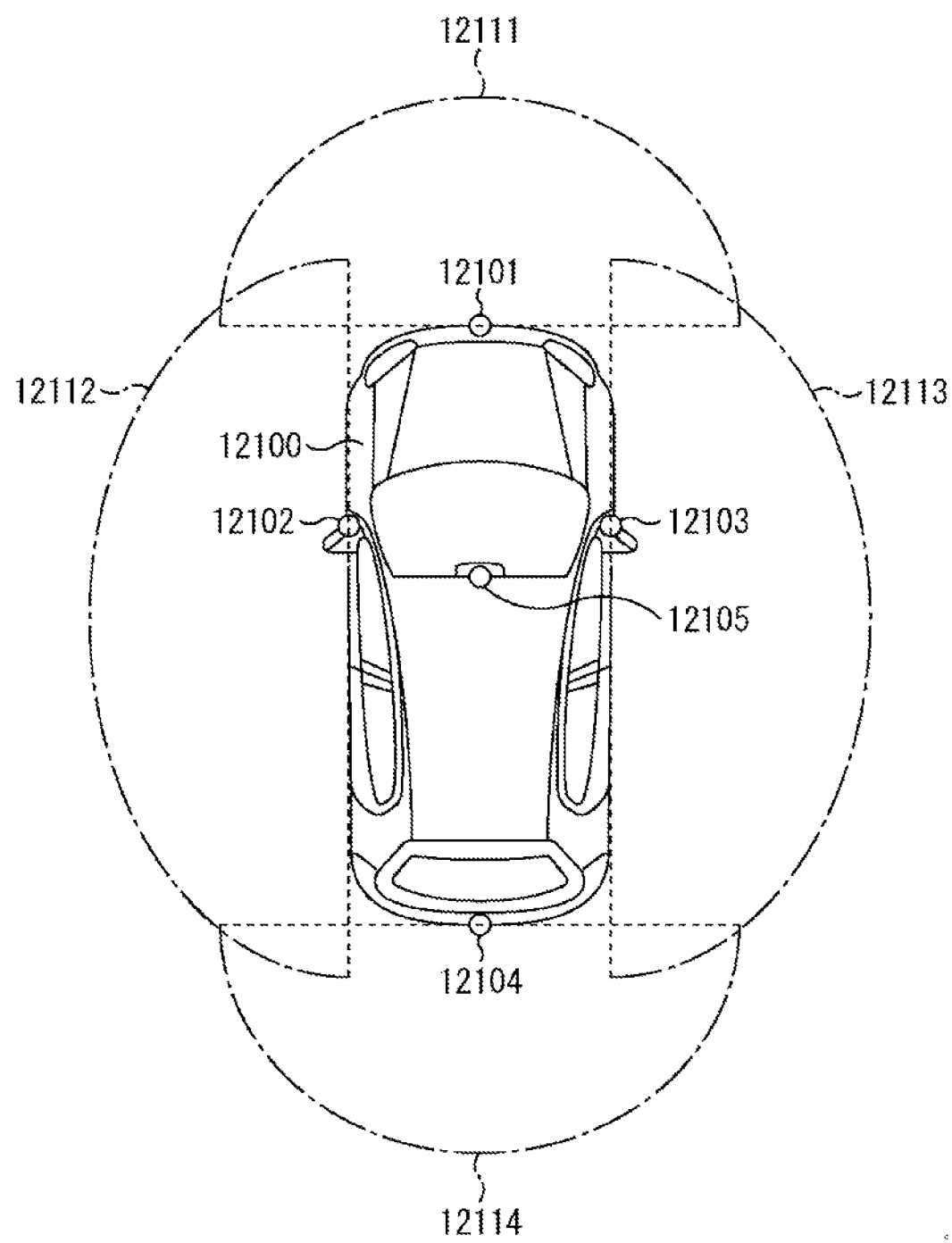
FIG. 61 is an explanatory diagram illustrating an example of an installation position of a vehicle exterior information detection unit and an imaging unit.

FIG. 61 is a diagram illustrating an example of an installation position of the imaging unit 12031.

In FIG. 61, a vehicle 12100 includes imaging units 12101, 12102, 12103, 12104, and 12105, as the imaging unit 12031.

The imaging units 12101, 12102, 12103, 12104, and 12105, for example, are provided in a position such as a front nose, a side mirror, a rear bumper, and a backdoor of the vehicle 12100, and an upper portion of a windshield in the vehicle. The imaging unit 12101 provided in the front nose, and the imaging unit 12105 provided in the upper portion of the windshield in the vehicle, mainly acquire a front image of the vehicle 12100. The imaging units 12102 and 12103 provided in the side mirror, mainly acquire a side image of the vehicle 12100. The imaging unit 12104 provided in the rear bumper or the backdoor, mainly acquires a rear image of the vehicle 12100. The front image acquired by the imaging units 12101 and 12105, is mainly used for detecting a leading vehicle, a pedestrian, obstacles, a traffic light, a traffic sign, a traffic lane, or the like.

Furthermore, in FIG. 61 illustrates an example a photographing range of the imaging units 12101 to 12104. An imaging range 12111 represents an imaging range of the imaging unit 12101 provided in the front nose, imaging ranges 12112 and 12113 respectively represent imaging ranges of the imaging units 12102 and 12103 provided in the side mirror, and an imaging range 12114 represents an imaging range of the imaging unit 12104 provided in the rear bumper or the backdoor. For example, image data items imaged by the imaging units 12101 to 12104 overlap each other, and thus, an overhead image can be obtained in which the vehicle 12100 is seen from the upper portion.

At least one of the imaging units 12101 to 12104 may have a function of acquiring distance information. For example, at least one of the imaging units 12101 to 12104 may be a stereo camera including a plurality of imaging elements, or may be an imaging element including a pixel for detecting a phase difference.

For example, the microcomputer 12051 obtains a distance to a three-dimensional object in each of the imaging ranges 12111 to 12114, and a temporal change of the distance (a relative speed with respect to the vehicle 12100), on the basis of the distance information obtained from the imaging units 12101 to 12104, and thus, in particular, in the closest three-dimensional object on the road where the vehicle 12100 travels, a three-dimensional object that travels at a predetermined speed (for example, greater than or equal to 0 km/h) in approximately the same direction as that of the vehicle 12100, can be extracted as the leading vehicle. Further, the microcomputer 12051 sets the distance between the vehicles to be ensured in advance, in front of the leading vehicle, and thus, is capable of performing automatic brake control (also including follow-up stop control), automatic acceleration control (also including follow-up start control), or the like. Thus, it is possible to perform the collaborative control for the automated driving or the like in which the vehicle autonomously travels without depending on the manipulation of the driver.

For example, the microcomputer 12051 is capable of extracting three-dimensional object data relevant to the three-dimensional object by sorting the data into a two-wheeled vehicle, an ordinary vehicle, a large-sized vehicle, a pedestrian, and other three-dimensional objects such as a power pole, based on the distance information obtained from the imaging units 12101 to 12104, to be used for automatically avoiding the obstacles. For example, the microcomputer 12051 identifies peripheral obstacles of the vehicle 12100 into obstacles visible to the driver of the vehicle 12100 and obstacles not visible to the driver. Then, the microcomputer 12051 determines collision risk indicating the degree of hazard of collision with respect to each of the obstacles, and when the collision risk is greater than or equal to a setting value, and there is a collision possibility, an alarm is output to the driver through the audio speaker 12061 or the display unit 12062, or forced deceleration or avoidance steering is performed through the driving system control unit 12010, and thus, driving support for collision avoidance can be performed.

At least one of the imaging units 12101 to 12104 may be an infrared ray camera detecting an infrared ray. For example, the microcomputer 12051 is capable of recognizing the pedestrian by determining whether or not there is a pedestrian in the imaged images of the imaging units 12101 to 12104. The pedestrian is recognized, for example, according to a procedure of extracting a characteristic point in the imaged images of the imaging units 12101 to 12104 as an infrared ray camera, and a procedure of determining where or not there is a pedestrian by performing pattern matching processing with respect to a set of characteristic points representing the outline of the object. In a case where the microcomputer 12051 determines that there is a pedestrian in the imaged images of the imaging units 12101 to 12104, and recognizes the pedestrian, the sound and image output unit 12052 controls the display unit 12062 such that a square outline for emphasizing is displayed by being superimposed on the recognized pedestrian. In addition, the sound and image output unit 12052 may control the display unit 12062 such that an icon or the like representing the pedestrian, is displayed in a desired position.

As described above, an example of the vehicle control system to which the technology according to the present disclosure can be applied, will be described. In the configurations described above, the technology according to the present disclosure, for example, can be applied to the imaging unit 12031 or the like. Specifically, the solid-state imaging device 111 of the present disclosure, can be applied to the imaging unit 12031. The technology according to the present disclosure is applied to the imaging unit 12031, and thus, it is possible to improve the yield ratio, and to reduce the manufacturing cost.

Furthermore, the present technology is not limited to the embodiments and the application examples described above, but can be variously changed within a range not departing from the gist of the present technology.

In addition, the effects described herein are merely an example, and are not limited thereto, and other effects may be provided.

In addition, the present technology is capable of having the following configurations.

(1) A semiconductor device, including: a first semiconductor substrate; a second semiconductor substrate; and at least one guard ring unit including a first guard ring, a second guard ring, and a third guard ring, in which the first semiconductor substrate and the second semiconductor substrate are joined together by a first junction surface of the first semiconductor substrate and a second junction surface of the second semiconductor substrate, the first guard ring is formed on the first semiconductor substrate, the second guard ring is formed on the second semiconductor substrate, and the third guard ring is formed on the first junction surface and the second junction surface.

(2) The semiconductor device according to (1), in which the guard ring unit is provided inside a scribe line that is formed to surround at least a part of a circumference of the semiconductor device, and the third guard ring is consecutively formed.

(3) The semiconductor device according to (1) or (2), in which at least two guard ring units are provided to surround an opening portion of at least one power source pad, formed on at least a part of a circumference of the semiconductor device.

(4) The semiconductor device according to any one of (1) to (3), in which at least three guard ring units are formed to surround at least a part of a circumference of the semiconductor device.

(5) The semiconductor device according to any one of (1) to (4), in which the guard ring unit contains a metal.

(6) The semiconductor device according to any one of (1) to (5), in which the guard ring unit covers a wiring layer.

(7) The semiconductor device according to any one of (1) to (6), in which the first guard ring includes a groove, the groove is formed into the shape of a groove, and a barrier metal material is applied into the groove.

(8) The semiconductor device according to any one of (1) to (7), further including: at least one Cu dummy, in which the Cu dummy is formed on an outer circumference of the guard ring unit, and is formed on the first junction surface and the second junction surface.

(9) The semiconductor device according to any one of (1) to (8), further including: a slit, in which the slit is provided between a scribe line formed to surround at least a part of a circumference of the semiconductor device and the guard ring unit formed inside the scribe line, and penetrates through the first junction surface and the second junction surface, along a dicing direction.

(10) The semiconductor device according to any one of (1) to (7), further including: a slit; and at least one Cu dummy, in which the Cu dummy is formed along an outer circumference of the guard ring unit, and is formed on the first junction surface and the second junction surface, and the slit is provided between a scribe line formed to surround at least a part of a circumference of the semiconductor device and the guard ring unit formed inside the scribe line, and penetrates through the first junction surface and the second junction surface, along a dicing direction.

(11) The semiconductor device according to any one of (1) to (10), in which the guard ring unit is provided along the inside of a scribe line formed to surround at least a part of a circumference of the semiconductor device, and the third guard ring is inconsecutively formed.

(12) The semiconductor device according to any one of (1) to (11), in which the guard ring unit is provided inside a scribe line formed to surround at least a part of a circumference of the semiconductor device, and the first guard ring is inconsecutively formed.

(13) The semiconductor device according to any one of (1) to (12), further including: at least two guard ring units adjacent to each other on the right and left, in which the at least two guard ring units are juxtaposed inside a scribe line formed to surround at least a part of a circumference of the semiconductor device, along a direction of the scribe line, the third guard rings of the adjacent guard ring units are inconsecutively formed along the scribe line, and the third guard rings adjacent to each other on the right and left, are asymmetric.

(14) The semiconductor device according to any one of (1) to (13), further including: a fourth guard ring and a fifth guard ring between the guard ring unit and the scribe line, in which the fourth guard ring is formed on the first junction surface and the second junction surface, the fifth guard ring is formed on the second semiconductor substrate, the first guard ring, the fourth guard ring, and the fifth guard ring are formed into the shape of a step, in this order, and the fifth guard ring is formed in a position closer to the scribe line than the first guard ring.

(15) The semiconductor device according to any one of (1) to (14), in which on the first semiconductor substrate and the second semiconductor substrate, a first region formed inside the scribe line, and a second region formed inside the scribe line and outside the first region, are provided, and in at least one of the first region or the second region, the adjacent guard ring units are formed.

(16) An electronic device mounted with a semiconductor device, in which the semiconductor device includes a first semiconductor substrate, a second semiconductor substrate, and at least one guard ring unit including a first guard ring, a second guard ring, and a third guard ring, the first semiconductor substrate and the second semiconductor substrate are joined together by a first junction surface of the first semiconductor substrate and a second junction surface of the second semiconductor substrate, the first guard ring is formed on the first semiconductor substrate, and the second guard ring is formed on the second semiconductor substrate, and the third guard ring is formed on the first junction surface and the second junction surface.

(17) A semiconductor device, comprising:
a first semiconductor substrate;
a second semiconductor substrate; and
at least one guard structure including a first guard element, a second guard element, and a third guard element, wherein the first semiconductor substrate and the second semiconductor substrate are bonded to one another at a bonding interface between a first surface of the first semiconductor substrate and a second surface of the second semiconductor substrate, wherein the first guard element is in the first semiconductor substrate and spaced apart from the third guard element by a portion of the first semiconductor substrate, wherein the second guard element is in the second semiconductor substrate and spaced apart from the third guard element by a portion of the second semiconductor substrate, and wherein the third guard element includes portions in the first surface and the second surface to bond the first semiconductor substrate to the second semiconductor substrate.

(18) The semiconductor device according to (17), wherein the at least one guard structure is inside a scribe line that surrounds at least a part of a circumference of the semiconductor device.

(19) The semiconductor device according to one or more of (17) to (18), wherein the at least one guard structure includes at least two guard structures that surround an opening portion that includes at least one power source pad.

(20) The semiconductor device according to one or more of (17) to (19), wherein the at least one guard structure is located along at least one side of the semiconductor device in a plan view.

(21) The semiconductor device according to one or more of (17) to (20), wherein the at least one guard structure includes metal.

(22) The semiconductor device according to one or more of (17) to (21), wherein the at least one guard structure covers a wiring layer.

(23) The semiconductor device according to one or more of (17) to (22), wherein the first guard element includes a groove, and wherein the groove includes metal.

(24) The semiconductor device according to one or more of (17) to (23), further comprising:
at least one dummy structure, wherein the at least one dummy structure is at an outer circumference of the at least one guard structure, and is in the first surface and the second surface.

(25) The semiconductor device according to one or more of (17) to (24), further comprising:
a slit between a scribe line and the at least one guard structure, wherein the slit penetrates through the first surface and the second surface.

(26) The semiconductor device according to one or more of (17) to (25), further comprising:
a slit between a scribe line the at least one guard structure, wherein the slit penetrates through the first surface and the second surface; and
at least one dummy structure located along at least one side of the at least one guard structure, and in the first surface and the second surface.

(27) The semiconductor device according to one or more of (17) to (26), wherein the at least one guard structure is provided along the inside of a scribe line that surrounds at least a part of a circumference of the semiconductor device.

(28) The semiconductor device according to one or more of (17) to (27), further comprising:
a fourth guard element disposed in a first surface of the first substrate at a first distance from a scribe line, the first surface of the first substrate being opposite the bonding surface;
a fifth guard element disposed in the first substrate at the bonding surface and at a second distance from the scribe line; and
a sixth guard element disposed in a first surface of the second substrate at a third distance from the scribe line, the first surface of the second substrate being opposite the bonding surface,
wherein the second distance is between the first distance and the third distance.

(29) The semiconductor device according to one or more of (17) to (28), wherein the at least one guard structure includes at least two guard structures adjacent to each other, wherein the at least two guard structures are around at least a part of a circumference of the semiconductor device, and wherein the portions of the third guard element have a same structure.

(30) The semiconductor device according to one or more of (17) to (29), further comprising:
a fourth guard element and a fifth guard element between the at least one guard structure and a scribe line,
wherein the fourth guard element is in the first surface and the second surface, wherein the fifth guard element is in the second semiconductor substrate, wherein the first guard element, the fourth guard element, and the fifth guard element form a step shape in a cross sectional view, and wherein the fifth guard element is closer to the scribe line than the first guard element.

(31) The semiconductor device according to one or more of (17) to (30), further comprising:
a pixel region on the first semiconductor substrate and including a plurality of pixels; and
an opening disposed in a surface of the first semiconductor substrate that is opposite the first surface and that penetrates the second semiconductor substrate, the opening being between the pixel region and the at least one guard structure; and
a conductive structure disposed in a bottom of the opening.

(32) The semiconductor device according to one or more of (17) to (31), further comprising:
a plurality of dummy structures disposed in the first and second semiconductor substrates and bonded to one another within the pixel region.

(33) A semiconductor device, comprising:
a first substrate including a pixel region having a plurality of pixels;
a second substrate bonded to the first substrate at a bonding interface; and
at least one guard structure disposed in the first and second substrates and outside of the pixel region, the at least one guard structure including:
a first guard element disposed in a first surface of the first substrate that is opposite the bonding interface;

a second guard element disposed in a first surface of the second substrate that is opposite the bonding interface; and
a third guard element including a first bonding portion disposed in the first substrate at the bonding interface and spaced apart from the first guard element by a portion of the first substrate, and a second bonding portion disposed in the second substrate at the bonding interface and spaced apart from the second guard element by a portion of the second substrate,
wherein the first ponding portion and the second bonding portion are bonded to one another, and
wherein the first guard element, the second guard element, and the third guard element overlap one another in a plan view.

(34) The semiconductor device according to (33), wherein the at least one guard structure includes a plurality of guard structures that surround the pixel region in the plan view.

(35) The semiconductor device according to one or more of (33) to (34), further comprising:
an opening disposed in the first surface of the first substrate and that penetrates the bonding interface to a location in second semiconductor substrate, the opening being between the pixel region and the at least one guard structure;
a conductive structure disposed in a bottom of the opening; and
a plurality of dummy structures disposed in the first and second substrates bonded to one another at the bonding interface and that surround the opening.

(36) A semiconductor device, comprising:
a first substrate including a first chip area having a first pixel region;
a second substrate bonded to the first substrate at a bonding interface and including circuitry that processes signals from the first pixel region; and
a plurality of guard structures disposed in the first and second substrates that protect the first chip area from at least one of chipping and cracking when the first chip area is separated from a second chip area, each of the plurality of guard structures including:
a first guard element disposed in a first surface of the first substrate that is opposite the bonding interface;
a second guard element disposed in a first surface of the second substrate that is opposite the bonding interface; and
a third guard element including a first bonding portion disposed in the first substrate at the bonding interface and spaced apart from the first guard element by a portion of the first substrate, and a second bonding portion disposed in the second substrate at the bonding interface and spaced apart from the second guard element by a portion of the second substrate.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 1, 500, 550, 600 Semiconductor device
10 First semiconductor substrate
11 First guard ring
20 Second semiconductor substrate
21 Second guard ring
30 Guard ring unit
31 Third guard ring
41, 41a Power source pad
71 Interlayer insulating film
AT1, AT2, AT3, AT4, AT5 Opening portion
CS Crack stopper region
DT1, DT2, DT3 Groove
DP1, DP2, DP3 Cu dummy
GR Guard ring region
FS First junction surface
SS Second junction surface
SR Sealing region
ST Slit
SL, SL1, SL2 Scribe line

What is claimed is:
1. A semiconductor device, comprising:
a first substrate;
a second substrate; and
at least one guard structure including a first guard element, a second guard element, and a third guard element,
wherein the first substrate and the second substrate are bonded to one another at a bonding interface between a first surface of the first substrate and a second surface of the second substrate,
wherein the first guard element is in the first substrate and spaced apart from the third guard element by a portion of the first substrate,
wherein the second guard element is in the second substrate and spaced apart from the third guard element by a portion of the second substrate,
wherein the third guard element includes portions in the first surface and the second surface to bond the first substrate to the second substrate, and
wherein the at least one guard structure surrounds a power source pad.
2. The semiconductor device according to claim 1, wherein the at least one guard structure is inside a scribe line.
3. The semiconductor device according to claim 1, wherein the power source pad is disposed in an opening that penetrates through the first substrate into the second substrate.
4. The semiconductor device according to claim 1, wherein, in a plan view, a portion of the at least one guard structure is closer to the power source pad than another portion of the at least one guard structure.
5. The semiconductor device according to claim 1, wherein the at least one guard structure includes metal.
6. The semiconductor device according to claim 1, wherein the at least one guard structure covers a wiring layer.
7. The semiconductor device according to claim 1, wherein the first guard element includes a groove, and wherein the groove includes metal.
8. The semiconductor device according to claim 1, further comprising:
at least one dummy structure, wherein the at least one dummy structure is at an outer circumference of the at least one guard structure, and is disposed in in the first surface and the second surface.

9. The semiconductor device according to claim 1, further comprising:
a slit between a scribe line and the at least one guard structure, wherein the slit penetrates through the first surface and the second surface.

10. The semiconductor device according to claim 9, further comprising:
at least one dummy structure located along at least one side of the at least one guard structure, and disposed in the first surface and the second surface.

11. The semiconductor device according to claim 9, wherein the at least one guard structure is provided along an inside of the scribe line.

12. The semiconductor device according to claim 1, further comprising:
a fourth guard element disposed in a surface of the first substrate at a first distance from a scribe line, the surface of the first substrate being opposite the bonding interface;
a fifth guard element disposed in the first substrate at the bonding interface and at a second distance from the scribe line; and
a sixth guard element disposed in a surface of the second substrate at a third distance from the scribe line, the surface of the second substrate being opposite the bonding interface,
wherein the second distance is between the first distance and the third distance.

13. The semiconductor device according to claim 1, wherein the at least one guard structure includes at least two guard structures adjacent to each other, and
wherein the portions of the third guard element have a same structure.

14. The semiconductor device according to claim 1, further comprising:
a fourth guard element and a fifth guard element between the at least one guard structure and a scribe line,
wherein the fourth guard element is in the first surface and the second surface,
wherein the fifth guard element is in the second substrate,
wherein the first guard element, the fourth guard element, and the fifth guard element form a step shape in a cross sectional view, and
wherein the fifth guard element is closer to the scribe line than the first guard element.

15. The semiconductor device according to claim 1, further comprising:
a pixel region on the first substrate and including a plurality of pixels; and
an opening disposed in the first substrate and that penetrates the second substrate, the opening being between the pixel region and the at least one guard structure, wherein the power source pad is disposed in a bottom of the opening.

16. The semiconductor device according to claim 15, further comprising:
a plurality of dummy structures disposed in the first and second substrates and bonded to one another within the pixel region.

17. A semiconductor device, comprising:
a first substrate including a pixel region having a plurality of pixels;
a second substrate bonded to the first substrate at a bonding interface;
at least one guard structure disposed in the first and second substrates and outside of the pixel region, the at least one guard structure including:
a first guard element disposed in a first surface of the first substrate that is opposite the bonding interface;
a second guard element disposed in a first surface of the second substrate that is opposite the bonding interface; and
a third guard element including a first bonding portion disposed in the first substrate at the bonding interface and spaced apart from the first guard element by a portion of the first substrate, and a second bonding portion disposed in the second substrate at the bonding interface and spaced apart from the second guard element by a portion of the second substrate; and
an opening disposed in the first surface of the first substrate and that penetrates the bonding interface to a location in second substrate,
wherein the first bonding portion and the second bonding portion are bonded to one another, and
wherein the first guard element, the second guard element, and the third guard element overlap one another in a plan view.

18. The semiconductor device according to claim 17, wherein the at least one guard structure includes a plurality of guard structures that surround the pixel region in the plan view.

19. The semiconductor device according to claim 17, further comprising:
a conductive structure disposed in a bottom of the opening, wherein the opening is between the pixel region and the at least one guard structure; and
a plurality of dummy structures disposed in the first and second substrates bonded to one another at the bonding interface and that surround the opening.

20. A semiconductor device, comprising:
a first substrate including a first chip area having a first pixel region;
a second substrate bonded to the first substrate at a bonding interface and including circuitry that processes signals from the first pixel region; and
a plurality of guard structures disposed in the first and second substrates that protect the first chip area from at least one of chipping and cracking when the first chip area is separated from a second chip area, at least one of the plurality of guard structures including:
a first guard element disposed in a first surface of the first substrate that is opposite the bonding interface;
a second guard element disposed in a first surface of the second substrate that is opposite the bonding interface; and
a third guard element including a first bonding portion disposed in the first substrate at the bonding interface and spaced apart from the first guard element by a portion of the first substrate, and a second bonding portion disposed in the second substrate at the bonding interface and spaced apart from the second guard element by a portion of the second substrate, wherein the first guard element, the second guard element, and the third guard element form a step shape in a cross sectional view.

* * * * *